United States Patent
Or-Bach et al.

(10) Patent No.: US 11,107,803 B2
(45) Date of Patent: *Aug. 31, 2021

(54) METHOD TO CONSTRUCT 3D DEVICES AND SYSTEMS

(71) Applicant: Monolithic 3D Inc., Klamath Falls, OR (US)

(72) Inventors: Zvi Or-Bach, Haifa (IL); Jin-Woo Han, San Jose, CA (US); Brian Cronquist, Klamath Falls, OR (US)

(73) Assignee: Monolithic 3D Inc., Klamath Falls, OR (US)

(*) Notice: Subject to any disclaimer, the term of this patent is extended or adjusted under 35 U.S.C. 154(b) by 0 days.

This patent is subject to a terminal disclaimer.

(21) Appl. No.: 17/214,883

(22) Filed: Mar. 28, 2021

(65) Prior Publication Data

US 2021/0233901 A1 Jul. 29, 2021

Related U.S. Application Data

(63) Continuation-in-part of application No. 16/337,665, filed as application No. PCT/US2017/052359 on Sep. 19, 2017, now Pat. No. 10,991,675.
(Continued)

(51) Int. Cl.
*H01L 21/30* (2006.01)
*H01L 25/18* (2006.01)
(Continued)

(52) U.S. Cl.
CPC ............. *H01L 25/18* (2013.01); *H01L 21/78* (2013.01); *H01L 22/12* (2013.01); *H01L 24/08* (2013.01); *H01L 24/80* (2013.01); *H01L 25/0657* (2013.01); *H01L 25/50* (2013.01); *H01L 2224/08145* (2013.01); *H01L 2224/80895* (2013.01); *H01L 2224/80896* (2013.01); *H01L 2225/06589* (2013.01); *H01L 2225/06596* (2013.01); *H01L 2924/1431* (2013.01); *H01L 2924/1436* (2013.01);
(Continued)

(58) Field of Classification Search
CPC ......... H01L 21/78; H01L 22/12; H01L 24/08; H01L 24/80; H01L 25/0657; H01L 25/18; H01L 25/50
USPC ................................ 257/777; 438/455, 459
See application file for complete search history.

(56) References Cited

U.S. PATENT DOCUMENTS

| | | | | |
|---|---|---|---|---|
| 7,983,065 B2 * | 7/2011 | Samachisa | ......... | G11C 13/0007 365/51 |
| 8,058,137 B1 * | 11/2011 | Or-Bach | ............ | H03K 19/0948 438/401 |
| 2016/0218046 A1 * | 7/2016 | Or-Bach | ............ | H03K 19/1774 |

* cited by examiner

*Primary Examiner* — Luan C Thai
(74) *Attorney, Agent, or Firm* — PowerPatent www.powerpatent.com; Bao Tran

(57) ABSTRACT

A method to construct a 3D system, the method including: providing a base wafer; and then transferring a memory control on top; and then thinning the memory control, transferring a first memory wafer on top; and then thinning the first memory wafer; and then transferring a second memory wafer on top; and then thinning the second memory wafer. A 3D device, the device including: a first stratum including first bit-cell memory arrays; a second stratum including second bit-cell memory arrays; and a third stratum, where the second stratum overlays the first stratum, where the first stratum overlays the third stratum, where the third stratum includes a plurality of word-line decoders to control the first bit-cell memory arrays and the second bit-cell memory arrays.

17 Claims, 44 Drawing Sheets

Related U.S. Application Data

(60) Provisional application No. 62/406,376, filed on Oct. 10, 2016.

(51) Int. Cl.
  *H01L 21/66* (2006.01)
  *H01L 23/00* (2006.01)
  *H01L 25/065* (2006.01)
  *H01L 25/00* (2006.01)
  *H01L 21/78* (2006.01)

(52) U.S. Cl.
  CPC ............... *H01L 2924/1437* (2013.01); *H01L 2924/1441* (2013.01); *H01L 2924/1443* (2013.01)

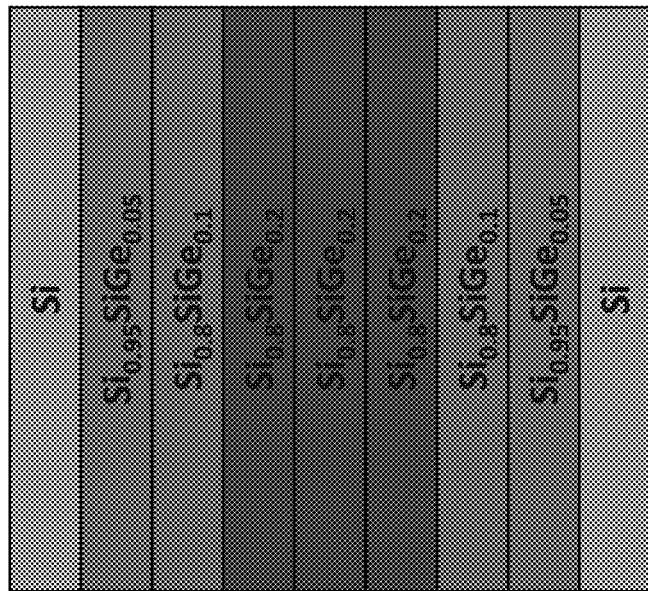
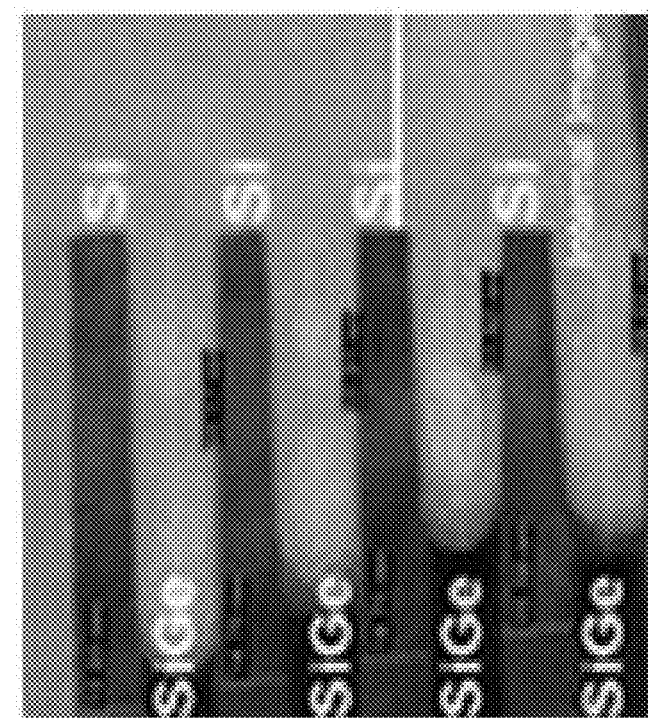

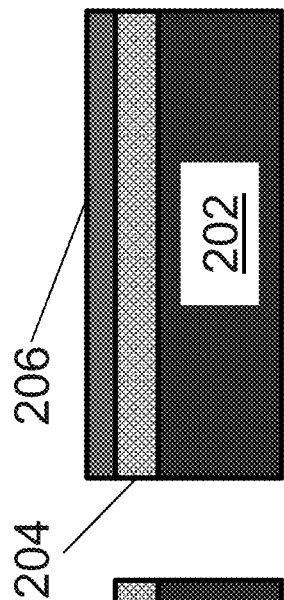
Fig. 2A
Fig. 2B
Fig. 2C
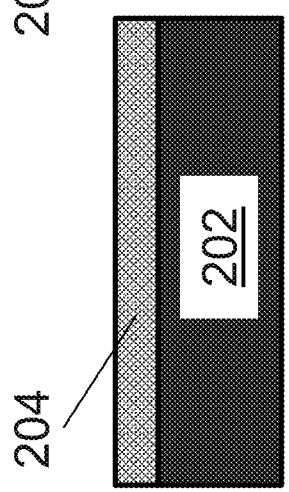
Fig. 2D
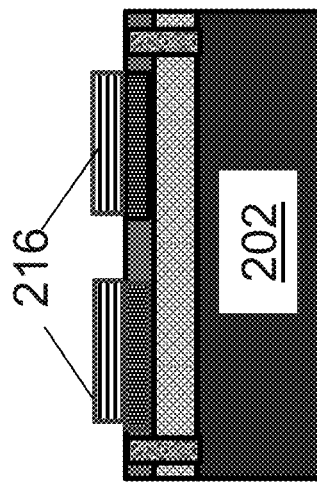
Fig. 2E
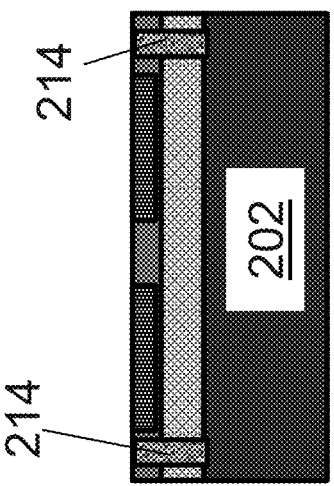
Fig. 2F
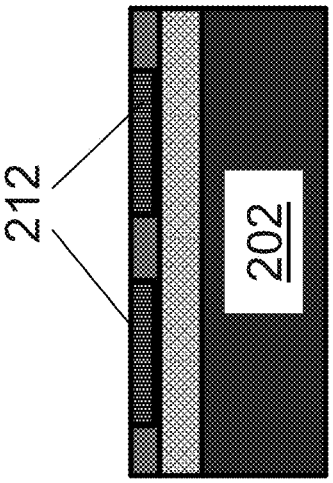

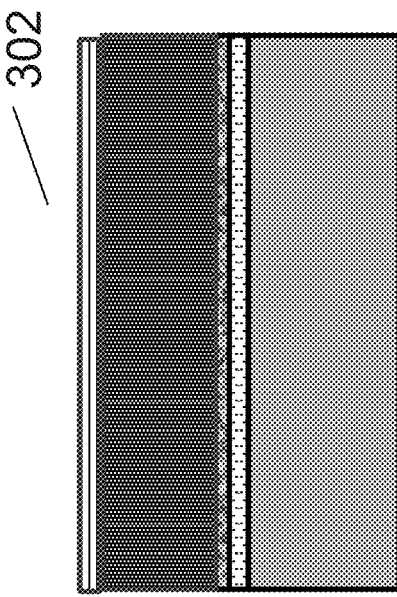
Fig. 3A
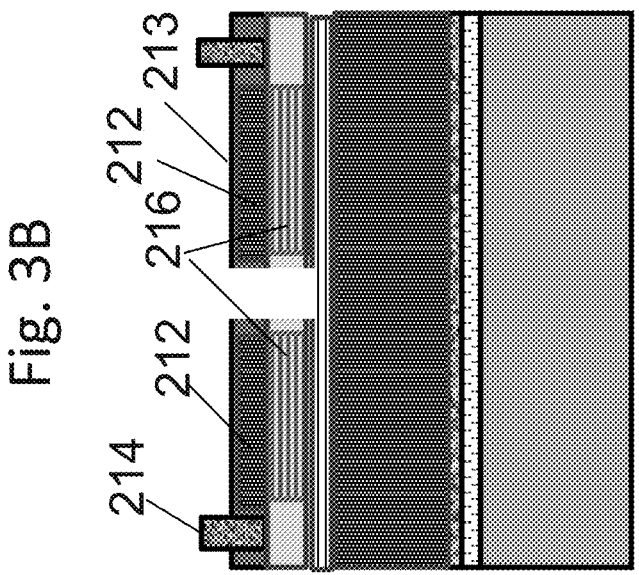
Fig. 3B
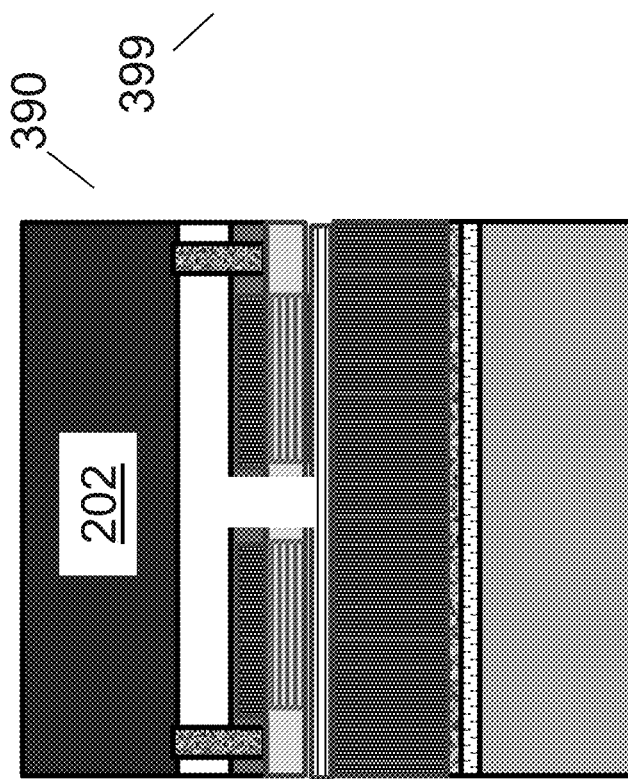
Fig. 3C
Fig. 3D

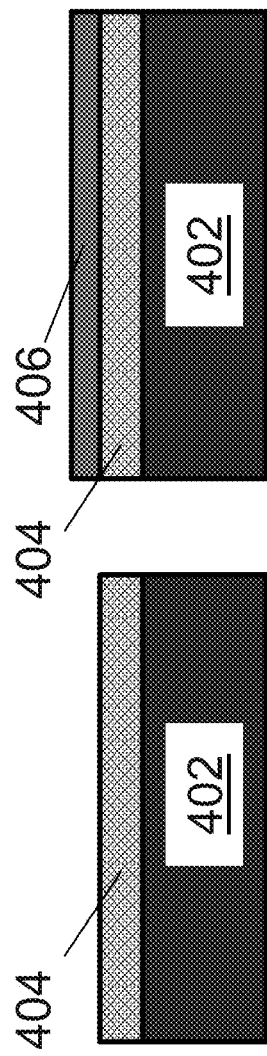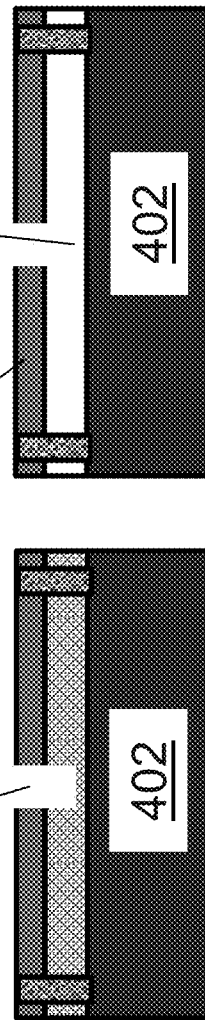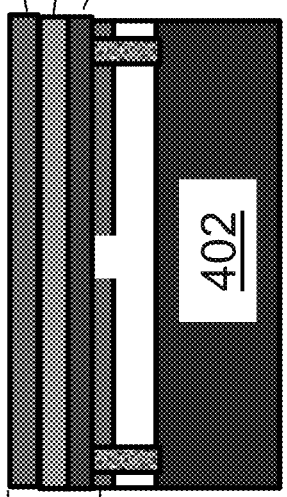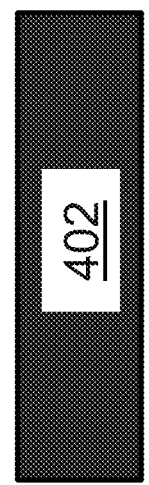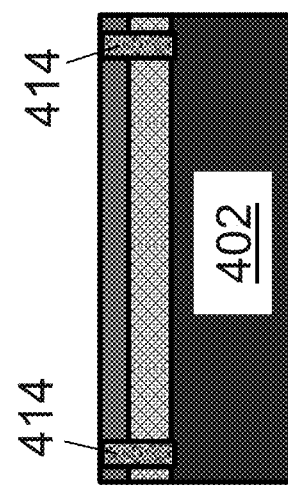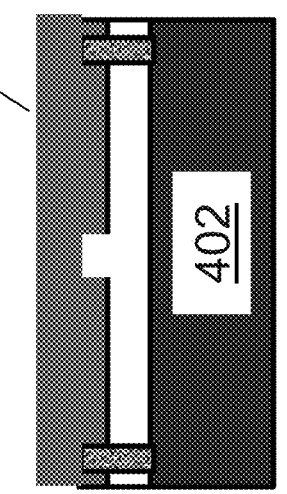

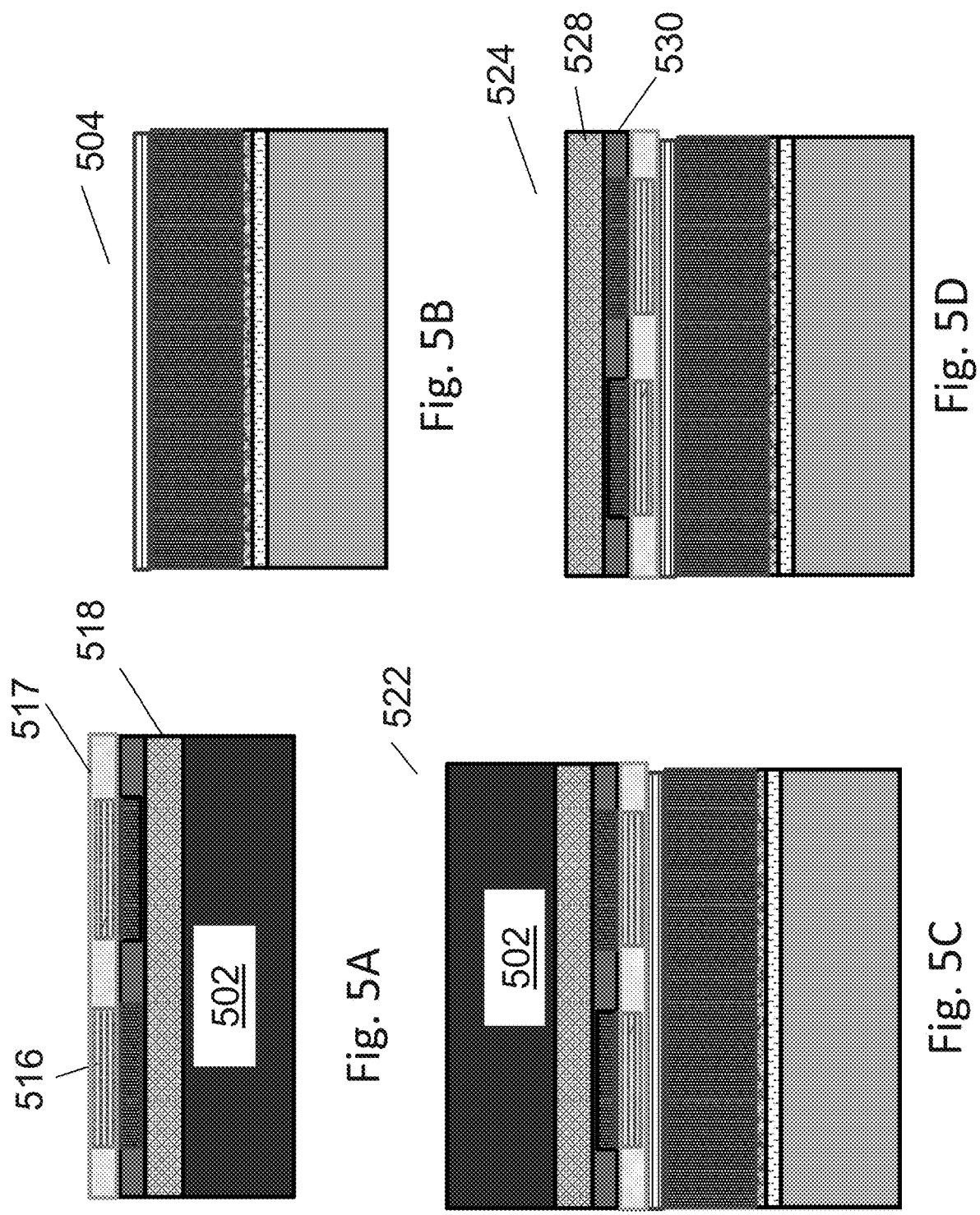

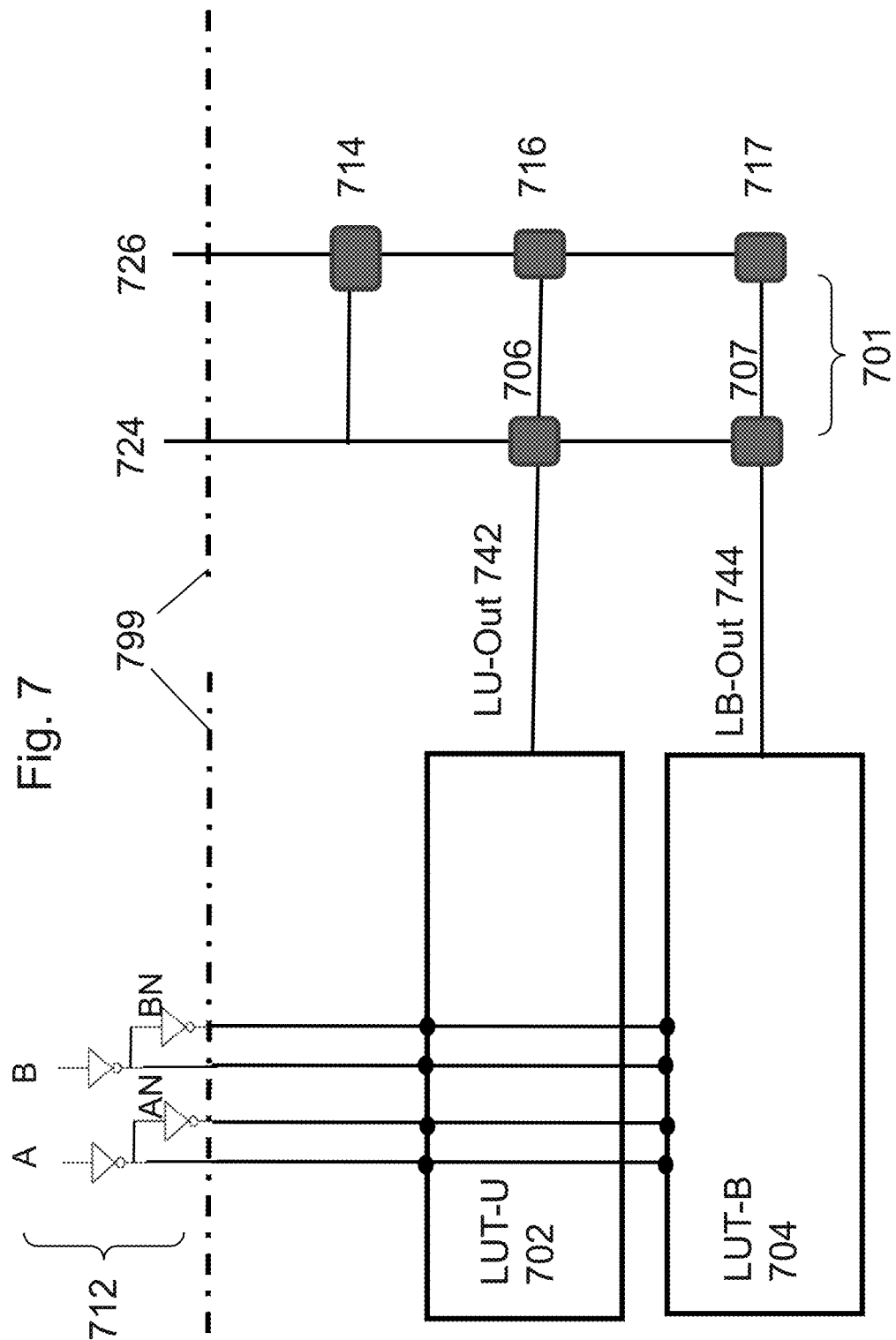

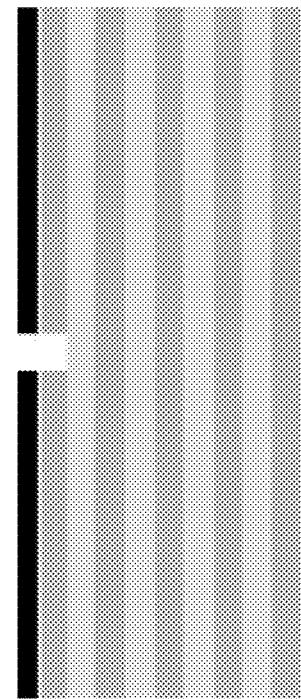
Fig. 10A
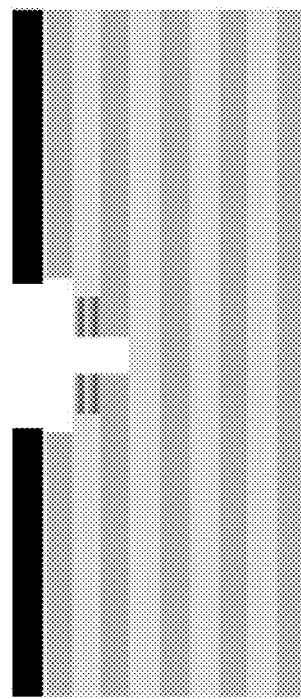
Fig. 10B
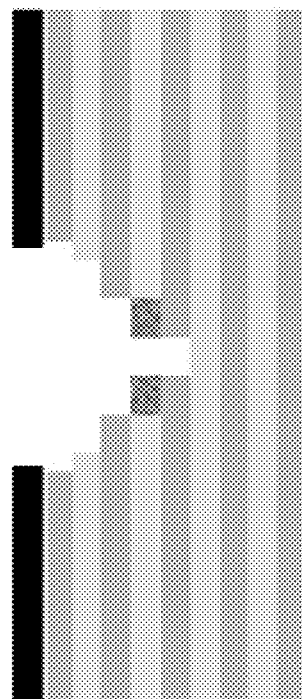
Fig. 10D
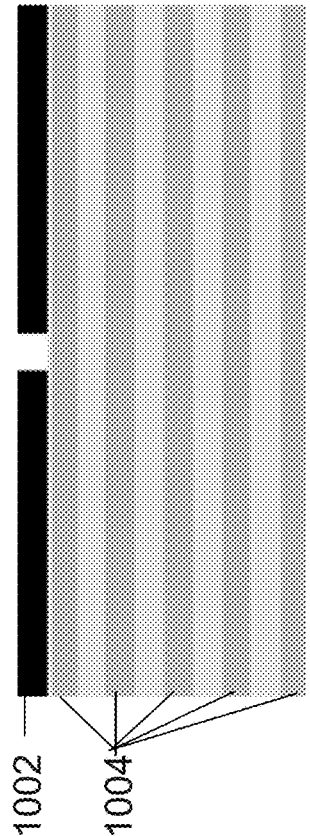
Fig. 10C
Fig. 10E
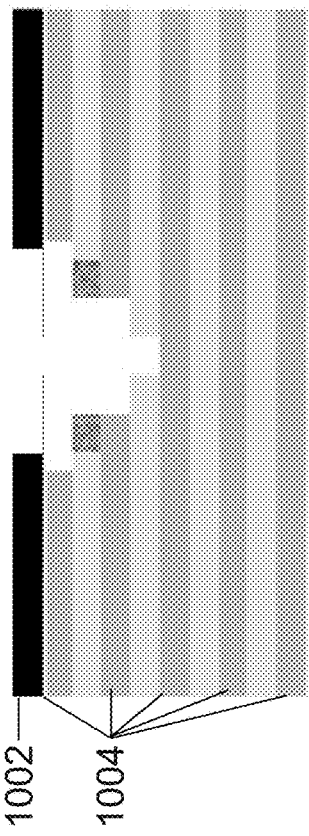
Fig. 10F

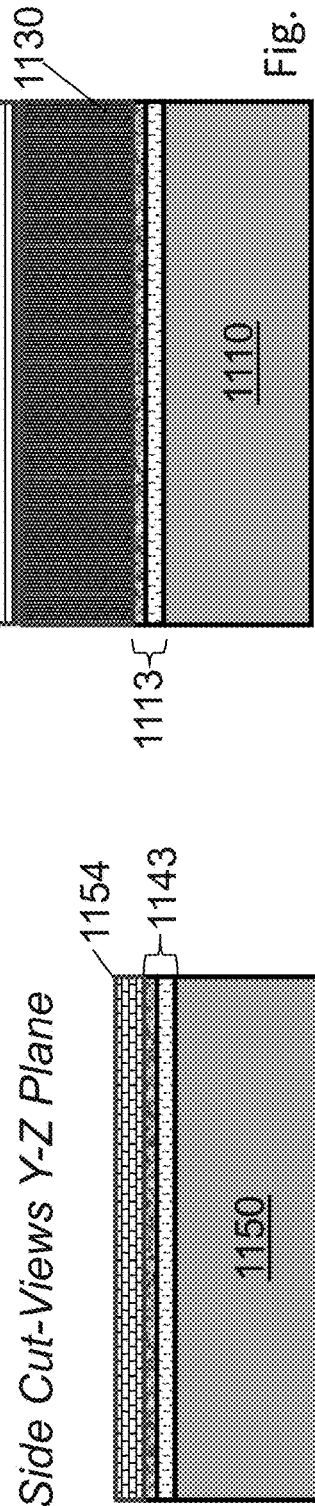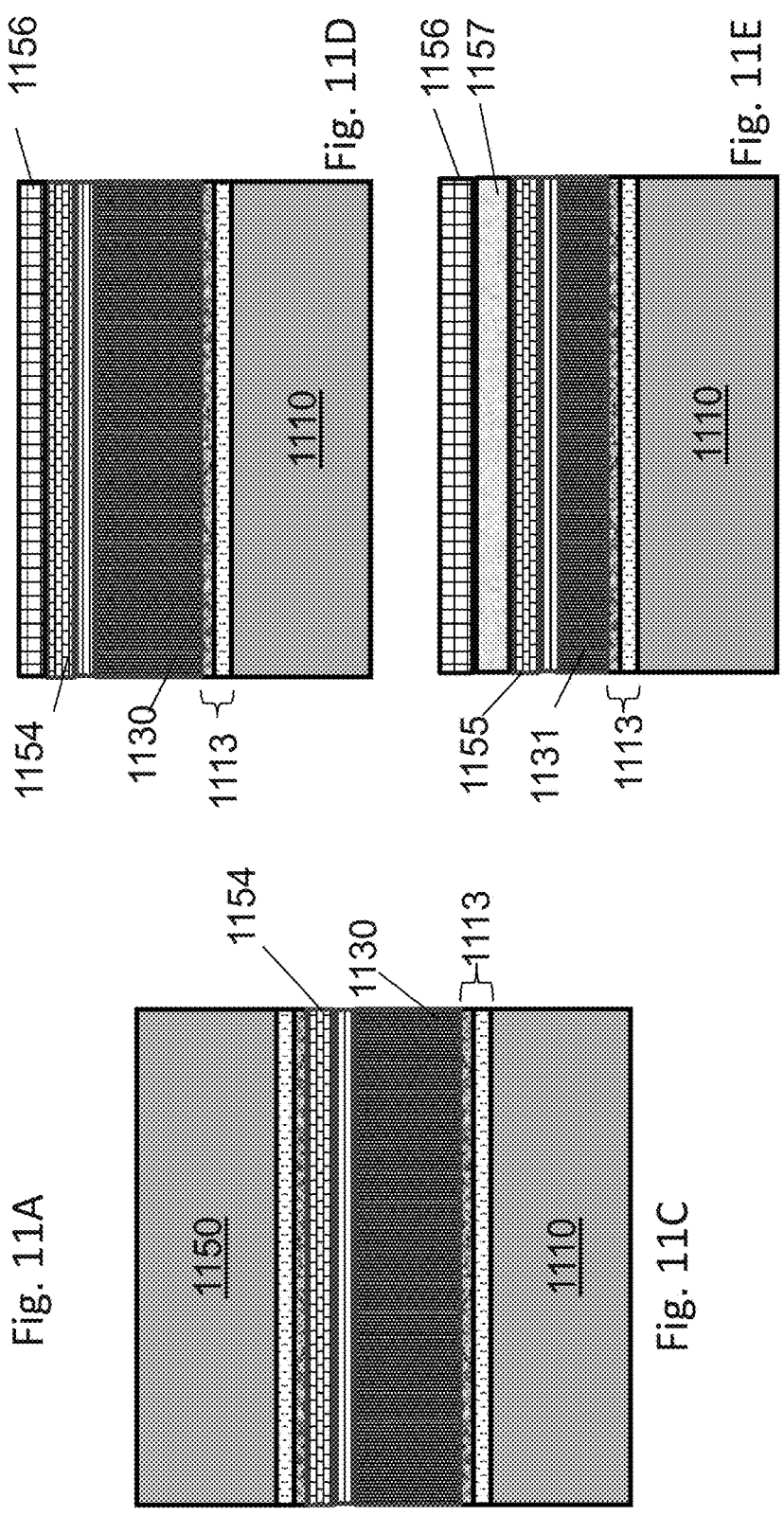
*Side Cut-Views Y-Z Plane*
Fig. 11A
Fig. 11B
Fig. 11C
Fig. 11D
Fig. 11E

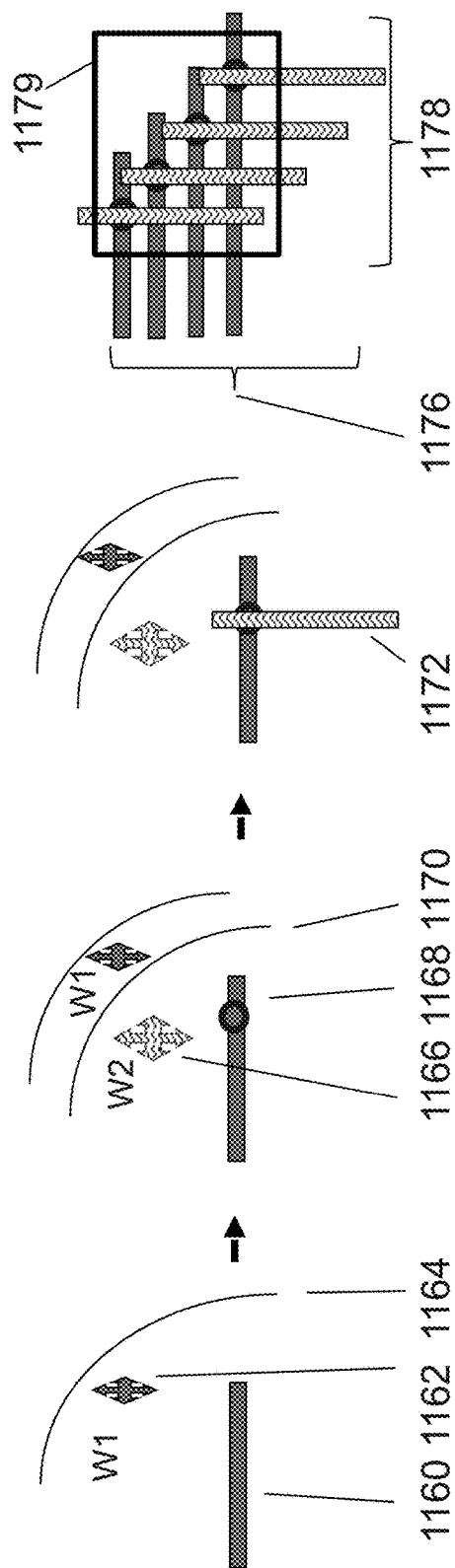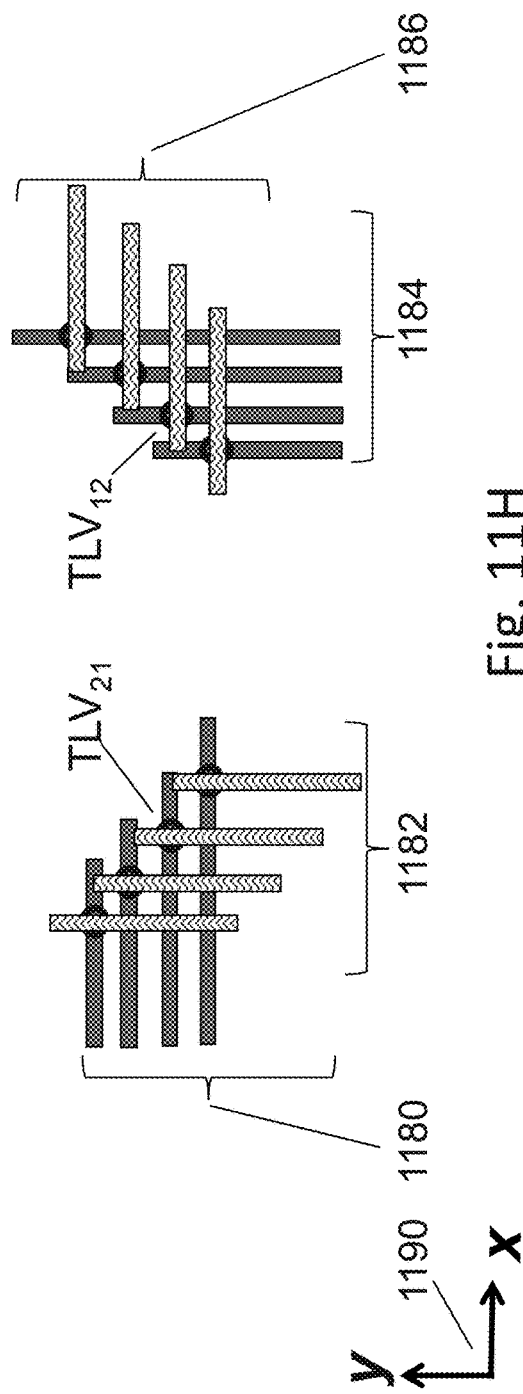

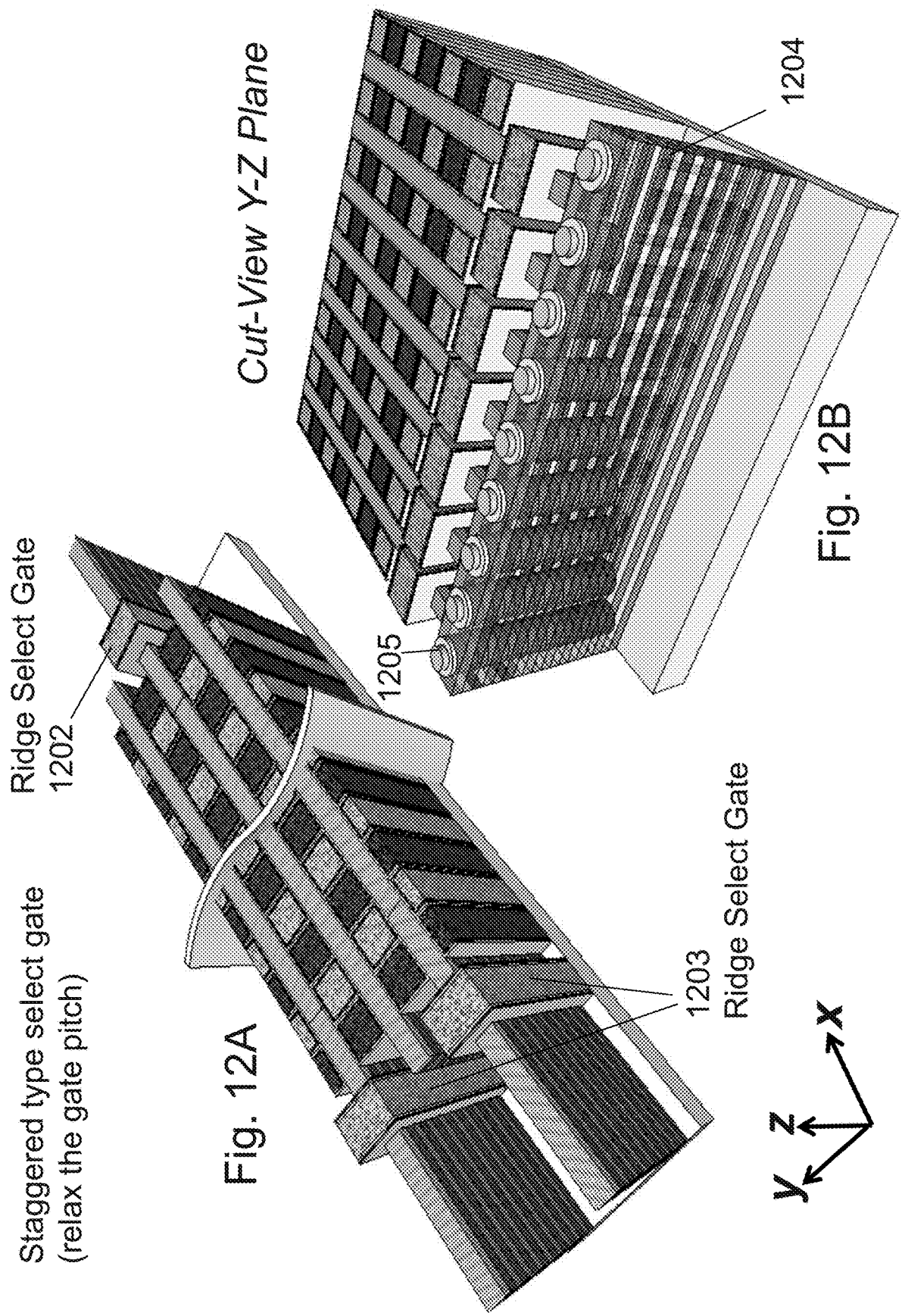

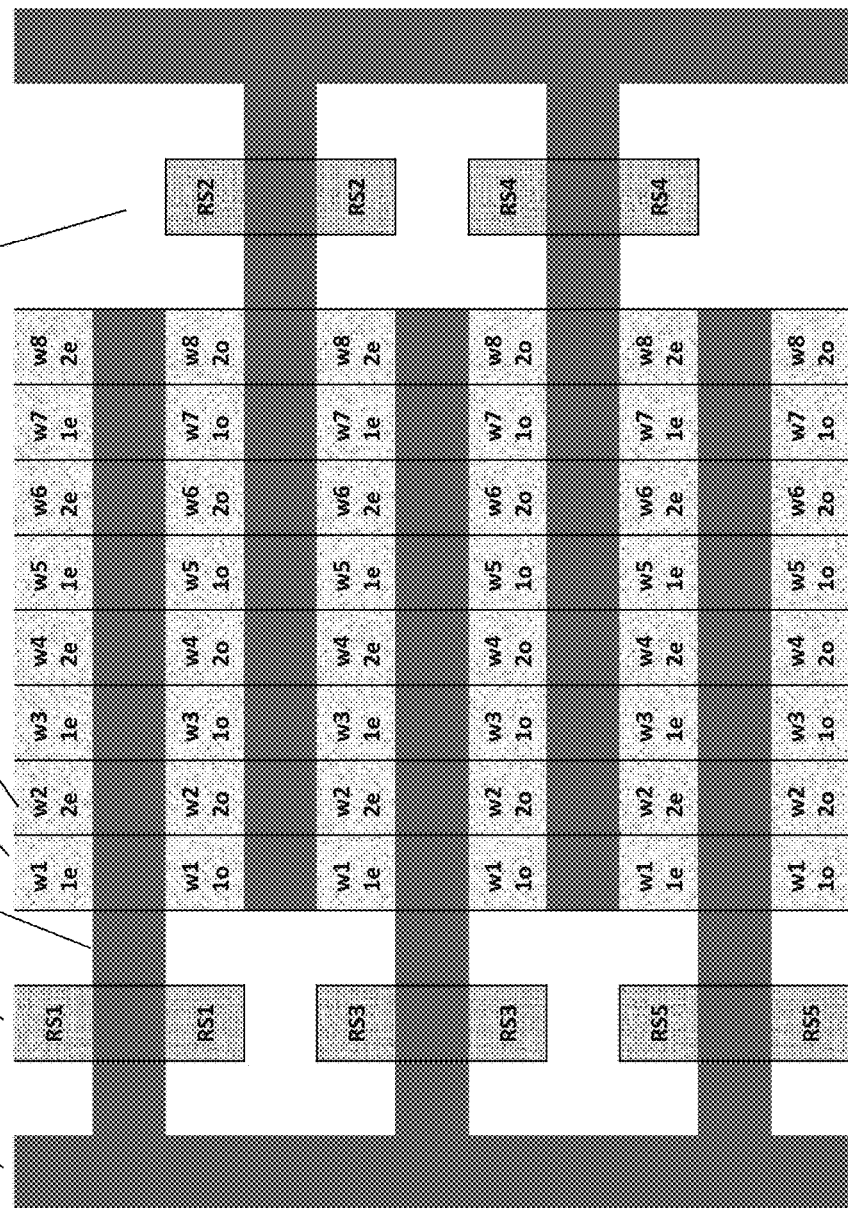

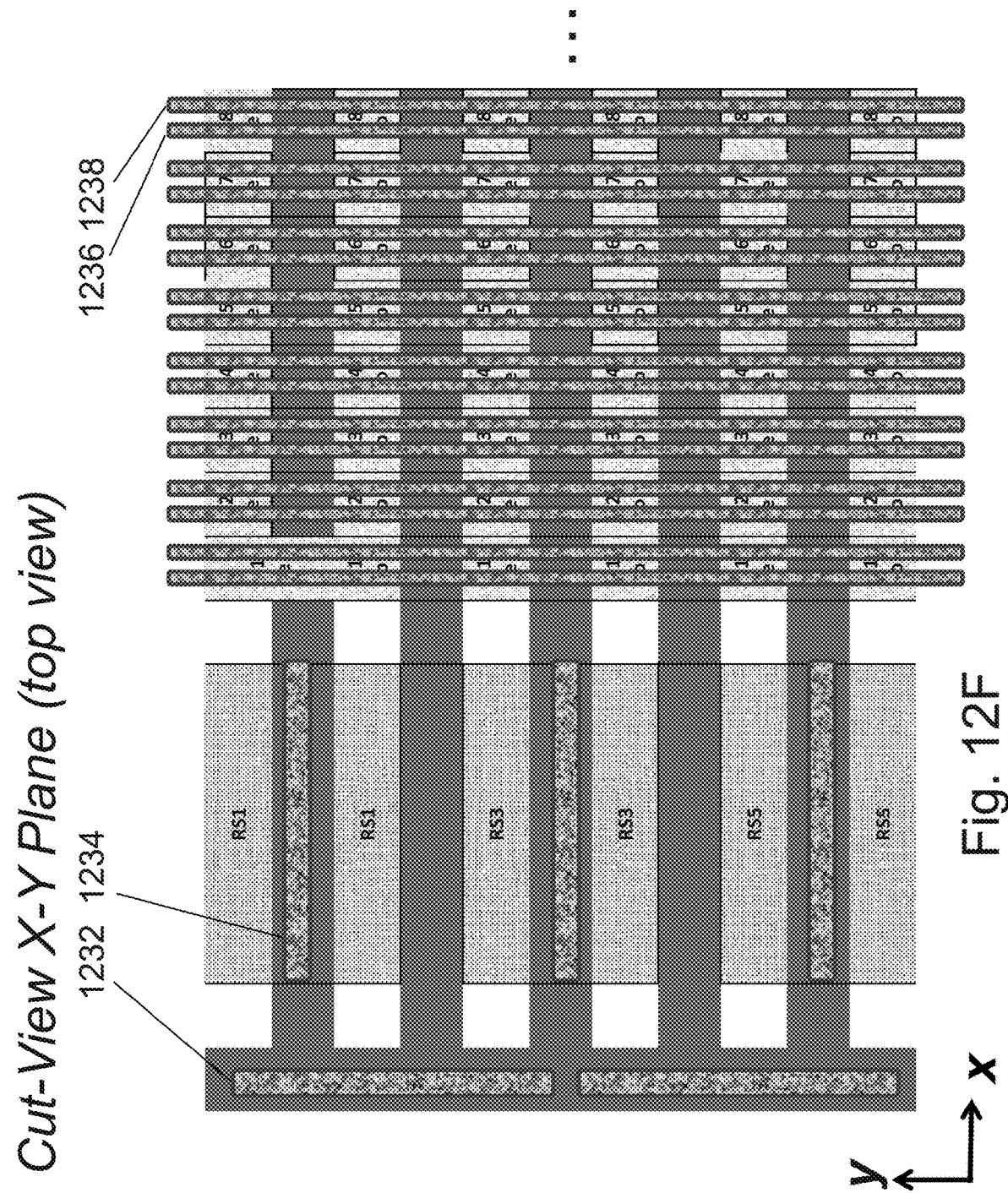

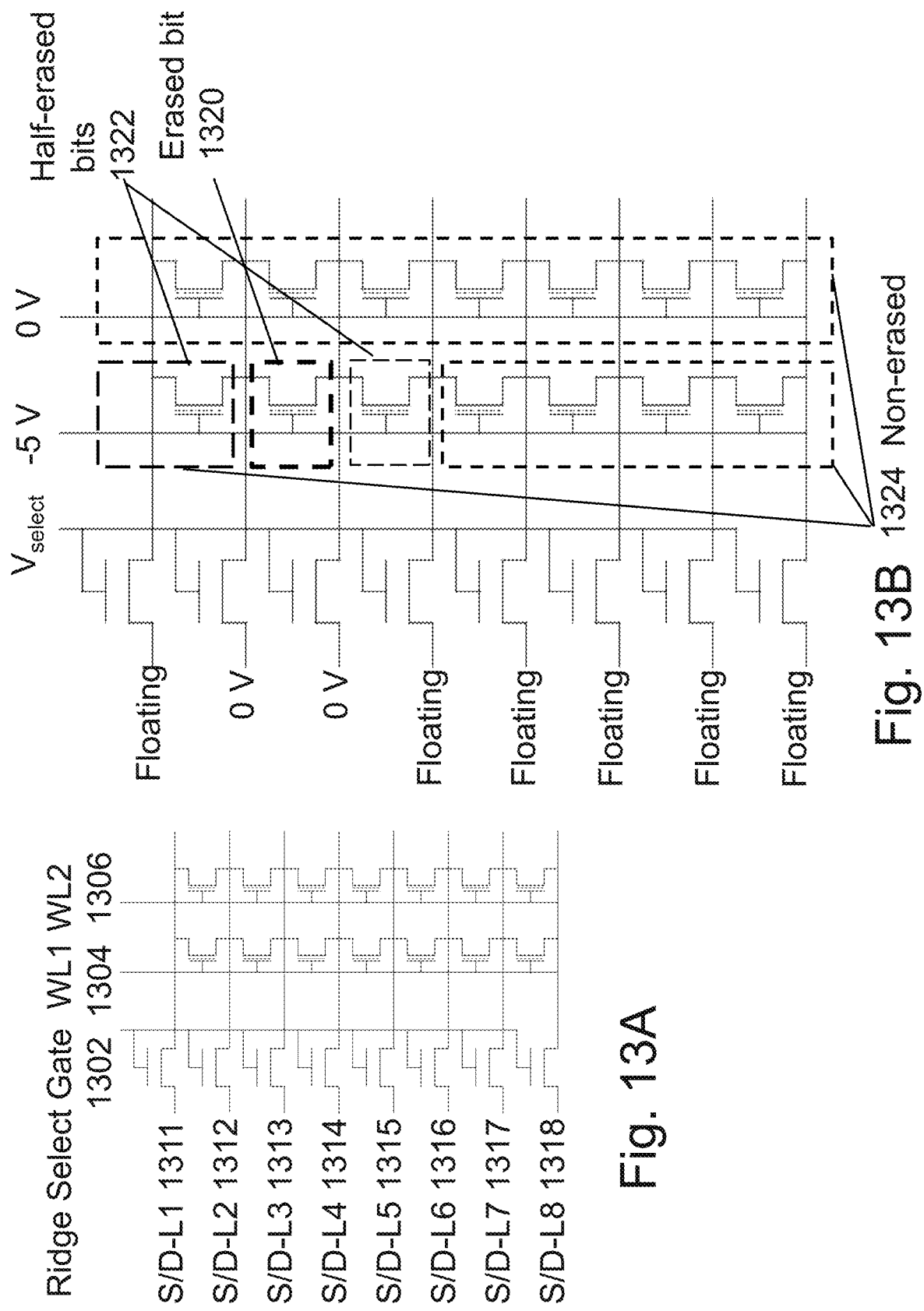

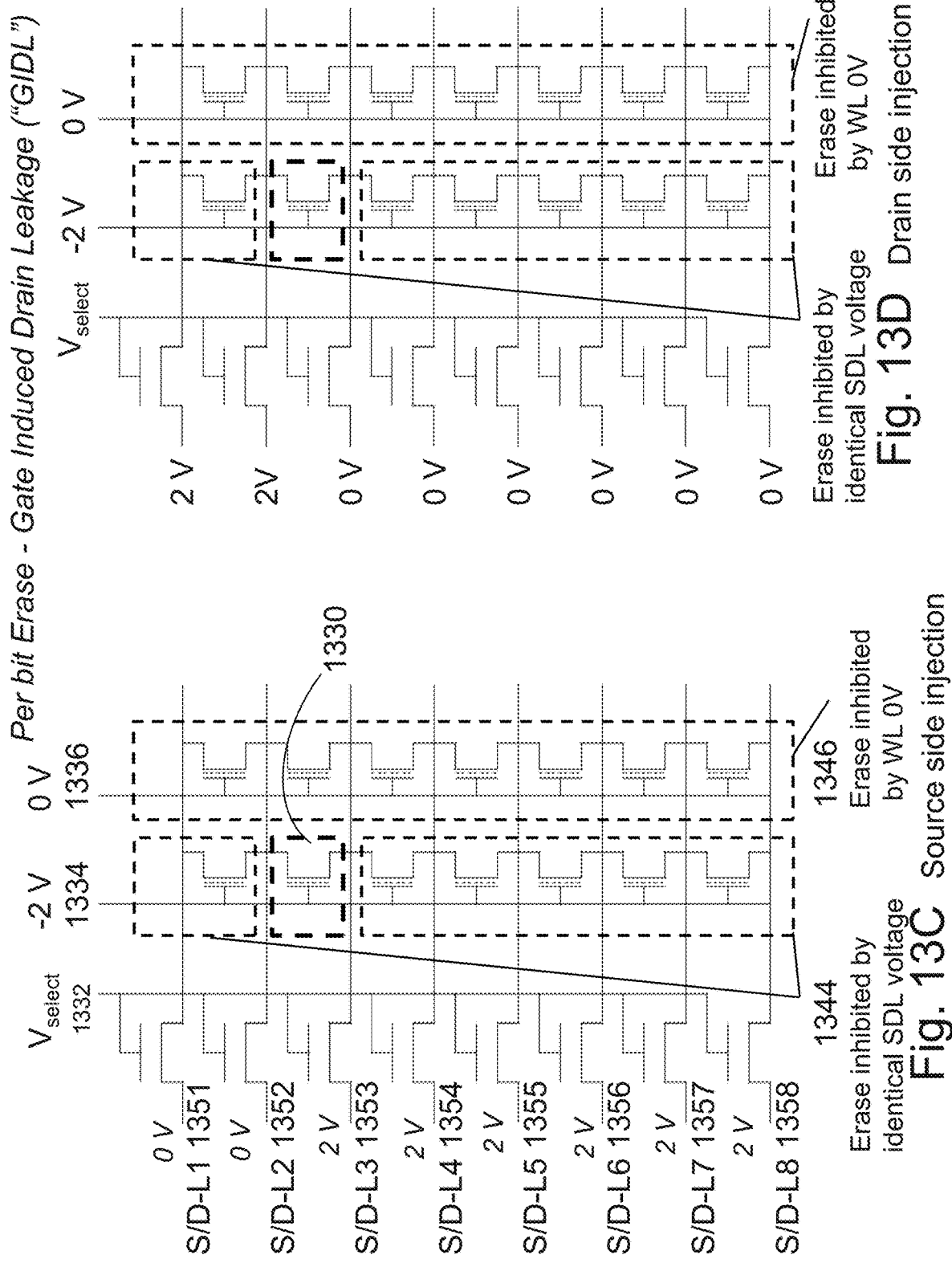

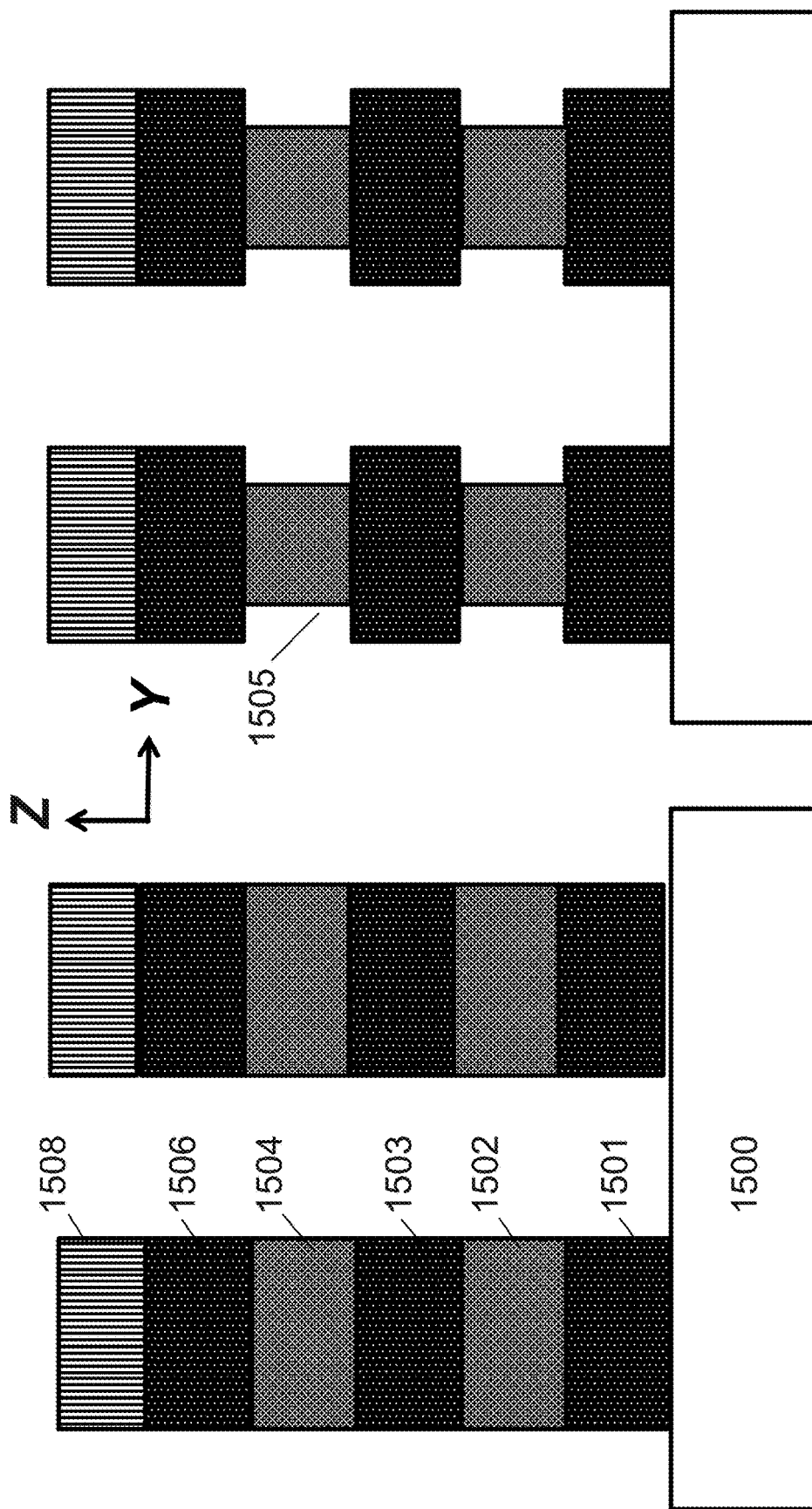

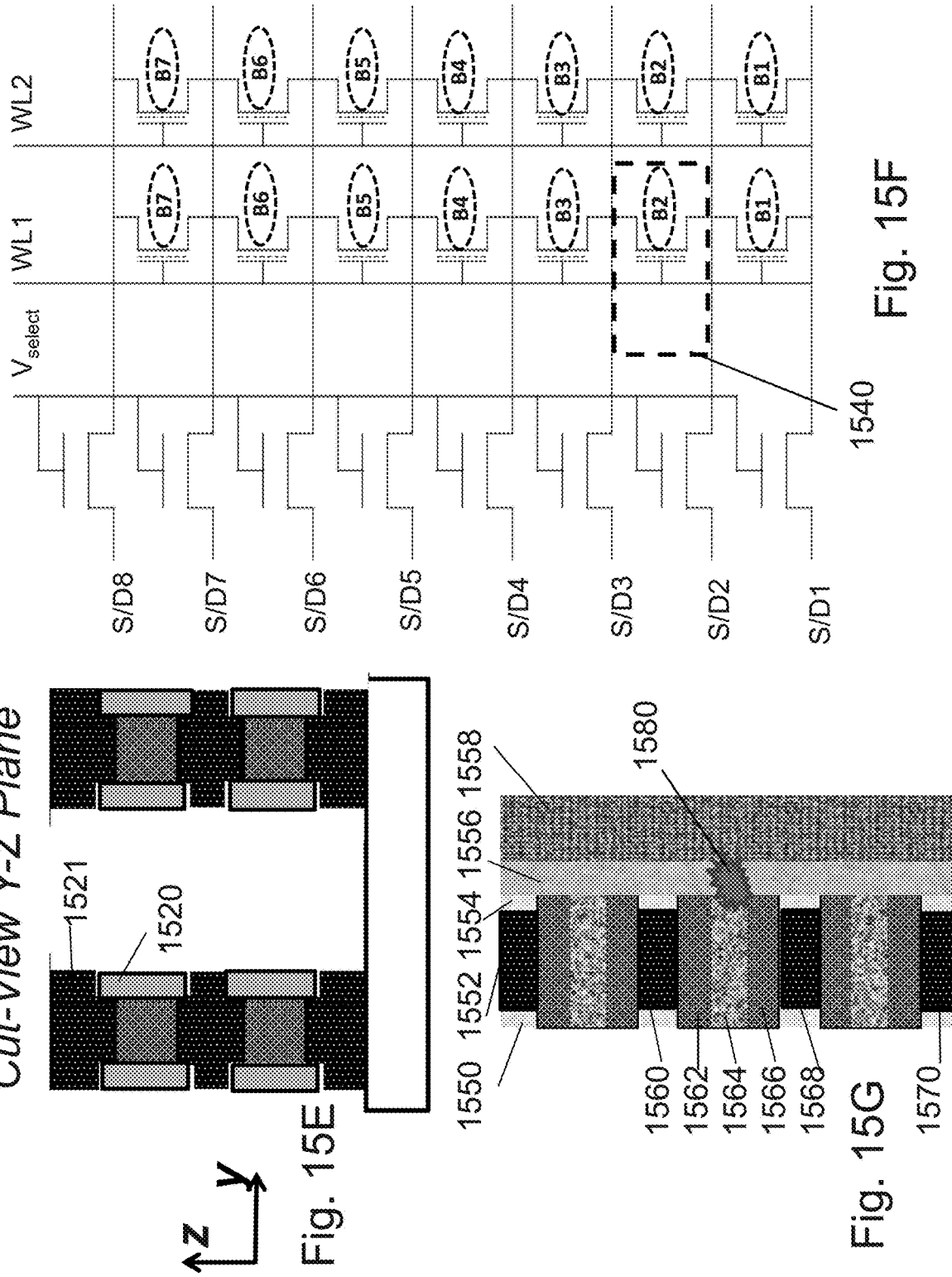

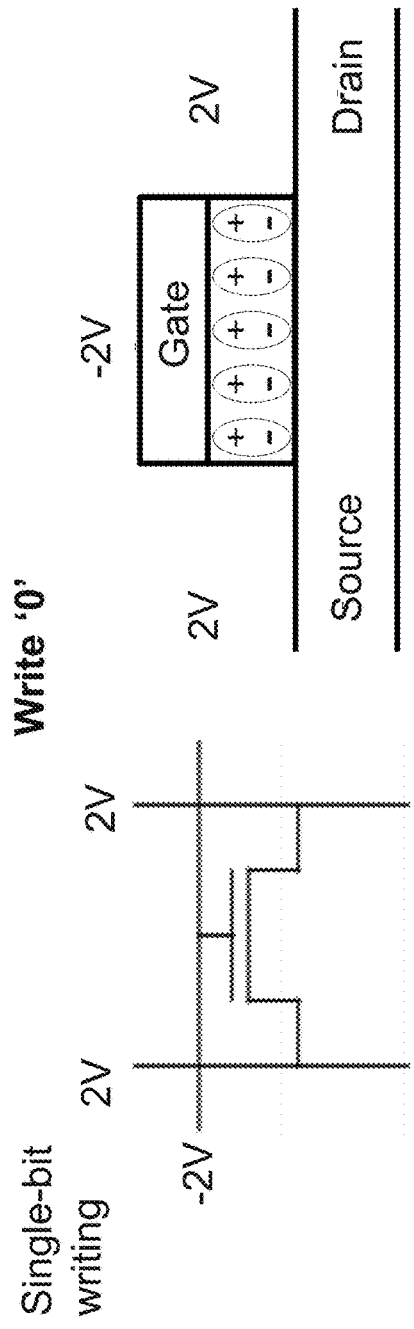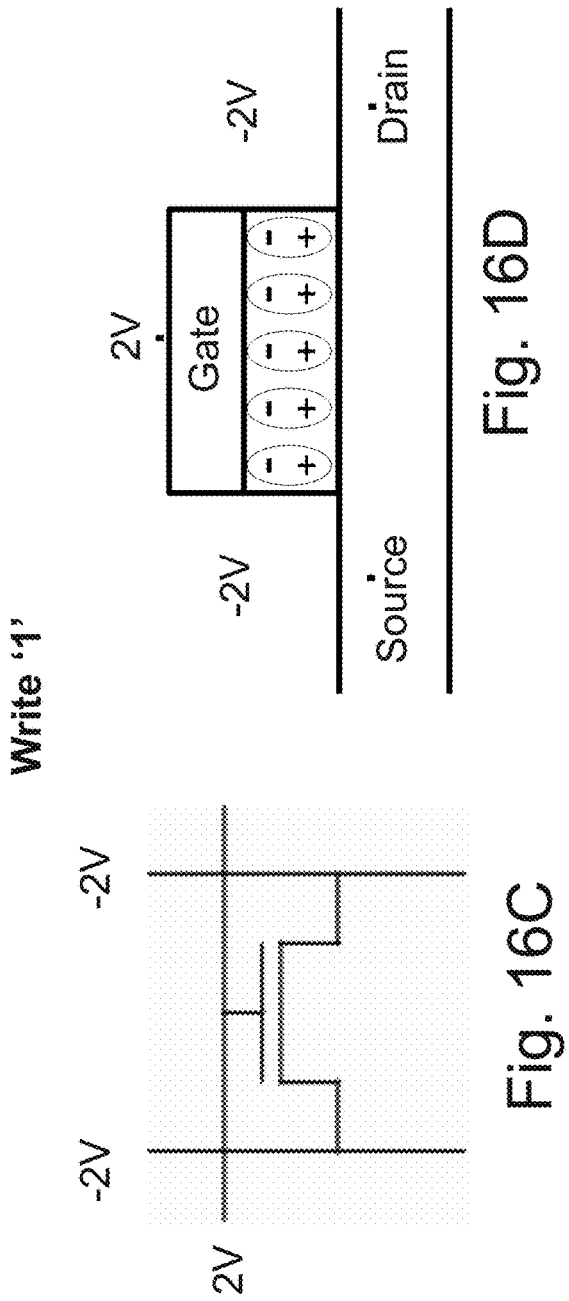

Figures 17A, 17B, 17C, 17D:
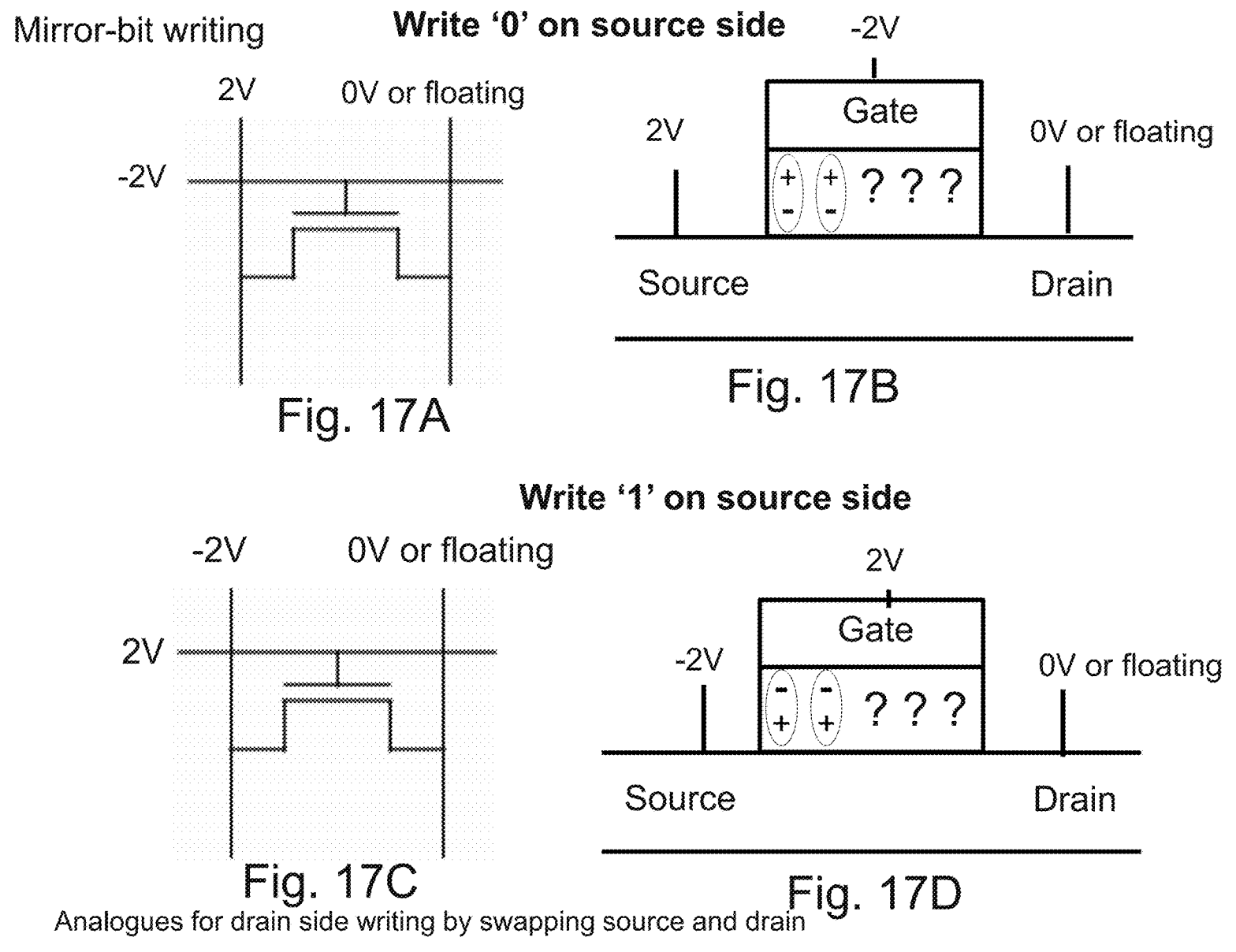

Mirror-bit writing

Write '0' on source side

Write '1' on source side

Analogues for drain side writing by swapping source and drain

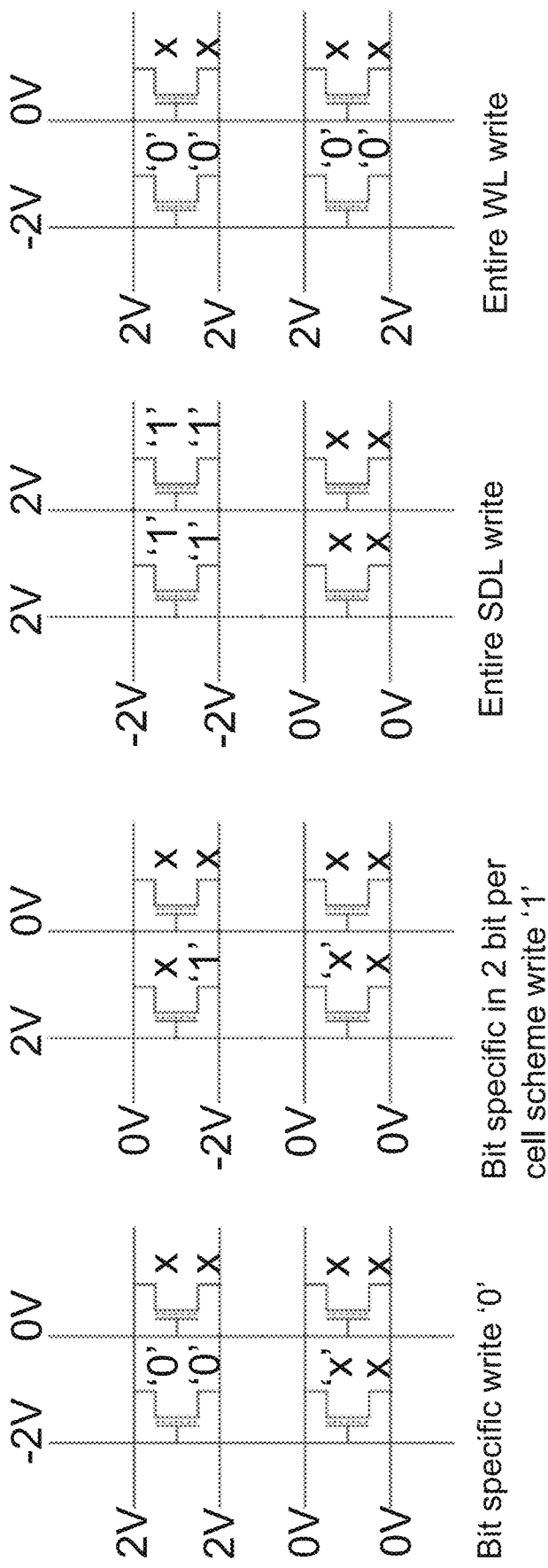

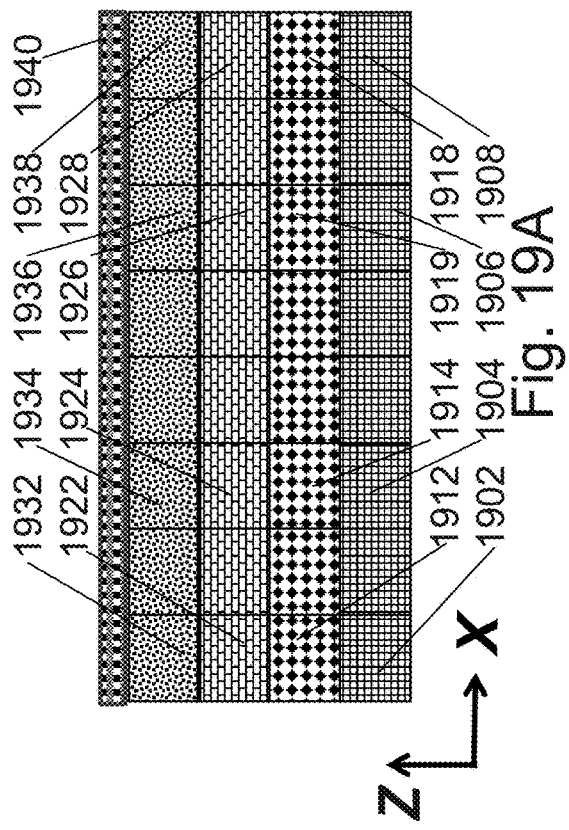
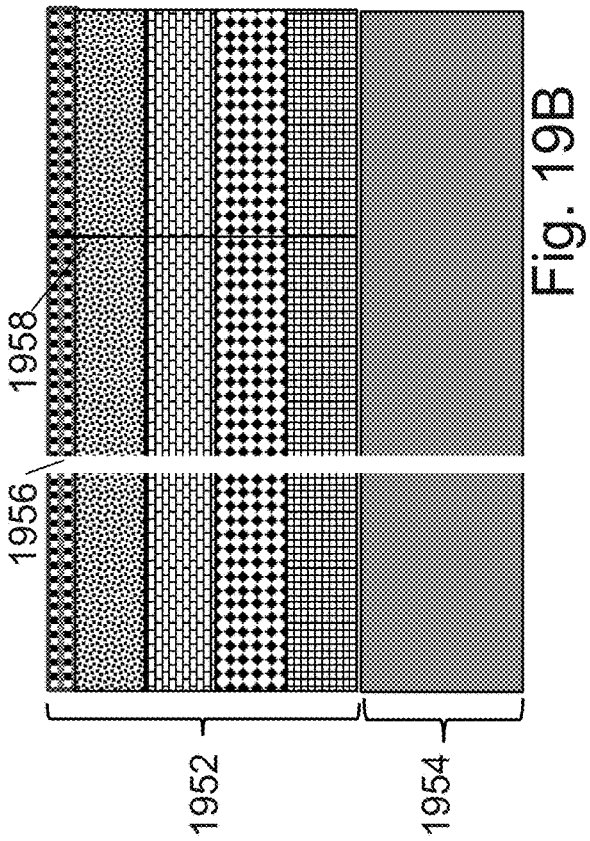
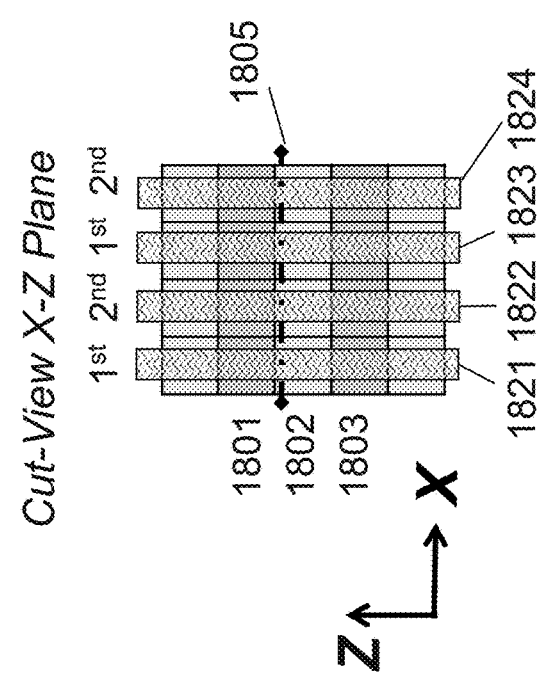
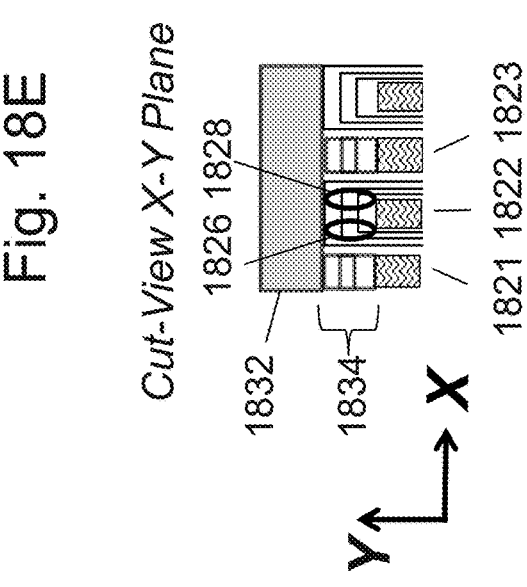

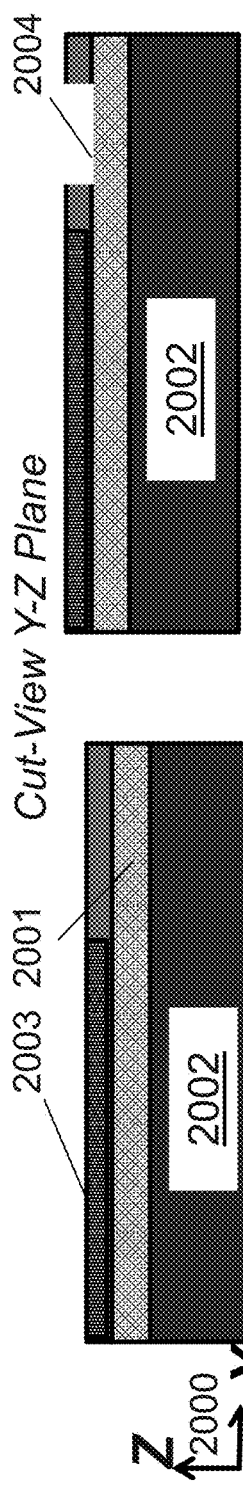
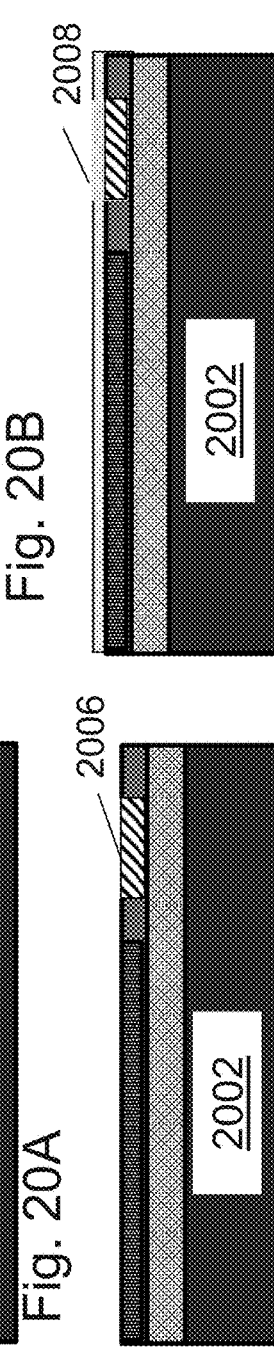
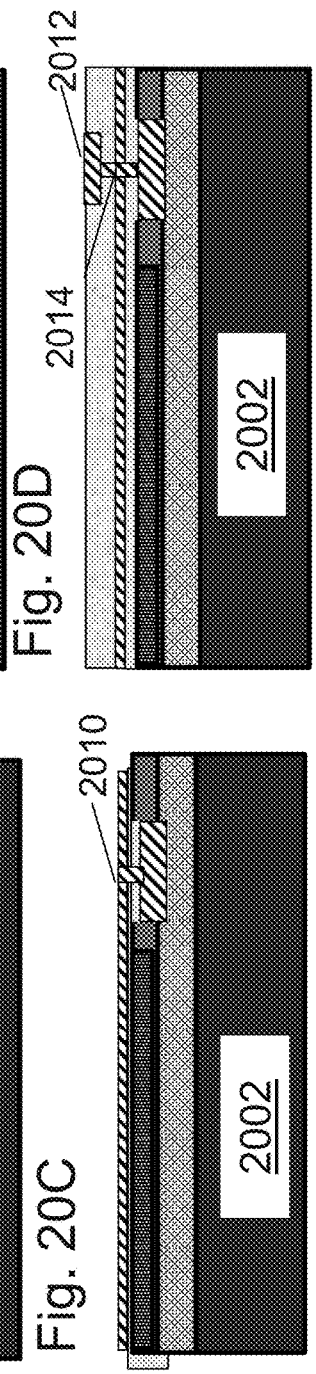
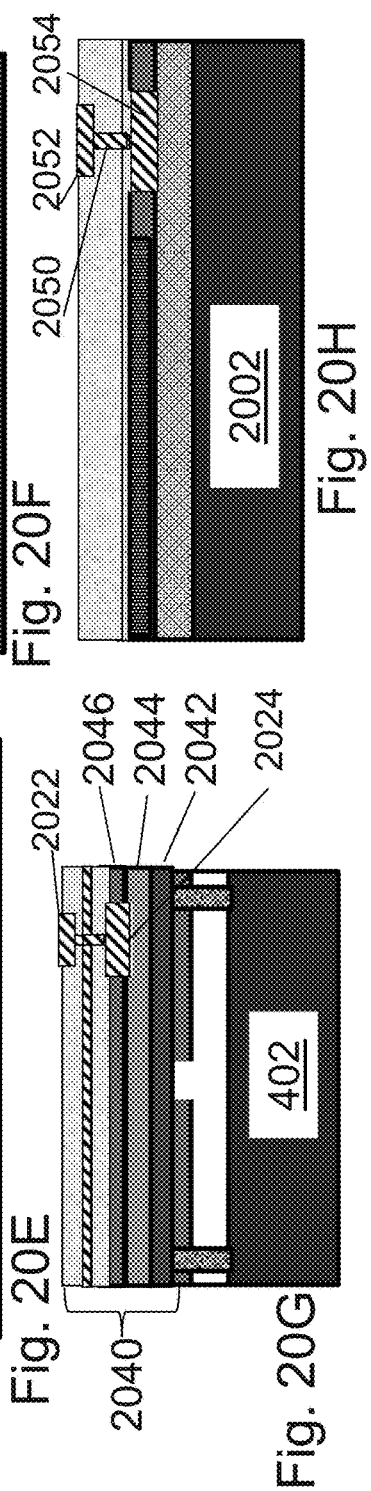
Fig. 20A  Fig. 20B  Fig. 20C  Fig. 20D  Fig. 20E  Fig. 20F  Fig. 20G  Fig. 20H

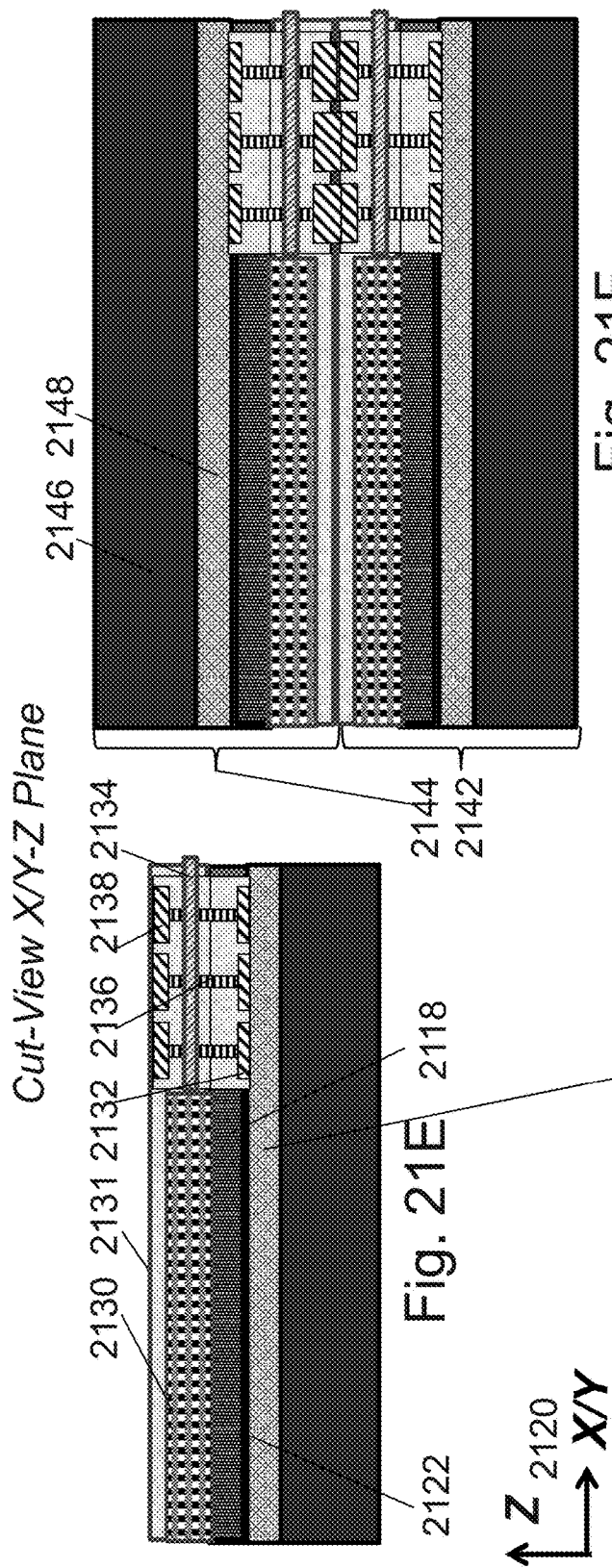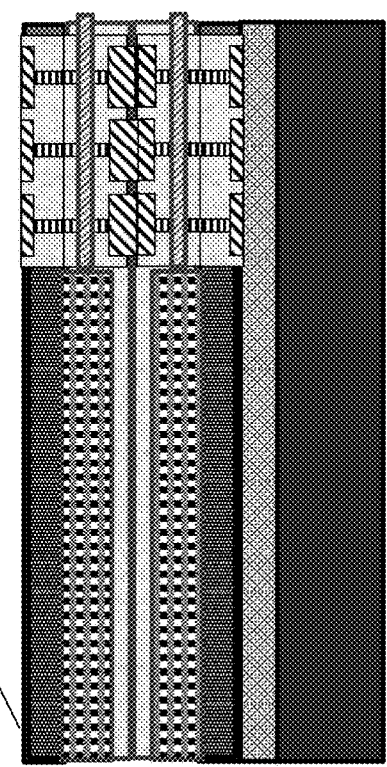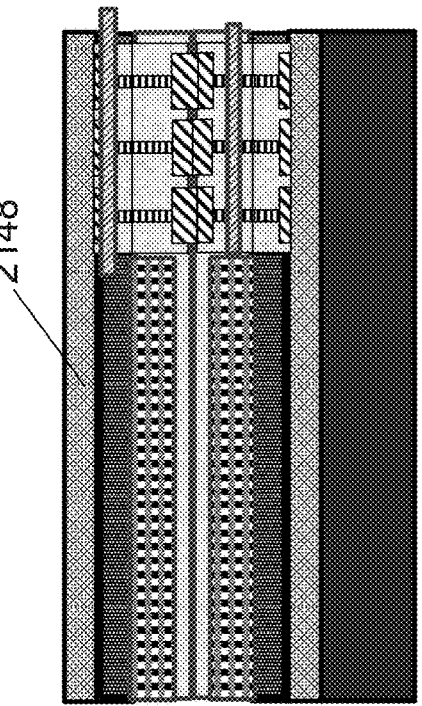

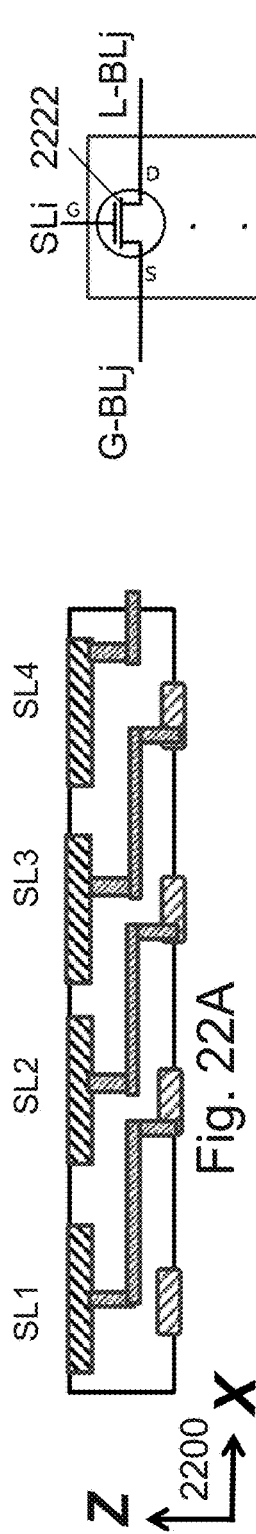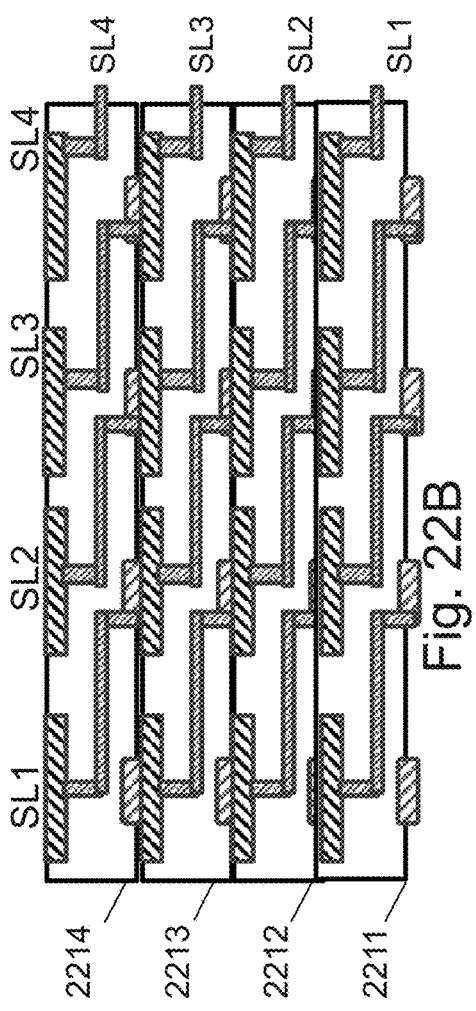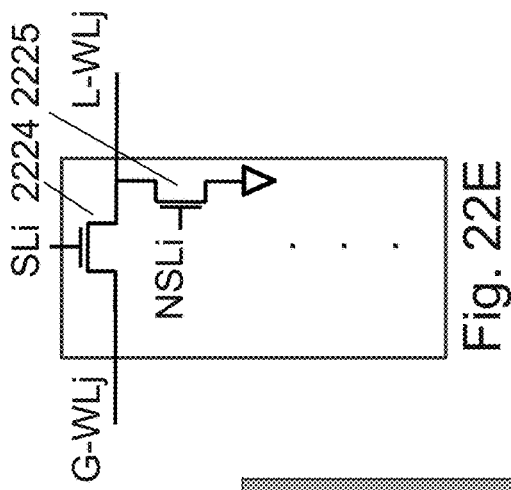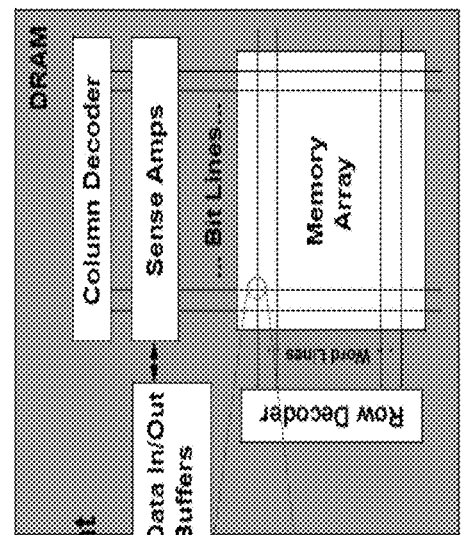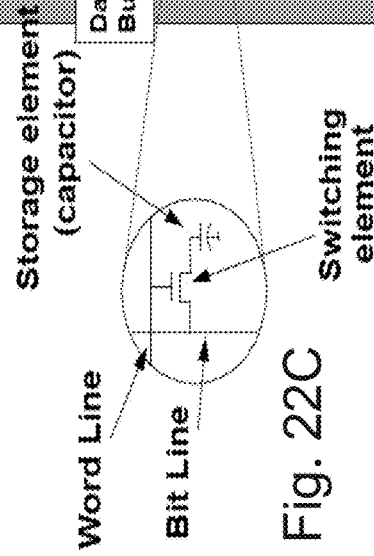

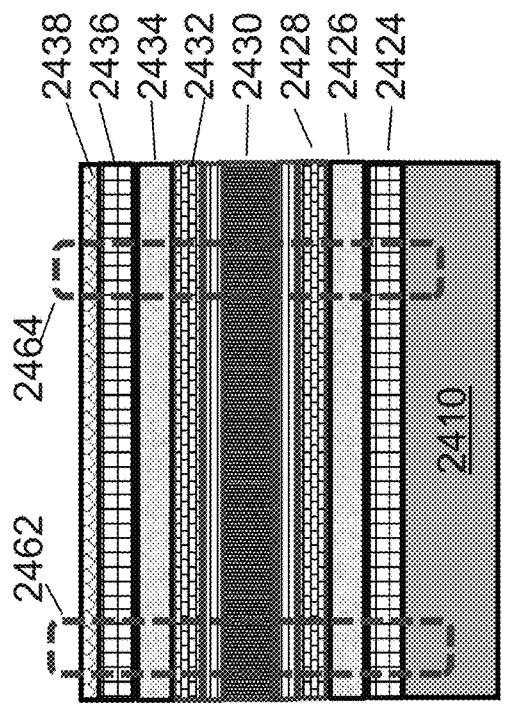
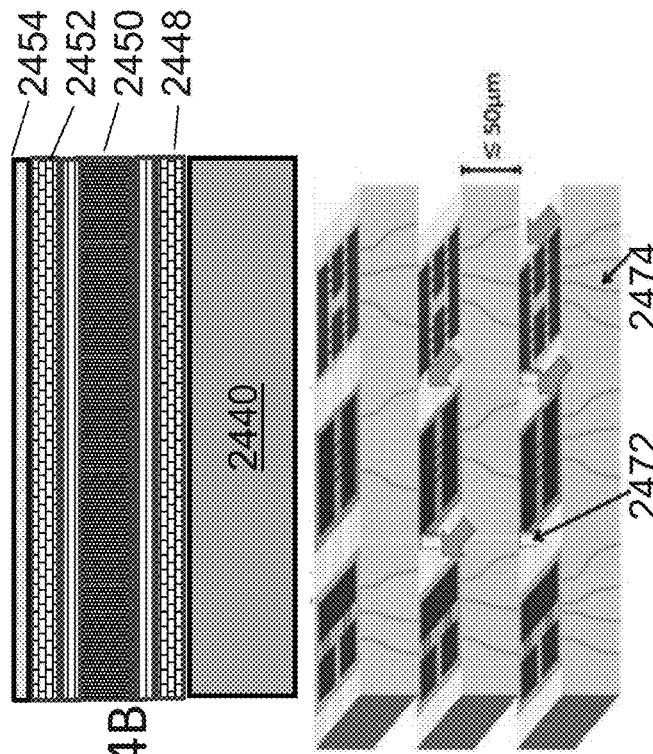
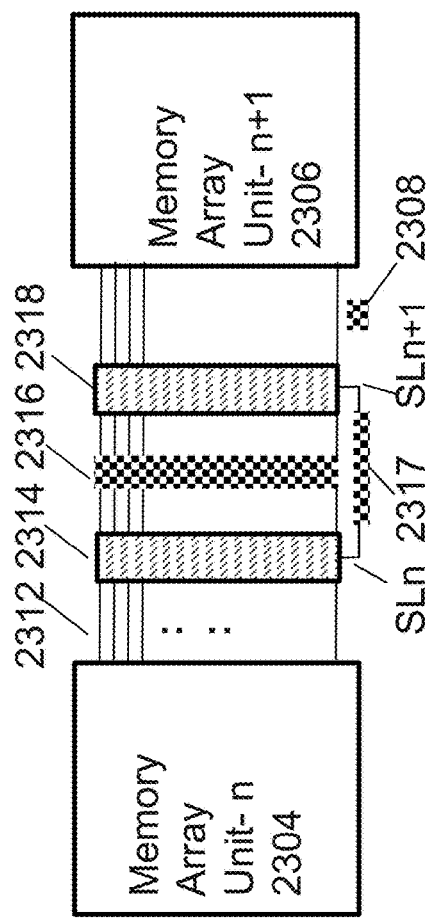
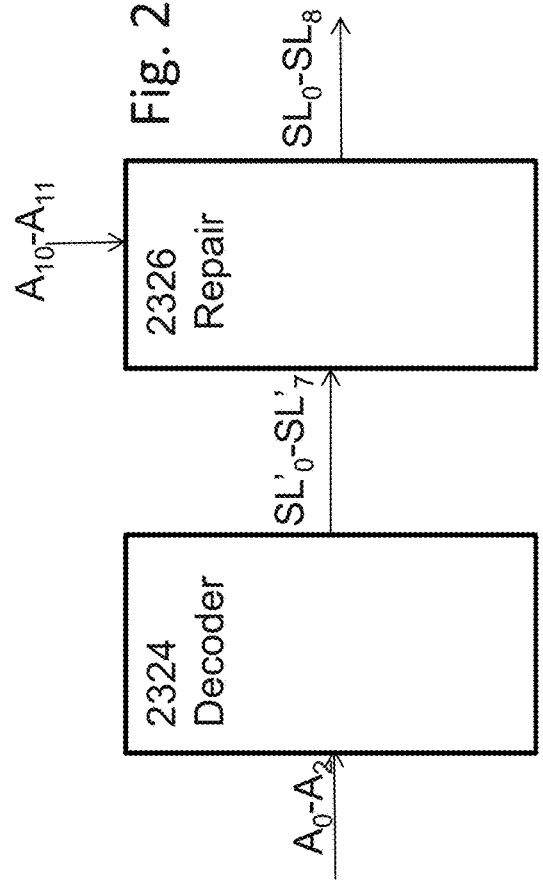
Fig. 24A
Fig. 24B
Fig. 24C
Fig. 23A
Fig. 23B

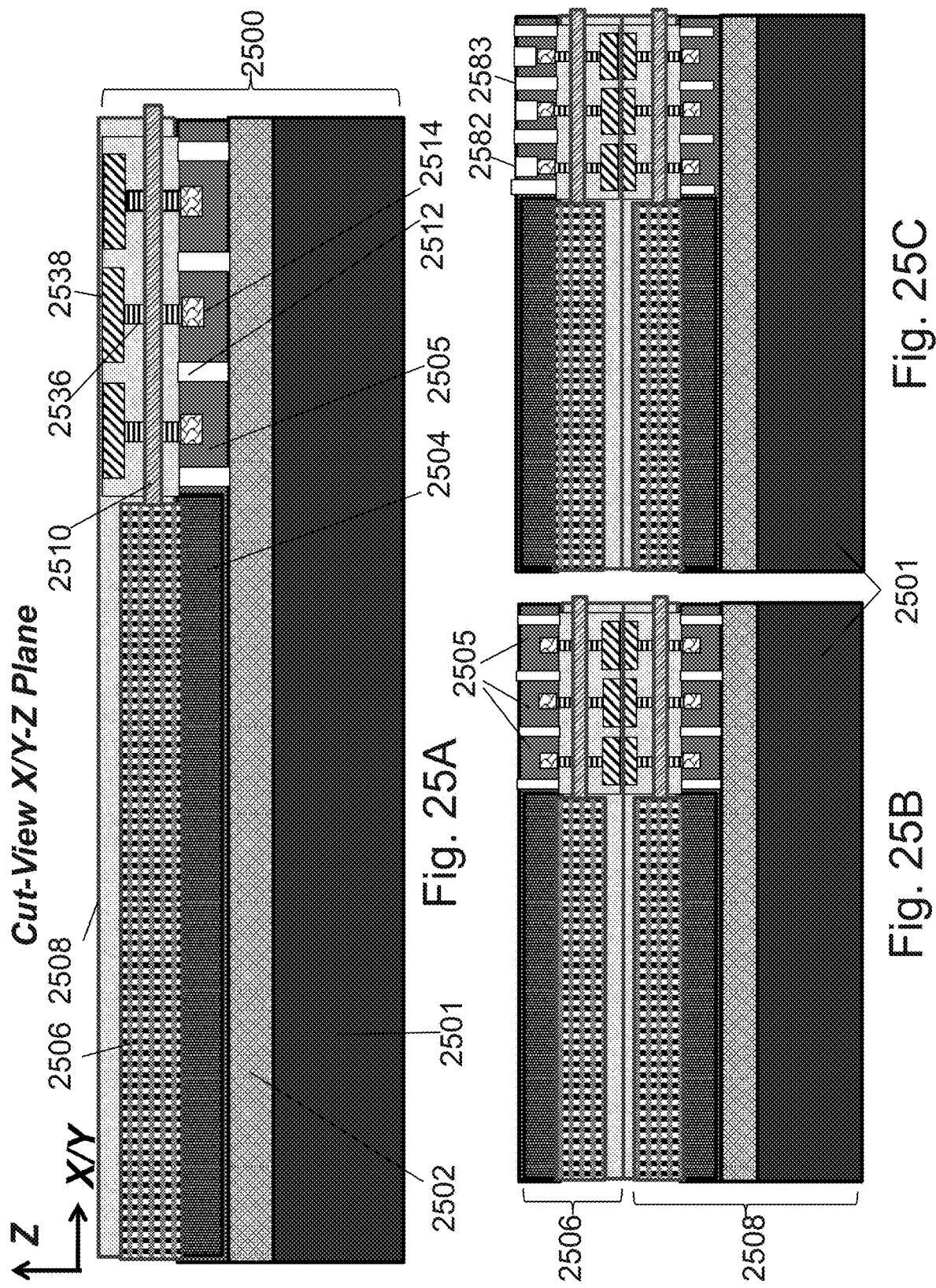

Cut-View X/Y-Z Plane

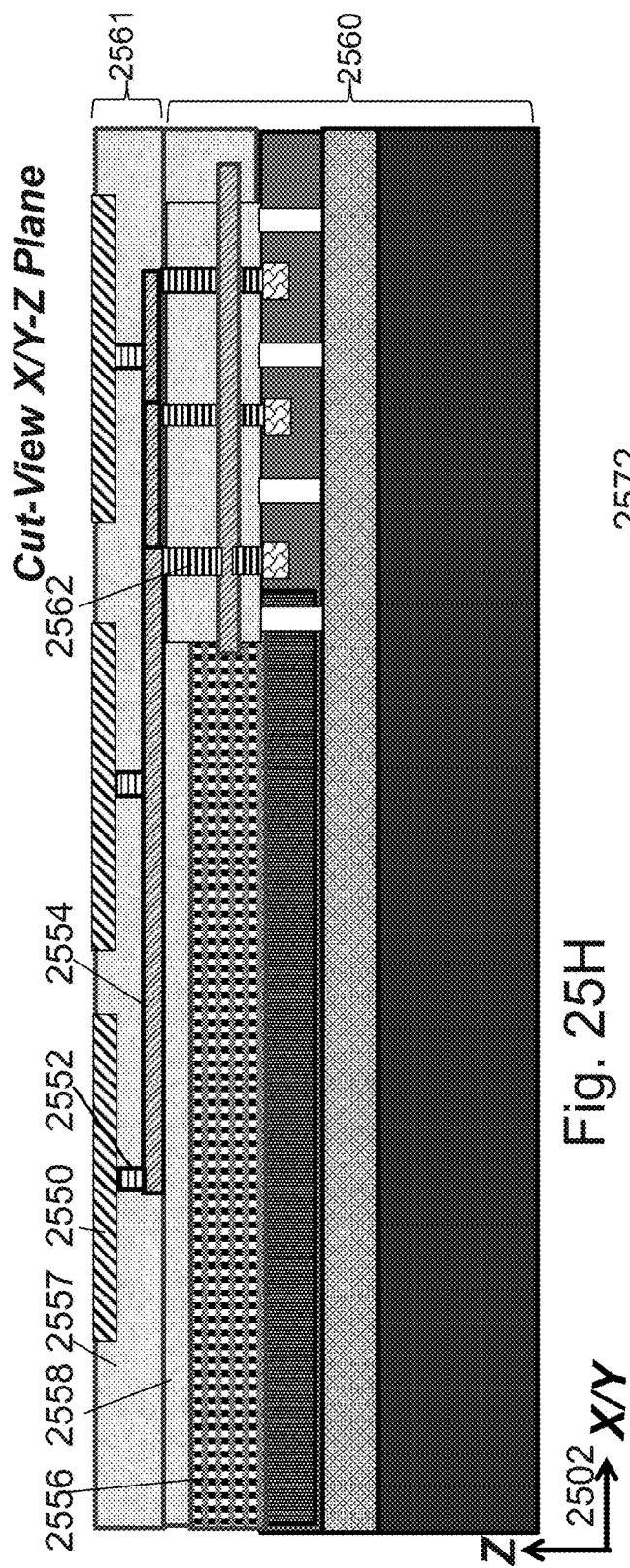
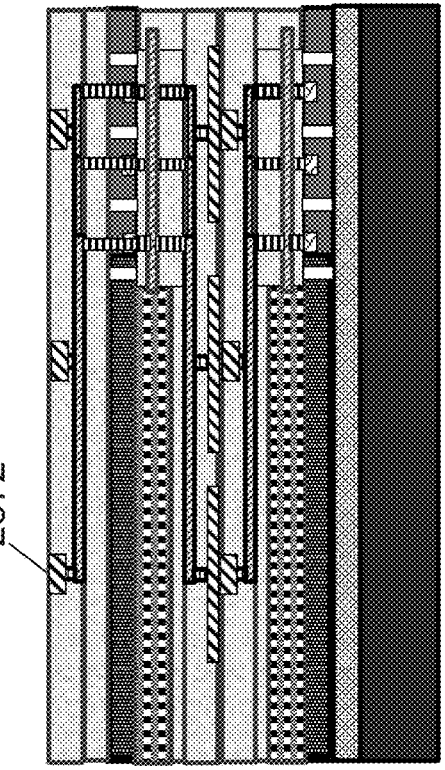
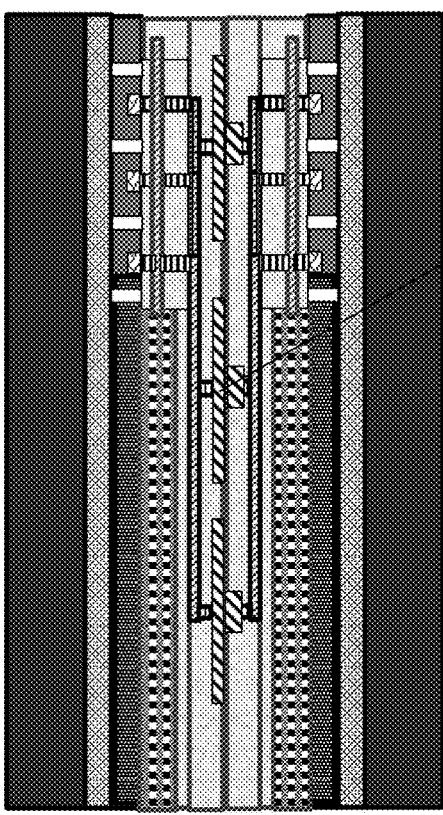
Fig. 25H
Fig. 25I
Fig. 25J

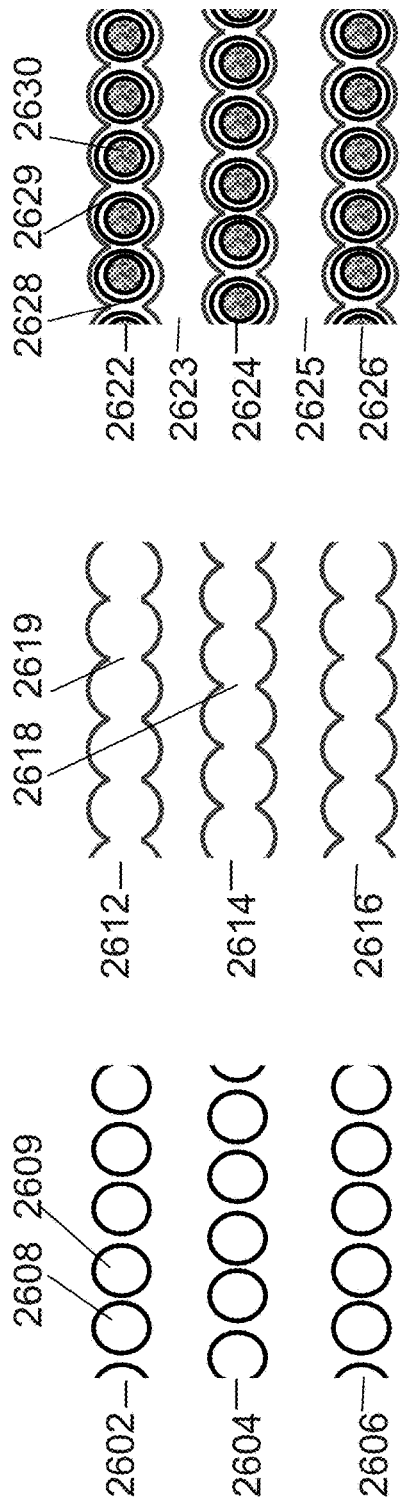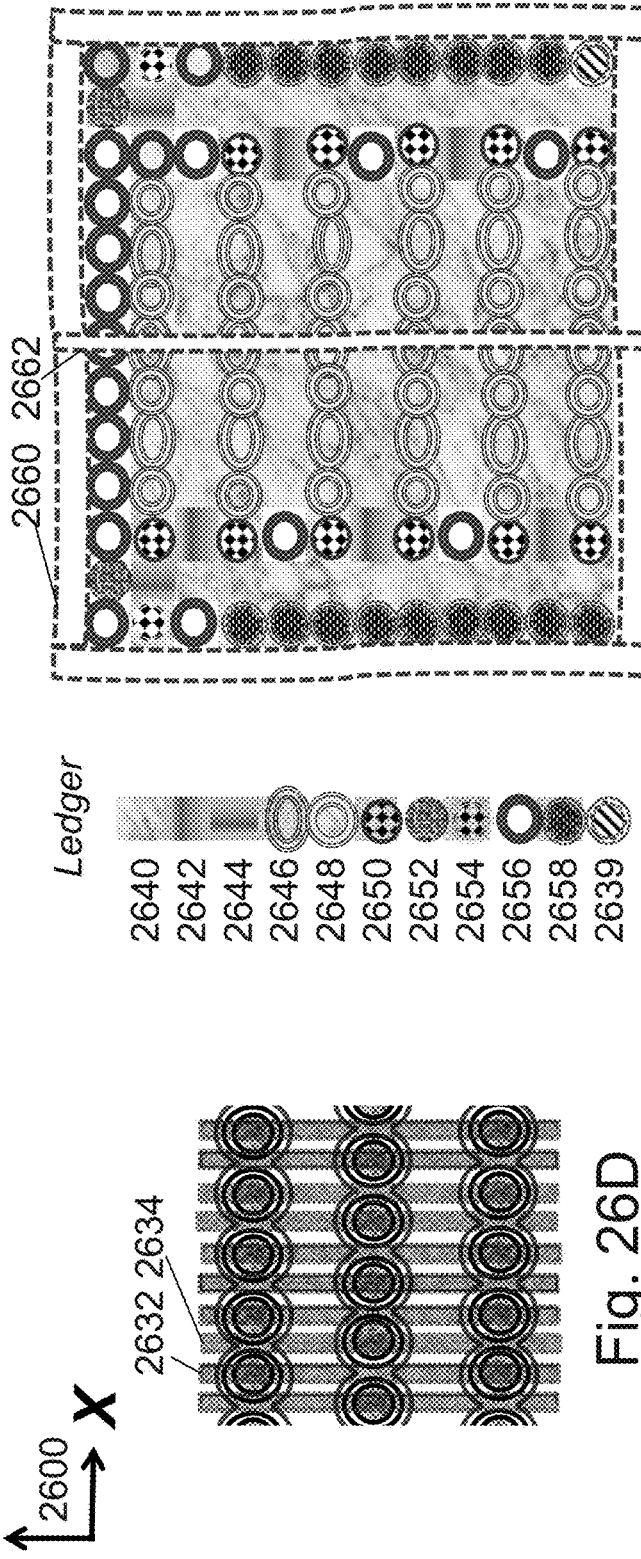

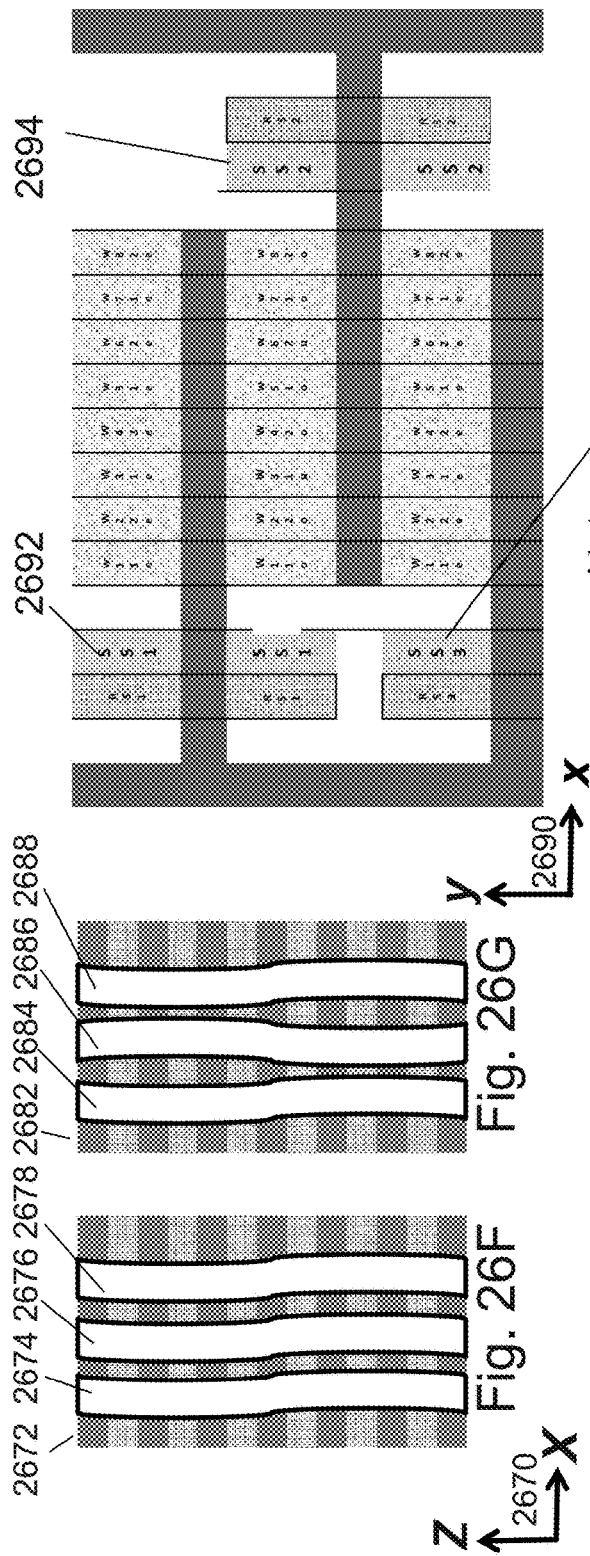

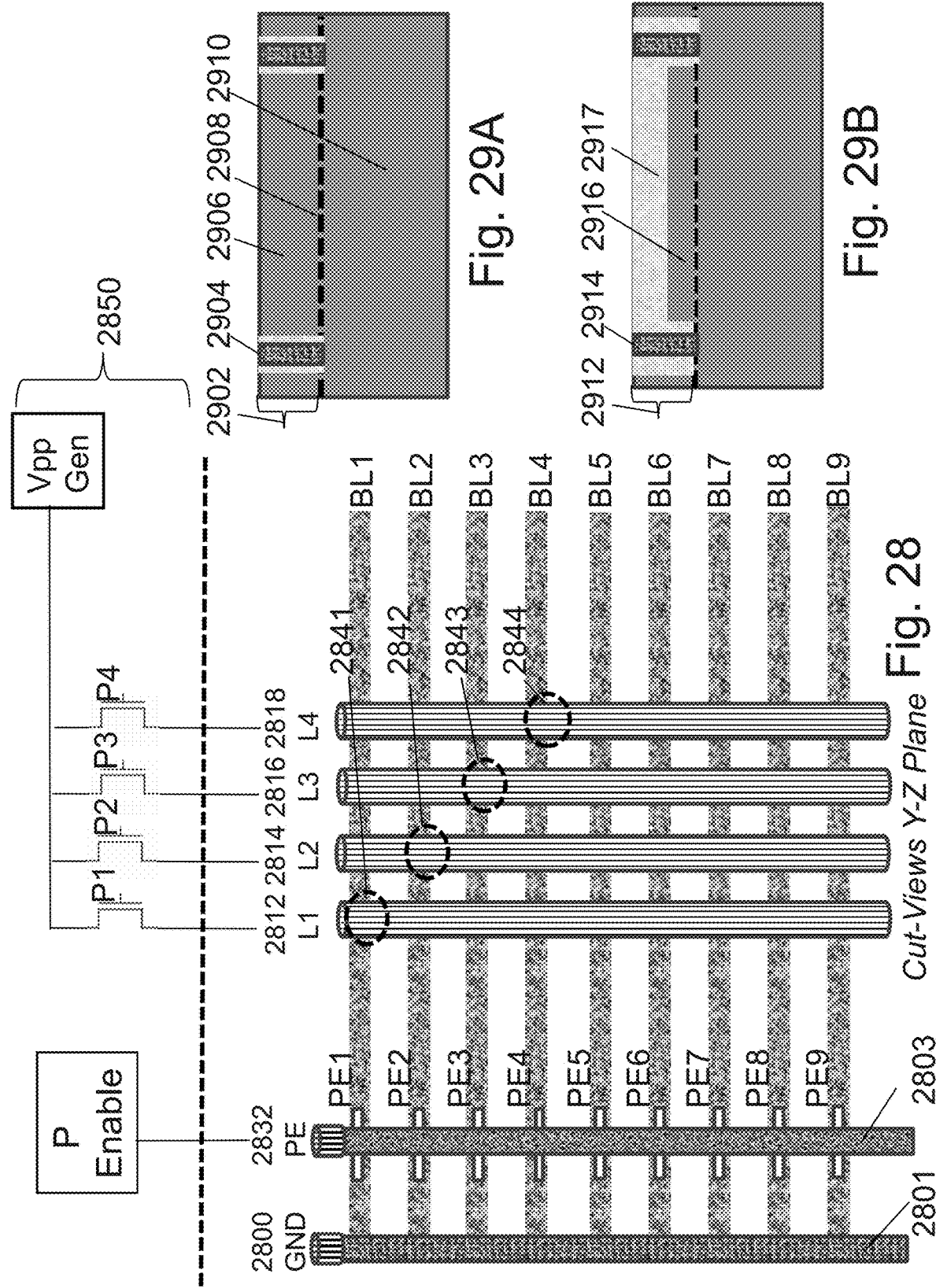

METHOD TO CONSTRUCT 3D DEVICES AND SYSTEMS

BACKGROUND OF THE INVENTION

1. Field of the Invention

This application relates to the general field of Integrated Circuit (IC) devices and fabrication methods, and more particularly to multilayer or Three Dimensional Integrated Memory Circuit (3D-Memory) and Three Dimensional Integrated Logic Circuit (3D-Logic) devices and fabrication methods.

2. Discussion of Background Art

Over the past 40 years, there has been a dramatic increase in functionality and performance of Integrated Circuits (ICs). This has largely been due to the phenomenon of "scaling"; i.e., component sizes such as lateral and vertical dimensions within ICs have been reduced ("scaled") with every successive generation of technology. There are two main classes of components in Complementary Metal Oxide Semiconductor (CMOS) ICs, namely transistors and wires. With "scaling", transistor performance and density typically improve and this has contributed to the previously-mentioned increases in IC performance and functionality. However, wires (interconnects) that connect together transistors degrade in performance with "scaling". The situation today is that wires dominate the performance, functionality and power consumption of ICs.

3D stacking of semiconductor devices or chips is one avenue to tackle the wire issues. By arranging transistors in 3 dimensions instead of 2 dimensions (as was the case in the 1990s), the transistors in ICs can be placed closer to each other. This reduces wire lengths and keeps wiring delay low.

There are many techniques to construct 3D stacked integrated circuits or chips including:

Through-silicon via (TSV) technology: Multiple layers of dice are constructed separately. Following this, they can be bonded to each other and connected to each other with through-silicon vias (TSVs).

Monolithic 3D technology: With this approach, multiple layers of transistors and wires can be monolithically constructed. Some monolithic 3D and 3DIC approaches are described in U.S. Pat. Nos. 8,273,610, 8,298,875, 8,362,482, 8,378,715, 8,379,458, 8,450, 804, 8,557,632, 8,574,929, 8,581,349, 8,642,416, 8,669,778, 8,674,470, 8,687,399, 8,742,476, 8,803, 206, 8,836,073, 8,902,663, 8,994,404, 9,023,688, 9,029,173, 9,030,858, 9,117,749, 9,142,553, 9,219, 005, 9,385,058, 9,406,670, 9,460,978, 9,509,313, 9,640,531, 9,691,760, 9,711,407, 9,721,927, 9,799, 761, 9,871,034, 9,953,870, 9,953,994, 10,014,292, 10,014,318, 10,515,981, 10,892,016; and pending U.S. patent application Publications and application Ser. Nos. 14/642,724, 15/150,395, 15/173,686, 16/337,665, 16/558,304, 16/649,660, 16/836,659, 17/151,867, 62/651,722; 62/681,249, 62/713,345, 62/770,751, 62/952,222, 62/824,288, 63/075,067, 63/091,307, 63/115,000, 2020/0013791, 16/558,304; and PCT Applications (and Publications): PCT/US2010/052093, PCT/US2011/042071 (WO2012/015550), PCT/US2016/52726 (WO2017053329), PCT/US2017/052359 (WO2018/071143), PCT/US2018/016759 (WO2018144957), and PCT/US2018/52332 (WO 2019/060798). The entire contents of the foregoing patents, publications, and applications are incorporated herein by reference.

Electro-Optics: There is also work done for integrated monolithic 3D including layers of different crystals, such as U.S. Pat. Nos. 8,283,215, 8,163,581, 8,753,913, 8,823,122, 9,197,804, 9,419,031, 9,941,319, 10,679, 977, and 10,943,934. The entire contents of the foregoing patents, publications, and applications are incorporated herein by reference.

Additionally the 3D technology according to some embodiments of the invention may enable some very innovative IC devices alternatives with reduced development costs, novel and simpler process flows, increased yield, and other illustrative benefits.

SUMMARY

The invention relates to multilayer or Three Dimensional Integrated Circuit (3D IC) devices and fabrication methods. Important aspects of 3D IC are technologies that allow layer transfer. These technologies include technologies that support reuse of the donor wafer, and technologies that support fabrication of active devices on the transferred layer to be transferred with it.

In one aspect, a method to construct a 3D system, the method comprising: providing a base wafer; and then transferring a first memory wafer on top of said base wafer; and then thinning said first memory wafer; and then transferring a second memory wafer on top; and then thinning said second memory wafer; and transferring a memory control on top; and then thinning said memory control.

In another aspect, a method to construct a 3D system, the method comprising: providing a base wafer; and then transferring a memory control on top; and then thinning said memory control, transferring a first memory wafer on top; and then thinning said first memory wafer; and then transferring a second memory wafer on top; and then thinning said second memory wafer.

In another aspect, a 3D device, the device comprising: a first stratum comprising first bit-cell memory arrays; a second stratum comprising second bit-cell memory arrays; and a third stratum, wherein said second stratum overlays said first stratum, wherein said first stratum overlays said third stratum, wherein said third stratum comprises a plurality of word-line decoders to control said first bit-cell memory arrays and said second bit-cell memory arrays.

In another aspect, a 3D device, the device comprising: a first stratum comprising first bit-cell memory arrays; a second stratum comprising second bit-cell memory arrays; and a third stratum, wherein said second stratum overlays said first stratum, wherein said first stratum overlays said third stratum, wherein said third stratum comprises a plurality of word-line decoders to control said first bit-cell memory arrays and said second bit-cell memory arrays; further comprising: a logic stratum; and a thermal isolation layer disposed between said logic stratum and said first stratum, wherein said thermal isolation layer is designed so during said device operation a first temperature of said first stratum is at least 20° C. lower than a second temperature of said logic stratum.

BRIEF DESCRIPTION OF THE DRAWINGS

Various embodiments of the invention will be understood and appreciated more fully from the following detailed description, taken in conjunction with the drawings in which:

FIG. 1A is an example illustration of selective etch by Applied Material etcher;

FIG. 1B is an example illustration of alternating Si and SiGe layers;

FIGS. 2A-2I are example illustrations of an alternative system process flow;

FIGS. 3A-3D are example illustrations of the structure transfer of an alternative system process flow;

FIGS. 4A-4H are example illustrations of an alternative donor wafer process flow;

FIGS. 5A-5D are example illustrations of an additional alternative donor wafer process flow;

FIG. 7 is an example illustration of a logic unit redundancy scheme;

FIGS. 10A-10J are example illustrations the formation and structure of a staircase connectivity scheme;

FIGS. 11A-11D are example illustrations of a "Lego" scheme with 3D NOR;

FIG. 11E is an example illustration of an isolation structure to keep the logic heat away from the memory array;

FIGS. 11F-11K are example illustrations of alignment techniques and structures;

FIGS. 12A-12J are example illustrations of array access and staircase schemes;

FIGS. 13A-13D are example illustrations of write and erase schemes for the 3D NOR array;

FIGS. 15A-15E are example illustrations of a 'DS-SB' 3D NOR structure and cell formation;

FIG. 15F is an example illustration of a programming scheme for 3D NOR with a staircase;

FIG. 15G is an example illustration of an alternative to a staircase;

FIGS. 16A-16D are example illustrations of writing a ferroelectric memory cell;

FIGS. 17A-17D are example illustrations of two bits stored in one facet of a memory cell;

FIGS. 18A-18D are example illustrations of writing bits in a small section of a ridge of the 3D-NOR fabric;

FIGS. 18E-18F are example illustrations of programming multiple bits in a cell of the 3S-NOR fabric;

FIG. 19A is an example illustration of a 3D system;

FIG. 19B is an example illustration of customization of a 3D system;

FIGS. 20A-20F are example illustrations of the formation of multiple stratum integrated into a 3D system via 3D integration with minimum per strata processing;

FIG. 20G is an example illustration of a connectivity technique adapted to die level operation;

FIG. 20H is an example illustration of a through strata via structure;

FIGS. 21A-21H are example illustrations of a control line arrangement for memory integration of the 3D system of FIGS. 19 and 20;

FIGS. 22A-22B are example illustrations of a stratum select connectivity scheme;

FIGS. 22C-22E are example illustrations of wordline and bitline select schemes;

FIGS. 23A-23B are example illustrations of two-layer select and select schemes;

FIG. 24A is an example illustration of an alternative 3D computer system;

FIG. 24B is an example illustration of a generic 3D memory structure "G3DM";

FIG. 24C is an example illustration of 3D structure with active thermal cooling;

FIGS. 25A-25D are an example illustrations of an alternative flow and structure for 3D stacking without changing the main processing of the memory/logic;

FIGS. 25H-25J are example illustrations of over the array connectivity structures;

FIGS. 26A-26D are example illustrations of using a punch and plug process scheme;

FIG. 26E is an example illustration of the single hole punch process to construct elements which may be needed for the 3D NOR fabric;

FIG. 26F is an example illustration of holes/vias etched or punched together/simultaneously;

FIG. 26G is an example illustration of holes/vias etched or punched in two or more independent etch steps;

FIG. 26H is an example illustration of global strata select for stacking of 3D memory structures;

FIG. 27 is an example illustration of a memory unit refresh operation flow;

FIG. 28 is an example illustration of an alternative per layer access by sidewall strapping though one-time-programmable anti-fuses; and FIGS. 29A and 29B are example illustrations of a pass-through path add-on structure and an alternative structure.

DETAILED DESCRIPTION

Figure 2G:
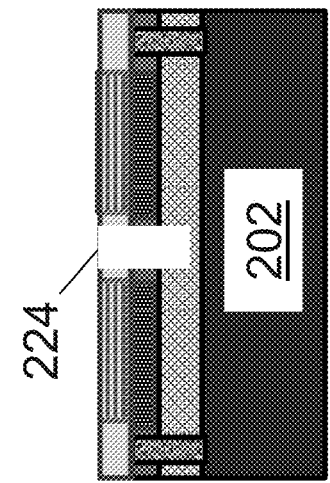

An embodiment of the invention is now described with reference to the drawing figures. Persons of ordinary skill in the art will appreciate that the description and figures illustrate rather than limit the invention and that in general the figures are not drawn to scale for clarity of presentation. Such skilled persons will also realize that many more embodiments are possible by applying the inventive principles contained herein and that such embodiments fall within the scope of the invention which is not to be limited except by any appended claims.

Some drawing figures may describe process flows for building devices. The process flows, which may be a sequence of steps for building a device, may have many structures, numerals and labels that may be common between two or more adjacent steps. In such cases, some labels, numerals and structures used for a certain step's figure may have been described in the previous steps' figures.

The use of layer transfer in the construction of a 3D IC based system could enable heterogeneous integration where each of strata may include one or more of MEMS sensor, image sensor, CMOS SoC, volatile memory such as DRAM and SRAM, persistent memory, and non-volatile memory such as flash and OTP. Such could include adding memory control circuits, also known as peripheral circuits, on top or below a memory array. The memory strata may contain only memory cells but not control logic, thus the control logic may be included on a separate strata. Alternatively, the memory strata may contain memory cells and simple control logic where the control logic on that strata may include at least one of decoder, buffer memory, sense amplifier. The circuits may include the charge pumps and high voltage transistors, which could be made on a strata using silicon transistors or other transistor types (such as SiGe, Ge, CNT, etc.) using a manufacturing process line that is different than the low voltage control circuit manufacturing process line. The analog circuits, such as for the sense amplifiers, and other sensitive linear circuits could also be processed independently and be transferred over to the 3D fabric. Such 3D construction could include "Smart Alignment" techniques presented in this invention or leverage the repeating nature of the memory array to reduce the impact of the wafer bonder misalignments on the effectiveness of the integration.

In patents such as, for example, U.S. patent application Ser. No. 15/173,395, layer transfer techniques called ELTRAN (epitaxial layer transfer) are presented and may be part of the formation process of a 3DIC. The ELTRAN technique utilizes an epitaxial process or processes over porous layers. Alternatively other epitaxial based structures could be formed to support layer transfer techniques by leveraging the etch selectivity of these epitaxial layers, such as the very high etch selectivity of SiGe vs. Silicon, and variations such as Silicon (single crystal or poly or amorphous), SiGe (mix of silicon and Germanium), P doped silicon, N doped silicon, etc. Alternately, these layer(s) could be combined with types of detachment processes, such as 'cold splitting,' for example the Siltectra stress polymer and low temperature shock treatment, to provide a thin layer transfer process.

Recently it become a very attractive concept for processing gate all around horizontal transistors and has become the target flow for next generation devices such as the 5 nm technology node. Some of the work in respect to selective etching of SiGe vs. silicon has been presented in a paper by Jang-Gn Yun et al. titled: "Single-Crystalline Si Stacked Array (STAR) NAND Flash Memory" published in IEEE TRANSACTIONS ON ELECTRON DEVICES, VOL. 58, NO. 4, APRIL 2011, and a more recent work by K. Wostyn et al. titled "Selective Etch of Si and SiGe for Gate All-Around Device Architecture" published in ECS Transactions, 69 (8) 147-152 (2015), and by V. Destefanis et al. titled: "HCl Selective Etching of Si1-xGex versus Si for Silicon On Nothing and Multi Gate Devices" published in ECS Transactions, 16 (10) 427-438 (2008), all of the forgoing incorporated herein by reference. Since the SiGe over Si substrate process is becoming mature, this facilitates using a SiGe layer as a sacrificial layer for production worthy 3D layer transfer. FIG. 1A illustrates the high etch selectivity of SiGe vs. Silicon, which, in this example, could be formed using, for example, the Applied Material Selectra etch system. Alternatively, the selective etch may be made using a wet chemical etch. FIG. 1B illustrates a putative retrograde Ge composition with stack thickness as explained thoroughly later.

An exemplary layer transfer process could include the steps A-K, referencing the illustrations FIG. 2A-2I and FIG. 3A-3D:

A. As illustrated in FIGS. 2A and 2B, epi (the term 'epi' herein means epitaxial, as often used in the art) layer 204 such as SiGe may be formed on a donor wafer or reusable donor wafer-base substrate 202, for example, by an epitaxy processes. The donor wafer may contain a strata layer over the sacrificial layer, also called herein a 'cut-layer', on the base substrate 202 where the strata layer is subsequently transferred to a receptor wafer. The epitaxy process may utilize but not is limited to vapor-phase epitaxy (WE), a modification of chemical vapor deposition, molecular-beam and liquid-phase epitaxy (MBE and LPE). If desired so as to at least increase etch selectivity, dopant may be incorporated during the epitaxial growth process by adding impurities to the source gas and/or reaction chamber. The type of epitaxy may be homoepitaxy with the same material grown on the base substrate 202. In the homoepitaxy, the doping type and concentration of the epi layer 204 may be substantially different from those of the base substrate 202 and the subsequently formed silicon layer 206, which could provide sufficient etch selectivity. Alternatively, another type of epitaxy may be heteroepitaxy with different material grown on the substrate. Such examples include SiGe on Si. Epi layer 204 may be formed with a thickness of about 20 nm, 50 nm, 100 nm, or about 200 nm, or about 500 nm, or about 1000 nm or about 2000 nm, depending on process integration, etching throughput, stiction resistance, and other process and device architecture engineering decisions and tradeoffs. The base wafer 202 thickness could be similar to the industry standard for these types of processing such as about 775 microns used for most current silicon fabs. The base wafer 202 may include sizes of about 2 inch, about 4 inch, about 8 inch, or about 12 inch in diameter or about 16 inch in the future (these wafer diameter sizes are often known with the corresponding mm sizes: 50 mm, 100 mm, 150 mm, 200 mm, 300 mm, 450 mm). Heterogeneously grown epi layer 204 may include various materials, for example SiGe, in anticipation of a sacrificial etch later in the process flow. The content of Ge in the SiGe may be designed per the selectivity desired and in consideration of the stress, for example, such as about 20% Ge, or about 10% Ge, or about 25% Ge, etc. With respect to the etch selectivity, the epi layer 204 could be favorably removed from the base substrate 202 and the subsequently formed silicon layer 206. The level of stress needs to be controlled to not cause dislocations. The stress can be controlled by at least growth rate, temperature, and film thickness. Predefined trenches on the silicon layer 206 and partially or fully across the epi layer 204 (not shown) in the designated dicing streets (or other non-circuit areas, for example, such as the streets between projection fields) could be used to provide some release of the potential stress. These trenches could have a width and a depth approximately corresponding to the thickness of the SiGe layer. Other techniques could be used to reduce stress, associated with epitaxial of SiGe on or under a silicon layer, such as incorporating smaller atoms in the SiGe layer such as boron or carbon; these and similar techniques are known in the art and could be used with combination with the techniques herein to support various forms of layer transfer or other applications herein.

B. As illustrated in FIG. 2C, silicon layer 206 as an active layer for the active devices to be formed may be epitaxially grown on top of epi layer 204. The silicon layer 206 may also be single crystalline Ge, SiGe or Si:C depending on the applications. However, we herein will use silicon layer 206 as the active layer unless otherwise specified. The thickness of silicon layer 206 may include a thickness of about 10 nm, or about 20 nm, or about 50 nm, or about 100 nm, or about 200 nm, or about 500 nm, or about 1,000 nm or about 2,000 nm, as desired for the electronic circuits, depending on engineering, materials and scientific device considerations. In many formations, silicon layer 206 may be considered to consist of mono-crystalline or single crystal silicon.

C. As illustrated in FIG. 2D, desired circuits 212 may be processed, including n-type and p-type transistors and other devices, such as inductors, capacitors, resistors, optoelectronic devices, gas sensors, etc., and may include a processed contact layer. For example, the desired circuit 212 may be processed to include metal 0 layer or metal 4 layer. This could be done using conventional processing including the appropriate high temperature processes (~600-900° C.) such as gate oxidation, dopant activation, contact silicidation, and so on. Types of transistors and circuits may include, for example, DRAM, NAND, or RRAM, RCAT, continuous array and FPGA structures, gate array, memory blocks, logic blocks, CMOS p-type and n-type transistors, MOSFET transistors, junction-less transistors, JFET, replacement gate transistors, thin-side-up transistors, double gate transistors, horizontally oriented transistors, finfet transistors, fully depleted thin-body transistor, JLRCAT, DSS Schottky transistors, and/or trench MOSFET transistors.

D. As illustrated in FIG. 2E, first set of holes 214 may be formed (by, for example, a conventional mask and etch sequence of processing) and may extend through the top silicon layer 206. The bottom of the etched trench may reside inside the SiGe epi layer 204 and may not touch the surface of base substrate 202 in order to reclaim the base substrate 202. Alternatively, the bottom of the etched trench may be located below the bottom of SiGe epi layer 214. These holes could then be filled with oxide or other material that would remain and play as a supporter for the desired circuits during future silicon and SiGe etches. Filled first set of holes 214 may serve as posts to hold the top layer designated to be transferred in later steps. First set of holes 214 may be located in the dicing streets area or some field oxides such as shallow trench isolation, and may be designed to be weak enough to be torn out, according to design and process integration engineering considerations.

E. As illustrated in FIG. 2F, one or more interconnection layers 216 may be added. This is optional, depending on engineering and design considerations. Interconnection layers 216 may include wiring, contacts and vias, and may include materials such as, for example, copper, aluminum, tungsten, titanium, tantalum, cobalt metals and/or silicides of the metals. Interconnection layers 216 may be covered with isolation layer 222 (as illustrated in FIG. 2G) with materials such as $SiO_2$, carbon containing oxides, and so on. Isolation layer 222 may be planarized, for example, with CMP or other forms of planarization in anticipation of future wafer to wafer bonding.

Figure 2H:
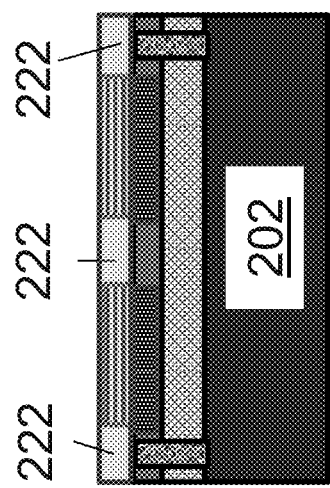

F. As illustrated in FIG. 2H, second set holes 224 may be formed to expose portions of sacrificial SiGe epi layer 204, thus allowing a substantially full etch of the sacrificial SiGe layer (the former SiGe epi layer 204). These holes could be made at un-used locations or in locations designated for future Through-Layer-Via (TLVs). These holes could also be made in locations designated for shallow trench isolation ("STI"). These holes may be opened through the top layers such as isolation layer 222 all the way into the epi layer 204. The formation of the holes for the sacrificial layer etches may include steps to protect the top silicon layer 206 and its holes side wall such as sidewall spacer by: 1. Use isotropic deposition techniques such as ALD to deposit isolation material such as silicon oxide in the open holes covering the side wall and the bottom of the holes. 2. Then may use anisotropic etching to open only the bottom of the holes to direct access to the sacrificial layers while protecting the side walls.

Figure 2I:
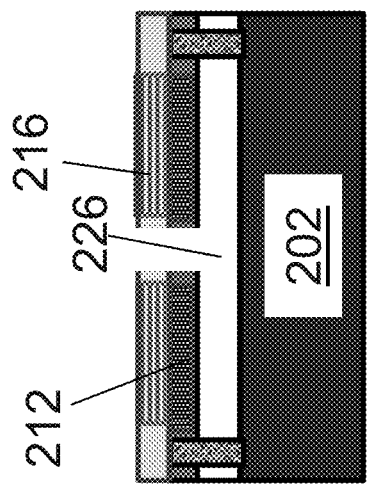

G. As illustrated in FIG. 2I, selectively etch the remaining sacrificial epi layer 204 creating void 226 underneath desired circuit layer 212. The design of posts and allocation of sacrificial etch holes could be designed so after the sacrificial layer etching is completed, the suspended circuit layer be remained substantially flat for layer transfer.

H. As illustrated in FIG. 3C, the structure such as illustrated in FIG. 3A (the structure from FIG. 2I) may be flipped and bonded onto a target wafer 302 illustrated in FIG. 3B. The target wafer 302 may be fully processed wafer including metallization, for example, an arbitrarily designed SoC or generic circuit. Alternatively, the target wafer 302 may be specially fabricated wafer which could be the underlying base in the 3D structure. For example, see the incorporated references listed as part of the Background of the Invention section of this specification. This results in bonded structure 390 such as illustrated in FIG. 3C. The bonding could be oxide to oxide bonding which could be followed with top wafer interconnection through a TLV (Thru Layer Via) process, or metal to metal bonding, or hybrid bonding (oxide to oxide and metal to metal bonding). The bonding process could be made so it results in sufficiently a strong adhesion between bonding surfaces of donor wafer and the target wafer 302. The target wafer 302 may include transistors of one or more types in one or more layers, metallization such as, for example, copper or aluminum in one or more layers, interconnections to and between layers above and below, and interconnections within the layer. The transistors may be of various types that may be different from layer to layer or within the same layer. The transistors may be in various organized patterns. The transistors may be in various pattern repeats or bands. The transistors may be in multiple layers involved in the transfer layer. The transistors may be, for example, junction-less transistors or recessed channel array transistors. Target wafer 302 may further comprise semiconductor devices such as resistors and capacitors and inductors, one or more programmable interconnects, memory structures and devices, sensors, radio frequency devices, or optical interconnect with associated transceivers. Target wafer 302 may further include isolation layers, such as, for example, silicon and/or carbon containing oxides and/or low-k dielectrics and/or polymers, which may facilitate oxide to oxide wafer or substrate bonding. Target wafer 302 may also be a base substrate to build the 3DIC stricture onto.

I. The donor structure, substantially donor wafer-base substrate 202, may be detached from bonded structure 390 leaving intermediate 3D IC structure 399 as is illustrated in FIG. 3D. The donor wafer, substantially reusable donor wafer-base substrate 202, could be reclaimed for processing to prepare for reuse, perhaps as a seed wafer of subsequent epitaxial growth as explained in FIG. 2. Intermediate 3D IC structure 399 may include target wafer 302, desired circuits 212, surface 213, first set of holes 214, and interconnection layers 216. Alternatively, the substrate 202 could be grind and etched back without being reusable for future processing.

J. The top surface 213 of intermediate 3D IC structure 399 may be cleaned and prepared for interconnections. Optionally cover with isolation.

K. TLVs may be formed for interconnection from the top to the bottom strata to form the 3DIC layer interconnects if necessary.

The donor wafer 'tearing off' detach could be assisted by known techniques such as, for example, water-jet, wedge, laser cutting, etched assisted tearing off and mechanical twist and pull.

Alternatively, additional interconnection layers and other processing could be added in between step 'G' and 'H' above. So, the structure illustrated in FIG. 2I could be further processed before being flipped and bonded to the target wafer 302. This add-on process could include adding additional metal layers or any other structure including additional transistor layers using similar techniques such as layer transfer.

The sacrificial layer removal holes 224 process could include side wall oxide deposition to further protect the side walls from the etch process designed to remove the sacrificial layers. These holes could be later sealed by a second step of, for example, oxide deposition. Such two steps oxide fill could be visible under proper magnification or other imaging techniques.

These layer transfer techniques could allow many of the benefits associated with monolithic 3D technologies including avoiding thermal budgets associated with forming one circuit strata affecting another circuit stratum, enabling mixing of technology nodes, mixing circuit substrate types, crystal structure, orientation and many other advantages associated with heterogeneous integration without process temperature restrictions described herein and in the incorporated art.

The use of SiGe for epitaxial based 'cut layer' instead of porous silicon or porous SiGe 'cut layer' could be adapted to many of the flows presented in at least U.S. application Ser. Nos. 14/642,724, 15/095,187, and 15/173,686, all the forgoing are incorporated herein by reference. It does add some complexity related to the holding posts formation and the holes to etch the SiGe thoroughly prior to performing the layer transfer. For applications in which two layers of active silicon, and isolation layer in between, is desired, the in-between SiGe could be removed after the transfer and replaced with isolation material.

Use of SiGe as a sacrificial layer for transferring a single crystal structure of one crystal on top of another structure has been presented in U.S. patent application 2015/0137187, incorporated herein by reference. Many studies of SiGe etch selectivity in respect to silicon have been done and published such as: In a work by T. Salvetat et al titled "Comparison between three Si1-xGex versus Si selective etching processes" presented at 214th ECS Meeting; and by M. Stoffel titled "SiGe wet chemical etchants with high compositional selectivity and low strain sensitivity" published in Semicond. Sci. Technol. 23 (2008) 085021; by V. Destefanis et al titled "High pressure in situ HCl etching of Si1-xGex versus Si for advanced devices" published in Semicond. Sci. Technol. 23 (2008) 105019; by T. K. Cams et al titled "Chemical Etching of Si,Ge in HF:H2O2:CH3COOH" published in J. Electrochem. Soc., Vol. 142, No. 4, April 1995; and by Marius Orlowski et al titled "Si, SiGe, Ge, and III-V Semiconductor Nanomembranes and Nanowires Enabled by SiGe Epitaxy" published at ECS Transactions, 33 (6) 777-789 (2010), all of the forgoing are incorporated herein by reference.

Another alternative is to skip steps related to FIG. 2D-2I and use the SiGe layer 204 as an etch stop, and after transfer grind and etch back the donor substrate 202, using the SiGe as an etch stop. And if desired, remove the SiGe layer 204 with an additional selective etch step, etching SiGe and very little or negligibly thin backside of the top silicon 206. The base substrate 202 could be about 775 microns thick while the SiGe 204 could be ten nm or less, or few tens of nm or even few 100 nm. For example, a 3D technique of flip bond and etch back of an SOI donor such as presented in at least U.S. Pat. Nos. 6,821,826, 7,723,207 and 7,312,487, all the forgoing are incorporated herein by reference. As an alternative to the use of SOI wafers, the base substrate 202 would not be reused but rather be ground and etched away from its wafer backside. The back grind and etch back could use wet etching and the SiGe layer 204 could be designed to be very resistive to the silicon wet etching. The SiGe could be designed to have multiple layers including one that might have high Ge content, for example, such as over about 20% or over about 40% or over about 80%, followed by other layers with low Ge content such as less than about 20% or even less than about 10% to reduce stress so to support the silicon layer 206. FIG. 1B illustrates an example of having the alternating Si and SiGe layers being comprised by multiple sub-layers with a varying content of Ge in the SiGe. Depositing or epitaxially growing the SiGe interface layer to the silicon with a smaller amount of Ge content decreases the stress due to the lattice mismatch. Then gradually increasing the Ge content to the desired level and then after the desired thickness has been grown gradually reducing the Ge content toward the next level of silicon could be used to reduce stress from both sides of the Silicon-SiGe-Silicon structure. Reducing the stress could help reduce the risk for formation of point defects and dislocations, and could help the engineering of the SiGe thickness as needed for the application. The alternative of use of SiGe as an etch stop later is further discussed herein later.

Alternatively, the 'cut' process could be integrated with Siltectra's 'Cold Split' technology as has been detailed in at least U.S. Pat. Nos. 8,440,129 and 8,877,077, and U.S. applications 20160064283, 20160086839, all of which are incorporated herein by reference. These techniques would allow reuse/recycling of the donor wafer (base substrate 202A middle location inside SiGe or the interface between Si and SiGe could be used to provide the "Pre-Defined Break Initiation Point" as an alternative to the Siltectra use of laser or in addition to it. The Siltectra's 'Cold Split' could reduce the need for the undercut etch and posts formation processing while providing reuse of the base substrate 202. For this technique, a multilevel SiGe could be designed to support the 'cut' on the one hand but also to reduce damage to the device layer on the other. This could be accomplished by increasing the Ge content in the interface with the base substrate 202 to have high Ge content such as over about 20% or over about 40% or even over about 80% and then on the side interfacing with device layer 206 forming a low Ge content such as less than about 20% or even less than about 10% to reduce stress to the silicon circuit layer 206. Alternatively, a few atomic layers thick Ge rich SiGe layer or even a pure Ge layer may be used as a predefined break layer.

Once the base substrate 202 is removed, a selective etch could be used to remove the SiGe residues. Additional thinning processes such as etch and/or CMP could be used to further thin the back side of the device layer 206. Connection layers could be added included vias aligned to the target wafer 302 using "Smart Alignment" and similar 3D integration techniques discussed here and the incorporated by reference art.

This use of Cold Split could be used to form SOI wafers and could be less expensive to manufacture when compared to the current ion-cut methods.

A variation of flow in respect to FIG. 2A-2I, is to have the first set of holes 214 posts formed as part of the substrate process prior to desired circuits 212 processing. Accordingly, the flow in respect to FIG. 2E could be done to the donor wafer illustrated in FIG. 2C. These posts could be positioned at the dicing streets such as those between reticle projections, so they would not interfere with the future desired circuits 212. Alternatively post formation may be done to the donor wafer illustrated in FIG. 2B, which could then be processed with an epitaxial process which could be thick enough to fill-in the space on top of these posts allowing the following circuit processing without concern for the posts' locations. The number of posts per wafer could be 1-2, 4-10, 10-50 or over 100 first set of holes 214 posts per reticle. The diameter of these posts could be the size of vias for the designated process, or 50-100, 100-200, 200-400 nm or even larger. The material in these posts could be material compatible with these semiconductor processes and may be designed to be very selective with respect to the SiGe etch such as Silicon-Nitride, or any of the materials used for contacts such tungsten, or their combination, or, for example, copper, aluminum, titanium, tantalum, cobalt metals and/or silicide of the metals.

Another alternative is to use a similar flow to form a donor substrate which could support layer transfer as an alternative to an ELTRAN based donor wafer. This embodiment offers silicon on nothing structures anchored by post structures on the silicon ends. Then, the process follows using wafers with silicon on nothing. An exemplary donor wafer construction flow could include the steps A-F, referencing the illustrations in FIG. 4A-4H:

A. As illustrated in FIGS. 4A and 4B, on a reusable donor wafer-base substrate 402 and epi layer 404 as a sacrificial layer may be formed, for example, by epitaxy processes. Epi layer 404 may be formed with a thickness of about 100 nm, or about 200 nm, or about 500 nm, or about 1000 nm or about 2000 nm, depending on process integration and architecture engineering decisions and tradeoffs. Epi layer 404 may include various materials, for example SiGe, in anticipation of a sacrificial etch later in the process flow. The content of Ge in the SiGe may be designed per the selectivity desired and in consideration of the stress. Predefined trenches (not shown) in the designated dicing streets (or other non-circuit areas, for example, such as the streets between projection fields) could be used to release the potential stress. These trenches could have a width and a depth approximately corresponding to the thickness of the epi layer 404 SiGe layer.

B. As illustrated in FIG. 4C, first epi silicon layer 406 as an active device layer may be epitaxially grown on top of epi layer 404. The thickness of silicon layer 406 may include a thickness of about 10 nm, or about 20 nm, or about 50 nm, or about 100 nm, or about 200 nm, or about 500 nm, or about 1000 nm or about 2000 nm, as desired for the electronic circuits, depending on engineering, materials and scientific device considerations. In many formations, first epi silicon layer 406 may be considered to consist of mono-crystalline or single crystal silicon.

C. As illustrated in FIG. 4D, first set of holes 414 may be formed to eventually be anchors of silicon on nothing structures (by, for example, a conventional mask and etch sequence of processing) and may extend through the first epi silicon layer 406 and the SiGe epi layer 404. These holes could then be filled with silicon nitride or oxide or other material that would be remained to future silicon and SiGe selective etches. Filled first set of holes 414 may serve as posts to hold the top layer designated to be transferred in later steps. First set of holes 414 may be located in the dicing streets area and may be designed to be weak enough to be torn out at the 'cut' step, by methods, for example, such as mechanical tear-off, edge and twist tear-off, water jet, according to design and process integration engineering considerations.

D. As illustrated in FIG. 4E, form multiple second holes 424 to expose the SiGe layer 404 and resultantly allow a full etch of the sacrificial SiGe layer (the former SiGe epi layer 404). These holes need to be open through the first epi silicon layer 406 all the way into the SiGe epi layer 404.

E. As illustrated in FIG. 4F, selectively etch the sacrificial SiGe layer creating void 426 underneath the first epi silicon layer 406. The suspended first epi silicon layer 407 may remain substantially flat for good bonding process.

F. As is illustrated in FIG. 4G perform additional epitaxial processing adding second epi silicon 432 (incorporated suspended first epi silicon layer 407 in drawing) and sealing second holes 424. The material and doping type of second epi silicon 432 may be the same or different from those of the first epi silicon 406 depending on the applications. The additional epitaxial width could exceed the second holes 424 radius to ease the holes sealing. A smoothing technique such as chemical mechanical polishing and $H_2$ annealing could be used to improve the top layer surface.

The donor wafer illustrated in FIG. 4G could then be used to process circuits 212, similar manner such as illustrated in FIG. 2D and could form some interconnections 216 similar manner as illustrated in FIG. 2F, and then be flipped and bond on top of a target wafer in a similar flow as is illustrated in FIG. 3A-3D, and many flows presented in the incorporated by reference material, such as U.S. Ser. No. 15/173, 686 in respect to ELTRAN base donor wafer.

The silicon epitaxial layer 206/406 could be constructed from two layers such as first layer doped n+ followed by p– doped layer. Such double layer construction could allow smoothing of the surface 213 of the transferred layer after the transfer. Selective etch could etch the doped n+ layer leaving a smooth p– doped layer. Alternatively, the silicon epitaxial layer 206/406 could be made with three layers as is illustrated for example in FIG. 4H. First a p– layer 442, followed by n+ layer 444 and finally the upper most p– layer 446. The upper layer 446 could be used for the transistor layer, underneath it layer 444 which could support back-bias as suggested by Zeno Semiconductors and as published such as in papers by Jin-Woo Han et al titled "A Novel Bi-stable 1-Transistor SRAM for High Density Embedded Applications" published at IEDM 2015, and "A CMOS-Compatible Boosted Transistor Having >2x Drive Current and Low Leakage Current" published at ESSDERC 2016, incorporated herein by reference. And the bottom layer 442, as a sacrificial layer, to support smoothing, post transfers by selective etch as discussed above.

In U.S. patent application Ser. Nos. 15/095,187 and 15/173,686 incorporated herein by reference, ELTRAN base layer transfer techniques are shown being adapted to support die to wafer 3D IC construction. Some of the die-to-wafer flows suggest transfer of dies having a relatively greater thickness such as 6 microns or even 20 microns and further thinning these dies after being bonded to the target wafer. Such die thinning could leverage a multi layers die structure. As an example, a multilayer such as is illustrated in FIG. 4H could be used. For such the bottom layer 442 could be silicon on top of it SiGe layer 444 and at the top silicon device layer 446. So the multilayered 440 could be 'cut' and bonded at a die level onto the target wafer, then a selective etch from the top could be used to first remove the silicon layer 442 and then thin the die all the way to the device layer by selectively etching the SiGe layer 444. These extra layers 442 and 444 could have a thickness of about 1 micron, 1-3 microns, 3-6 microns or even higher. The device layer 446 itself could have more sub-layers such as n+ and p− to support the back-bias scheme as discussed before. The use of multilayers, such as SiGe, allows having flexibility so a layer thickness is first set to support transfer at the wafer or die level providing the mechanical strength required for the handling and transfer, to be followed by selective etch trimming the thickness of the devices to support the electrical function and to allow forming via and other connection for following steps. These could be engineered by the artisan in the art. The 'cut' techniques could include selective under-etch or grinding and etch back as could be engineered for specific applications.

All these multilayer structures could be formed during the epitaxial growth by adding materials as gases to the epitaxial growth chamber as well known in the art.

These variations could be used for donor wafer substrate formation as discussed in reference to FIG. 4A-4H, or for transferable device layer as discussed in reference to FIG. 2A-2I.

As been stated before, a buried SiGe layer could be used as an etch stop layer. Use of buried SiGe as an etch stop layer to transfer a crystalline layer on top of another wafer structure has been presented in U.S. Pat. Nos. 6,521,041, 6,689,211, 6,940,089, 7,348,259 and U.S. patent applications 2014/0342523, and in combination with ion cut in U.S. patent applications 2007/0023066, 2008/018959 all of the forgoing are incorporated herein by reference.

An additional alternative is to combine the porous formation technology of the ELTRAN based wafer transfer with the epitaxial ease of formation of silicon —SiGe technology base layer transfer presented herein. In U.S. Pat. Nos. 5,685,946 and 5,757,024 and in paper by Mondiali, V., et al. "Micro and nanofabrication of SiGe/Ge bridges and membranes by wet-anisotropic etching." *Microelectronic Engineering* 141 (2015): 256-260, all incorporated herein by reference, SiGe is shown to be stain etched forming a porous layer with about 100 to 1 selectivity with respect to silicon. Using this selectivity could allow forming a 'cuttable substrate' from the structure of FIG. 2C or FIG. 4C without the need of the posts formation of FIG. 2E or FIG. 4D. This concept could be applied to substantially all of the transfer flows presented herein including die level and wafer level transfer. The buried SiGe layer would become mostly porous Ge or porous SiGe layer and would withstand the following process temperature and other related process steps. For the 'cut' step the techniques presented in respect to the ELTRAN process could be used, such as mechanical tear-off, edge and twist tear-off, water jet, and extremely selective etch (being porous and Ge vs. silicon). This would simplify the layer transfer process and would allow substrate reuse, both cost saving opportunities.

The stain etch of a buried (Si or Ge or) SiGe layer converting it to porous layer could also be used when thermal isolation is required. Porous layers function well as a thermal isolation layer and oxidizing it could further add mechanical strength and further decrease its thermal mobility. Accordingly such a layer process could be useful in forming thermal isolation between the stratum of the 3D structure. So, for example, using SiGe as an etch stop could be followed by, instead of etching away the SiGe after grinding and etching of the silicon substrate, stain etching the SiGe converting it to a thermal isolation layer.

Converting the buried SiGe layer to porous layer by stain etching as presented above could leverage the STI etching step to use it as access to the buried SiGe layer or could include dedicated holes 224, 424, etching step. These access holes could be designed to provide access for effective conversion of the full buried SiGe layer underneath the die to SiGe. Such full buried SiGe conversion could be engineered based on the height of the buried SiGe layer the percent of Ge and other engineering aspects. As presented in U.S. Pat. Nos. 5,685,946 and 5,757,024 the side spread of the stain etching could extend to over 1 micron from the access holes. The engineering aspect of such full SiGe conversion could include Electronic Design Automation ("EDA") to support the design process to place these holes throughout the die surface to provide sufficient access to full SiGe stain etching. Such EDA support could include adapting the macro-cell library to include access for very large structures, providing a holes adder utility to add holes in 'white' spaces area that do not need holes or STI for the active circuits, and adding modules to the Design Rule Checker ("DRC") utilities Similar type of EDA enhancements to support process modules, is common practice in the industry.

The layer transfer process could include two steps. First step could be performed at the frontend of the line of the process optionally as part of the STI process in which the SiGe layer is stain-etched converting it to a substantially porous layer. The second step could be performed just as before the layer transfer. In this second step, the porous-SiGe layer is selectively etched to make it ready for "cut"— detach. At that point the porous-SiGe could be selectively etched with extremely high selectivity. As discussed before, etching porous layer is about 5 orders of magnitude faster than etching the respective same material in full solid form. In addition the porous-SiGe is mostly Ge which could be extremely selective etched in respect to silicon. Accordingly the porous-SiGe could be etched with many orders of magnitude selectivity vs. silicon or other elements of the active circuits. In this case, the top silicon sidewall protection process described in FIG. 2H and FIG. 2I may be skipped. For the second step of weakening the porous-SiGe the required deep holes access could be designed with very low area loss. An example for such low cost access could be using the dice lanes. Deep etch of the dice lanes could help the layer transfer and detaching process as 'divide and conquer'. Additionally, the second step of weakening the porous-SiGe etch could be design to leave only small porous regions in the center of dies, keeping the dies in place for the bonding but make it easy to then detach the wafer leaving the active die bonded and the substrate detached and ready to be refreshed for reuse. An additional aspect of these porous-SiGe and related layer transfer techniques herein is an improved bonder machine which could include a detaching module. Such a detaching module could be a simple twist and pull apart, tearing off the substrate for reuse.

Additionally, a substrate 502 similar to one illustrated in FIG. 2C could be used in a conventional semiconductor fabrication process to process device layer contacts and potentially some connectivity 516 as illustrated in FIG. 5A. The SiGe layer 518 could be made as a buffer layer with multiple gradient Ge or as a uniform SiGe with Ge content of 15-20% or 20-30% or even higher. The circuit layer could be covered with oxide layer 517 and then planarized and made ready for being bonded to a target wafer 504 shown in FIG. 5B. The target wafer 504 may also be processed with the desired level of metallization. An oxide to oxide bond could be used to bond it to the target wafer 504 as illustrated in FIG. 5C. Other types of bonding could be used; such as metal to metal or hybrid bonding. Then a grind and etch could be used to remove the silicon substrate 502 from the bonded structure 522 leveraging the SiGe layer 528 as an etch stop resulting with the structure 524 as is illustrated in FIG. 5D.

Alternatively, the substrate 502 could be made with perforations similar to as been described in U.S. Pat. No. 8,273,610, incorporated herein by reference, in respect to at least FIG. 184 and FIG. 185. The SiGe layer could be etched or stain etched through these perforations allowing the detachment of the carrier wafer 502 for reuse.

Additional advantage of the techniques described herein is having the transferred circuit being an SOI circuit with its active silicon thickness to be fully depleted channel. The single crystalline silicon layer such as 530 could be made thin enough and being bonded over oxide and covered with oxide effectively could provide the SOI functionality and if made thinner such as 10 nm provides FD SOI functionality.

Figure 6B:
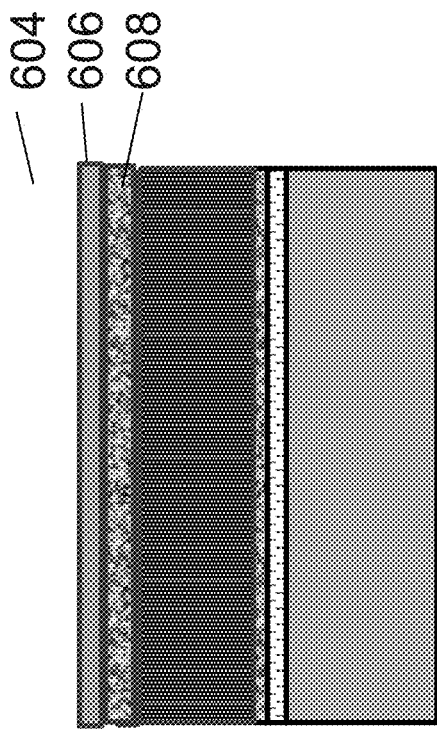
FIGS. 6A-6D are example illustrations of structures and methods to thermally isolate stratums in a 3D IC.
Figure 6D:
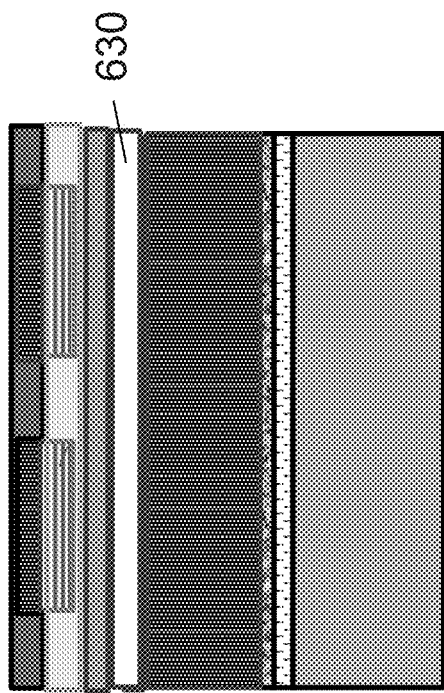
Figure 6A:
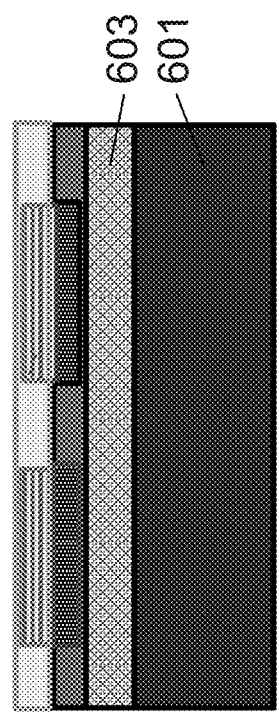
Figure 6C:
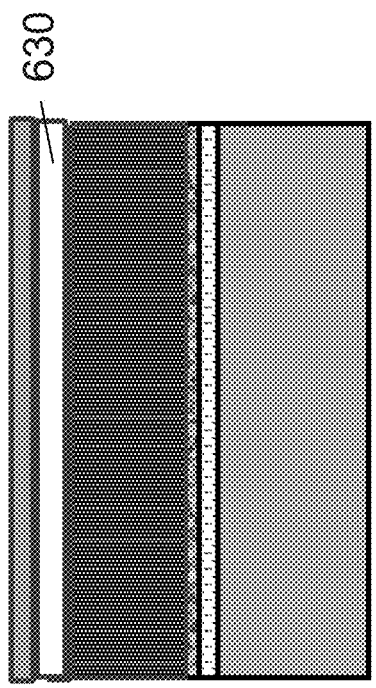

FIG. 6A is a 'cuttable' wafer carrying circuits 610 such as memory control (periphery) circuits. FIG. 6D illustrates transferring the circuits 610 of FIG. 6A on top of the structure 604 of FIG. 6B, transferring the substrate 601 and partially the 'cut-layer' (SiGe) 603, and then removing base substrate 601 and partially the 'cut-layer' 603. An additional inventive embodiment is to optionally form a thermal isolation 608 on top of the memory matrix of target wafer 604 as is illustrated in FIG. 6B. In U.S. Pat. No. 9,023,688, incorporated herein by reference, in at least FIGS. 1-5 and associated specification sections, various thermal isolation layer techniques are presented to allow high temperature processing of the upper layer with minimal effect of the underlying circuit. These techniques could also be used to allow thermal isolation between one stratum and the other strata. Such could help isolate the operating temperature of one stratum so that it would not affect the operation of the other stratum. For example, the target wafer 604 could be primarily memory circuits while the transfer circuit 610 could be logic circuits that consume higher power during operation. The logic circuit might be generating heat and operate at a higher temperature that the memory circuit underneath; for example, a temperature difference of greater than about 20° C., greater than about 40° C., greater than about 60° C., greater than about 100° C. Accordingly forming a thermal isolation layer 608 in-between might help isolate temperature across these strata. Such isolation layer techniques could also include having layer 608 act as a sacrificial layer that could be etched under the bonding layer 606 in similar way to what have been described in respect to the SiGe layer 204 in reference to FIG. 2D to FIG. 2I. Etching away layer 608 results as is illustrated in FIG. 6C, could further increase the thermal isolation by providing an air gap isolation 630 between stratums. The etch technique could be such which forms a first porous layer which could be fully oxidized providing buried air pockets and thus almost an air gap level of thermal isolation. Using these techniques could allow forming a thermal isolation layer 630 between two strata having a thickness of few tens of nm or few hundreds of nm or even few microns, and having a low thermal conductivity such as less than about 1 W/mK or less than about 0.4 W/mK or less than about 0.1 W/mK or even less than about 0.05 W/mK. Alternatively, the isolation layer, for example, thermal isolation 608, 630 in between the target wafer 604 circuits and the transfer circuits 610 could comprise aerogel or high porosity dielectric as detailed in U.S. Pat. No. 9,023,688 and could be made extra thick to further increase the thermal isolation, such as, for example, greater than about 100 nm, greater than about 200 nm, greater than about 400 nm, or greater than about 1 micron thick. In some cases, a thickness of 1-10 microns may be indicated, depending on design and engineering tradeoffs. Additionally, bonding layer 606 could include a heat spreader structure to reduce hot spots and further help protect the lower stratum from the upper stratum operating heat or vice versa. FIG. 6D illustrates a two strata 3D circuit 620 using techniques described herein. Furthermore, the through layer via ("TLV") used to connect the upper stratum to the lower one could utilize titanium to further reduce the heat conductivity between these strata. These TLV could use extra thick isolation to reduce thermal conductivity to the surrounding areas. Additionally, some of those TLV may be dedicated thermal TLVs wherein their main function is to serve as heat delivery channels to the heat sink and/or outside surface of the device. These even more important in respect to the TLV being used to conduct the heat from the operating circuit to the device external surface which is part of the device heat removal structure. Such extra thick lateral isolation could be greater than about 100 nm, greater than about 200 nm, greater than about 300 nm, greater than about 500 nm or more than a micron thick.

In a 3D system such as is illustrated in respect to at least FIG. 6D or FIG. 11D-11E, may include both a memory array and a logic circuit, the thermal isolation 1157, to keep the logic heat away from the memory array, could be placed in between the logic circuit 1156 (or logic layer) and the memory control circuit 1155 (or memory control circuit layer) as is illustrated in FIG. 11E. In general many vias, such as Thru Layer Vias (TLVs), may be connecting between the memory control circuit 1155 and the memory array 1131. These vias could connect to substantially every word-line, bit-line, source-line, and so forth. On the other hand the logic circuit 1156 could connect to the memory control circuit 1155 using address lines which represent far less connections (as an example—10 address line could control, with proper decoder circuits, 1024 word-lines). Reducing the number of TLVs through the thermal isolation layer 1157 helps reduce the thermal connectivity through it and greatly improves the effective thermal isolation.

Formation of multiple levels of arrays of transistors or other transistor formations in the structures described herein may be described at least by the terms 'multilevel device' or 'multilevel semiconductor device.' Some examples of multilevel device may include memory device such as DRAM, SRAM, and Flash memory and image sensors such as CCD and CIS.

3D devices could include redundancy for defect recovery in addition to redundancy techniques know for 2D devices. Such 3D devices could include one-time-programmable memory for at least packaged level memory repair. Such redundancy techniques and structure has been presented in U.S. Pat. No. 8,395,191, incorporated herein by reference, in respect to at least FIGS. 41, 86, 87, 114-132.

Additional variations of redundancy and repair techniques could be integrated within the 3D SRAM. 3D DRAM or 3D NOR fabric as detailed in PCT/US patent application 16/52726 and U.S. application Ser. No. 15/333,138, incorporated herein by reference. Hereinafter, the use of 3D NOR fabric in any of embodiment in this invention may be 3D SRAM fabric or 3D DRAM fabric unless otherwise specified.

Further inventive aspects follow. FIG. 7 illustrates a logic function of general 'look up table' and more specifically 3D architected look up table LUT-U 702 being processed together on top of logic function LUT-B 704, both sharing the same control gates and each may act as redundancy for the other, where -U and -B respectively denote upper stratum and bottom stratum, or upper portion and the bottom portion of the 3D structure. FIG. 7 illustrates that the LUT-U is included in the upper strata and the LUT is included in the bottom strata where two strata are constructed the mean explained in this invention. Placement of the stratum may vary due to engineering and design considerations. A programmable interconnect (I/C) structure 701 may include first I/C structure 706 and second I/C structure 707 which allow connecting either one of the logic function outputs, LU-Out 742 or LB-Out 744, to the primary output 724. Such programmable interconnect may be SRAM or latch. Alternatively, such programmable interconnect may be antifuse based OTP or other non-volatile memory such as RRAM, EEPROM, or flash, depending on the applications. The programmable interconnect may be implemented in the fabric layers in between the upper and the bottom portion and could be considered as a third strata or comprise a portion of a third stratum. Self-test could be used to choose which of the outputs to connect using the programmable connectivity structure first I/C structure 706 and second I/C structure 707. Redundancy could also be used for the interconnects such as is illustrated third I/C structure 714, fourth I/C structure 716, and fifth I/C structure 717, which would connect the LUT outputs to the secondary output 726. Another alternative is to have redundancy of the support circuits 712 on the bottom of the 3D NOR fabric as well.

Figure 8:
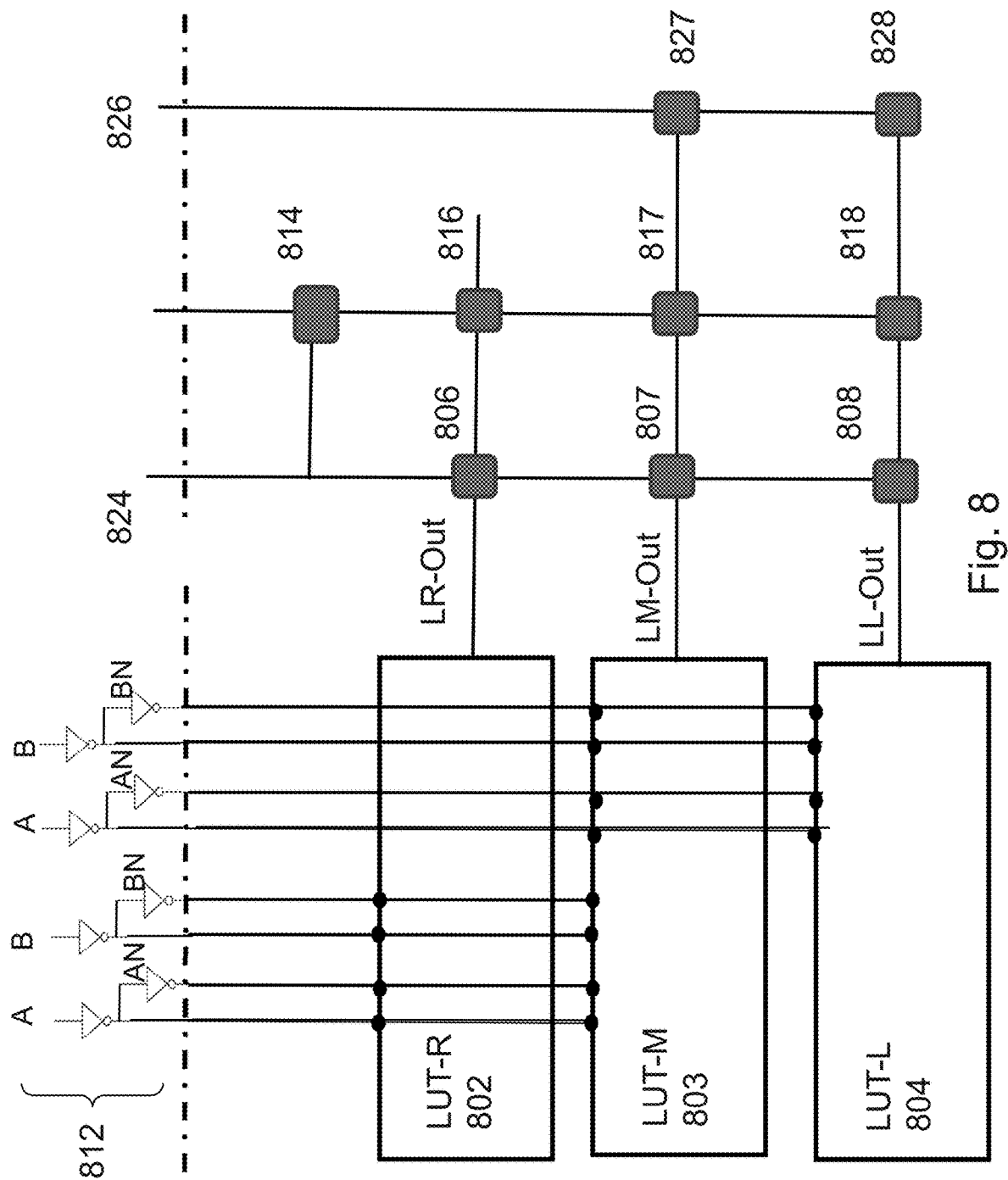
FIG. 8 is an example illustration of an alternative logic redundancy scheme.

FIG. 8 illustrates a redundancy scheme wherein a middle LUT-M 803 look up table functions to repair faults in either the right LUT-R 802 or the left LUT-L 804. The LUT-M, LUT-R, and LUT-L may be included at the same strata. Alternatively, LUT-M, LUT-R, and LUT-L may be placed in different strata of the 3D chip. The right LUT-R 802 and the middle LUT-M 803 could share the same control gates, and the middle LUT-M 803 and the left LUT-L 804 could also share the same gates disposed in the valleys of the corresponding ridge as is illustrated. Programmable interconnects structure 806, 807, 808, 814, 816, 817, 818, 827, 828 allow connecting to selected LUT to the proper first primary output 824 or second primary output 826 to function as two complementing LUT functions as discussed in respect to FIG. 23 of PCT/US patent application 16/52726.

These redundancy schemes have the advantage that they provide the repair locally keeping the overall circuit functionality consistent with or without activating the redundancy function. These are especially important for logic circuit operation.

In these forms of redundancy read or write could be performed in parallel to two adjacent ridges once both ridge selects are enabled to accelerate the redundancy operation.

Figures 9A, 9B:
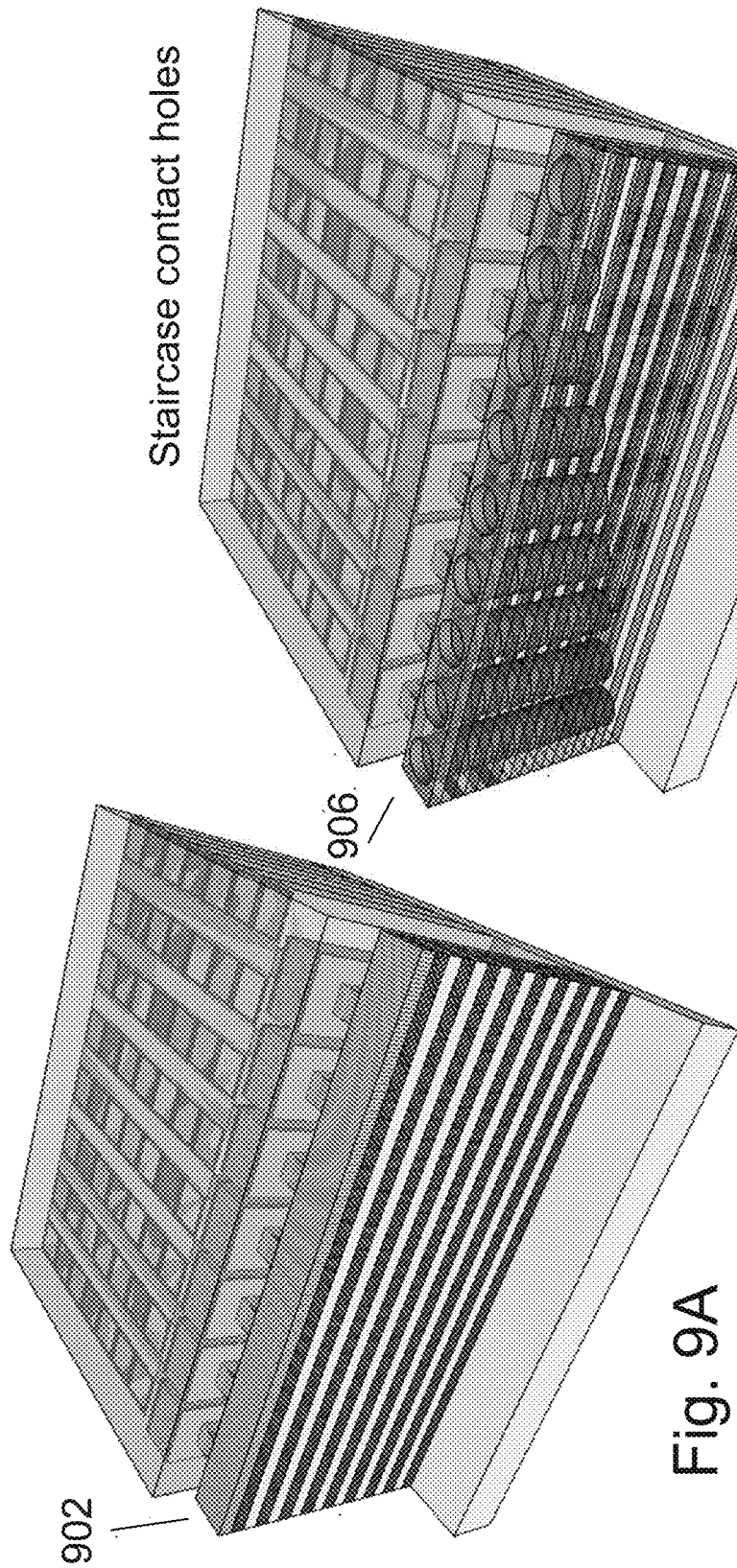
FIGS. 9A-9B are example illustrations of a staircase contact scheme.
Figure 14B:
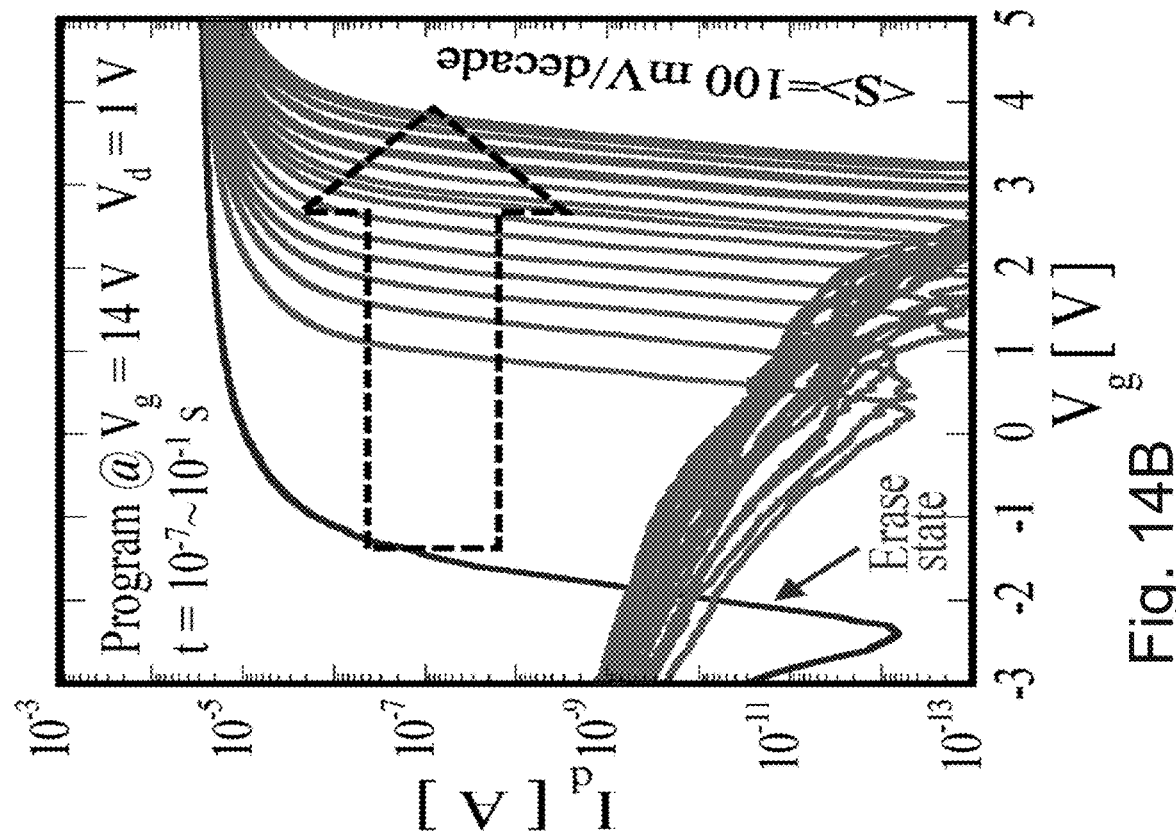
FIG. 14B is an illustration of I(V) curves demonstrating the performance of a self-referenced differential sense amplifier when applied to a programmed and erased memory cell.

FIG. 9A and FIG. 9B are corresponding to the 3D memory fabric presented in FIG. 14B and FIG. 14C of PCT/US patent application 16/52726. They illustrate the designated 3D memory fabric such as 3D NOR structure for staircase per layer connection 902 and the staircase contact holes 906. An alternative technique for staircase formation is illustrated in reference to FIG. 10A-10K. This technique leverages selective etch rates between the layers forming the 3D multilayer substrate, such as in the case of 3D NOR are the source/drain (S/D) layers, that could include N+ type silicon, and the channel layers, that could include P type SiGe layers. Alternatively, the channel may be realized in the Si layers wherein the S/D substantially resides in N+ SiGe layers/regions. The selective etch could be designed to etch the S/D layer faster than the channel layer, for example, at a rate such as twice as fast or even higher than 2× such as (2-3)×, (3-4)× or even higher. This etch process is designed to be an isotropic etch, wet or dry etch could be used with proper consideration for sizes. However, this does not preclude the use of other etches, for example, one that is primarily but not substantially isotropic, and so forth.

Multiple etch processes have been developed providing selectivity between the silicon etch rate and the SiGe etch rate including variations related to the proportional content of Ge in the SiGe. Such work was reported by V. Loup et al in work titled "Silicon and SiGe alloys wet etching using TMAH chemistry, published at Abstract #2101, 224th ECS Meeting; by Borel, S., et al. "Isotropic etching of SiGe alloys with high selectivity to similar materials." Microelectronic engineering 73 (2004): 301-305; and by Stephan BOREL titled "Control of Selectivity between SiGe and Si in Isotropic Etching Processes" published at Japanese Journal of Applied Physics Vol. 43, No. 6B, 2004, pp. 3964-3966, all incorporated herein by reference.

FIG. 10A illustrates the starting structure showing S/D layer that is to be converted into a structure for staircase per layer access region, having a top layer 1002 of mask, and multilayer ridge of S/D layers 1004 and channel layers in-between the S/D layers. The channel layer herein the per layer access region is a sacrificial layer that to be replaced by dielectric. The mask layer 1002 could be made to have a side etch similar to the S/D etch rate. The opening in the mask 1002 could be similar to the depth of the S/D layer or few times larger. The width could be similar to the width of the ridge.

FIG. 10B illustrates the structure after etching through to top most S/D layer through the opening in the mask.

FIG. 10C illustrates the structure after etching the top most channel layer through the opening in the mask and through the top most S/D layer. It could be seen the top most S/D layer could be etched about twice the thickness (Z direction) of the channel layer to the sides (X-Y direction) as the etching is isotropic and the etch rate of the S/D layer is twice higher than the etch rate of the channel layer.

FIG. 10D illustrates the structure after etching the second S/D layer through the top most channel layer. Note: These figures are not accurate and serve for illustrating the concept. FIG. 10K-FIG. 10N resulted from simulation and resemble the expected reality.

FIG. 10E illustrates the structure after etching the second channel layer through the formed opening.

FIG. 10F illustrates the structure after etching the third S/D layer through the formed opening.

Figure 10G:
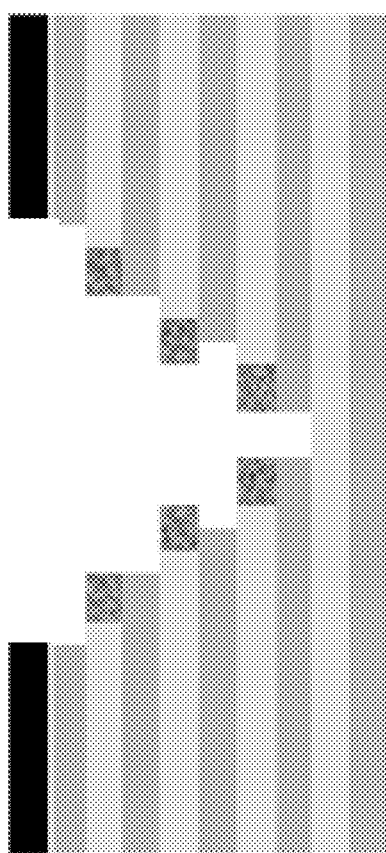

FIG. 10G illustrates the structure after etching the third channel layer through the formed opening.

Figure 10H:
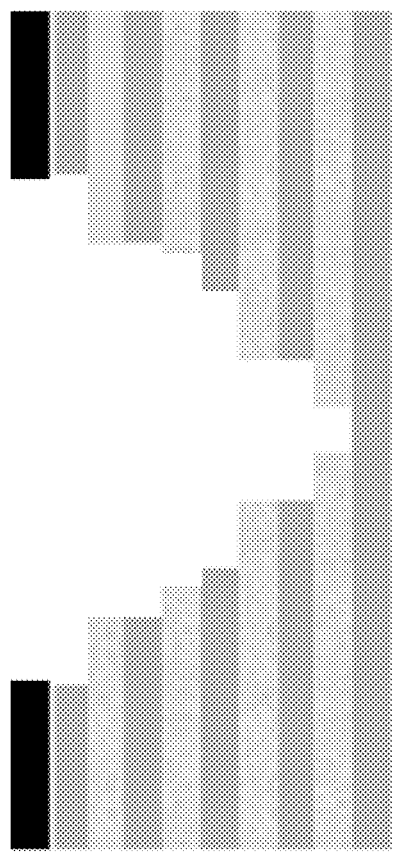

FIG. 10H illustrates the structure after etching the forth S/D layer through the formed opening.

Figure 10I:
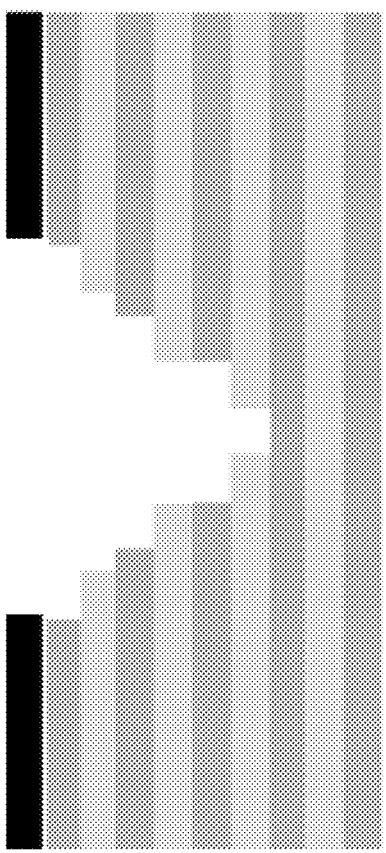

FIG. 10I illustrates the structure after etching the forth channel layer through the formed opening.

Repeat the n-th S/D layer and n-th channel layer etch until the etch process reaches the desired bottom most S/D and channel layer.

Figure 10J:
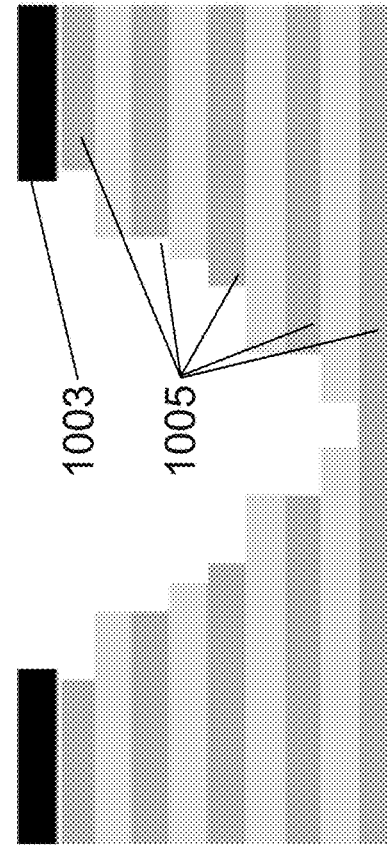
Figure 10K:
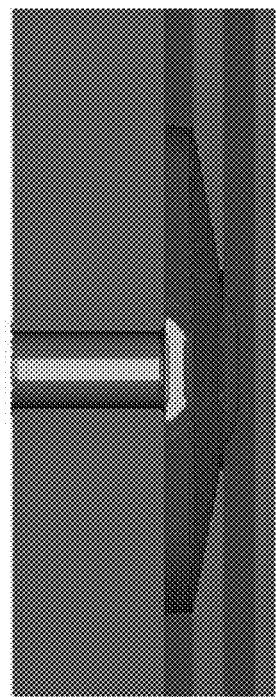
FIGS. 10K-10N are example illustrations of process simulations of the formation and structure of a staircase connectivity scheme.
Figure 10L:
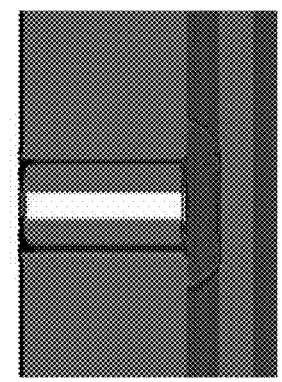
Figure 10M:
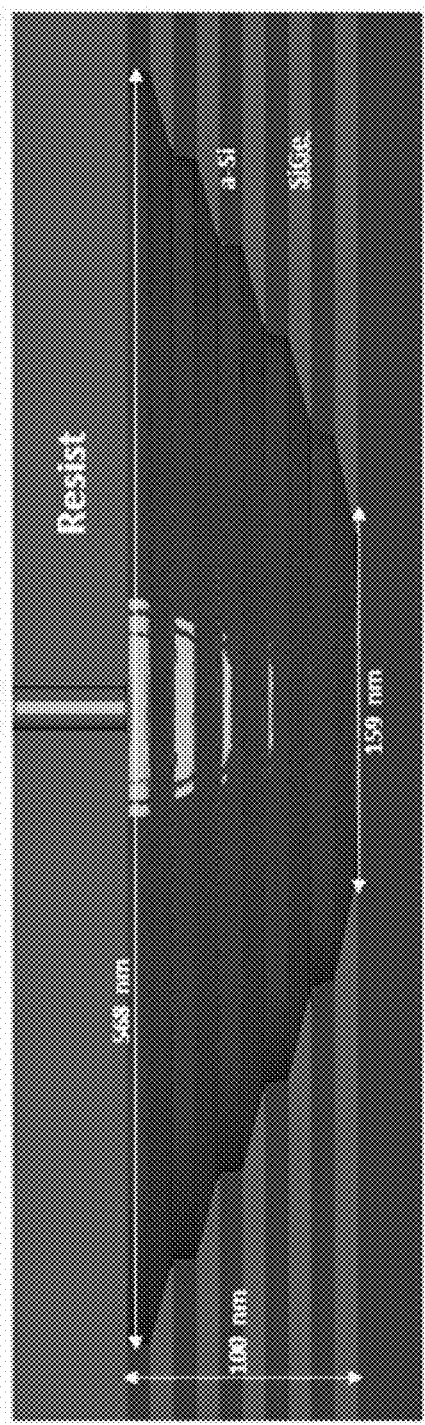
Figure 10N:
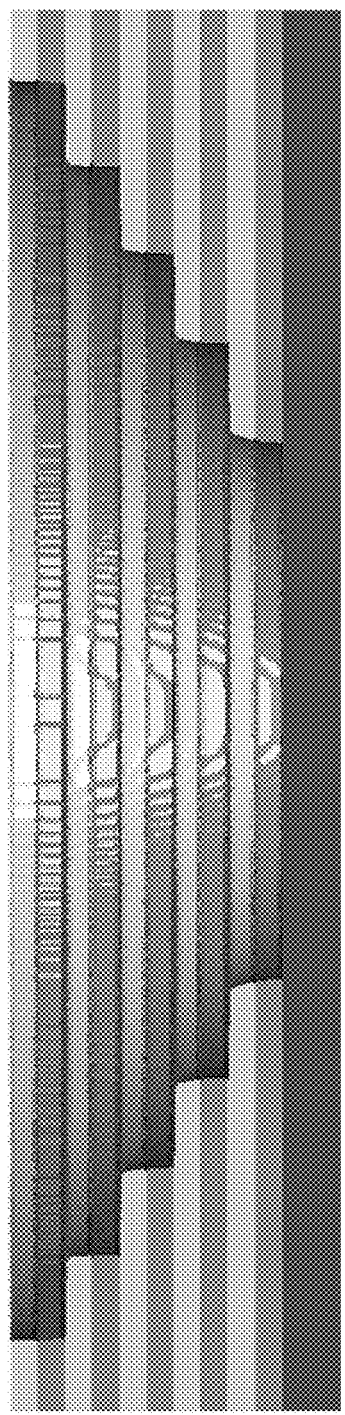

FIG. 10J illustrates the structure after selective etch of the channel material in the structure and replacing the channel layer with isolation material. This process could accordingly form the desired staircase for per layer connection using one lithography step and multiple etch steps. Thus, top layer 1002 becomes etched top layer 1003, and the various multilayer ridge of S/D layers 1004 become the etched version 1005. FIG. 10K-10N are process simulation charts illustrating such a stair-case formation process. FIG. 10K may be the starting point having a resist processed to form a lithographic defined hole for the center of the stair-case structure. Other lithographic shapes may be formed due to engineering and design considerations. Herein, the SiGe was assumed to be the channel layer and the Si was assumed to be S/D layer. FIG. 10L may be the first step of a multilayer etch using an isotropic etch having a SiGe:Si selectivity of 1:4. FIG. 10M illustrates the structure after the etch process has reached the base silicon going through five Si/SiGe layer pairs. The staircase is now formed. FIG. 10N illustrates the structure after removal of the photo resist and an optional cleaning etch with 100:1 SiGe:Si selectivity. The specific etch selectivity may be adjusted based on engineering and design considerations. Many variations of this concept could be considered by an artisan in semiconductor process including changing the etch process between these layers or even layer replacement techniques such as replacing the channel layers. Controlling the isotropic etch of the S/D strips in the ridge allows forming the desired staircase. Many options of materials which have different etch rates are well known in the art. An example for such could be found in a paper by Kirt R Williams et al, titled "Etch Rates for Micromachining Processing" published at JOURNAL OF MICROELECTROMECHANICAL SYSTEMS, VOL. 12, NO. 6, DECEMBER 2003 incorporated herein by reference. The staircase formation techniques presented in respect to FIG. 10A-10N could be adapted by an artisan in semiconductor processing to many of the 3D memory structures including structures that use multilayers of poly over oxide or tungsten over oxide.

FIG. 11A-FIG. 11D correspond to FIG. 35A-FIG. 35D of PCT/US patent application 16/52726. It is used to illustrates 3D system which includes 3D-NOR fabric 1130 over 'cut layer' 1113 over substrate 1110, and brought over from another substrate 1150 and cut layer 1143 periphery circuits 1154, and brought over additional processing logic 1156 enabling such as "Processing-in-Memory", or "co-processor in memory" or "function in memory". Such memory centric architecture may be useful compared to the conventional processor centric architecture for future machine learning, neural network, approximate computation and so forth. As discussed there many system options could leverage such 3D system 'Lego'. A generic memory array could be diced using predefined potential dice lines or etch defined dice line to fit specific overlay logic, the overlay logic itself could be broken to more than one stratum, and could include dedicated stratum for I/O, cut from another generic wafer. Additional 'Lego' options could be available from the 3D NOR fabric. One such option is segmenting and allocating the number of layers into the 3D NOR fabric and the amount of memory and programmable logic accordingly. FIG. 11D illustrates one type of 3D NOR fabric 1130 with control circuit 1154 and processing logic on top 1156. Alternatively another 3D system could be construct with similar "Lego" parts such as the processing logic 1156 with modified control circuit 1155 and a 3D NOR fabric with much fewer number of layers 1131. Another type of system variation using similar 'Lego' parts is to modify within the 3D NOR fabric where the thickness of the tunneling oxide is processed differently for sets of words line groups and accordingly creating variations with the memory type in the 3D system between retention time and access time. Another type of structure variation that could be applied is memory usage and the corresponding write and read techniques such as multilevel and mirror-bit tradeoffs between access time and density. Another type of modification that could be formed in the 3D system is the allocation of the fabric to memory versus to programmable logic. These variations could form completely different end 3D system with lower investment in new masks and higher leverage of the volume of generic product produced in the process line.

An additional inventive embodiment for such a 3D system as is illustrated in at least FIG. 11D, is to add additional layer as on top to provide an electro optics circuit which could allow use of light, such as, for example, fiber-optics or photonic components, to communicate with other systems and for other systems to communicate to the 3D system illustrated. Alternatively, the top layer of the 3D system may be image sensors, hyperspectral sensor, or time-of-flight sensor. Such a 3D system could comprise a memory fabric such as 3D NOR fabric 1130 which could be allocated as sub memory sections, some for high speed and some for high density, and a compute circuits within control circuit 1154 that could have many cores and control circuits designed for communications and control of the underling memory fabric (such as 3D NOR fabric 1130), and communication layer within processing logic 1156 that could be made with material optimized for those tasks, such as those optimized for RF. Such a 3D computer could be made to support very efficient programming as all its internal routing are far shorter compared with current Printed Circuit Board (PCB) technique of computer system integration or even the 2.5D/3D initiatives.

Such heterogeneous 3D integration allow the use of one type of fabrication facility for one of the strata, for example, a memory oriented fabrication facility to produce the memory array 1130, and very different facility for a different stratum, for example, such as a logic orientated fabrication facility producing the memory control circuit 1154, thus allowing an increased flexibility in the design of the overall system including use of much more advance fabrication lines for some of the stratum.

Use of the alignment technique we call 'Smart Alignment' allows connection between the upper strata and the lower strata with vias (Through Layer Via—TLV) that are as small as the thickness of the layer and the process capabilities allow. Such is useful for connecting memory control circuits in one stratum to memory control lines such as bit-lines and word-lines on the other stratum.

FIG. 11F illustrates the "smart Alignment' technique. The target wafer 1164, such as illustrated in FIG. 11B, could have its alignment mark 1162 and a connection strip target 1160 along direction 'X' 1190, having a length longer than the worst-case misalignment in 'X' direction of the wafer bonding (and subsequent release, planarization, and cleaning process). The transferred layer or wafer 1170, such as for example control circuit 1154 illustrated in FIG. 11A-11C, may have its own transferred layer alignment mark 1166. The intersection between the horizontal connection strip target 1160 and the designated upper stratum vertical connection strip 1172, which could be aligned to the transferred layer alignment mark 1166, is now known and will be processed to be locating the $TLV_{21}$ 1168. The processed vertical connection strip 1172 length should be designed to be longer than the worst-case misalignment in 'Y' direction of the wafer bonding. Accordingly, the via 1168 could be aligned, to target wafer alignment mark 1162 in the Y direction and to the transferred layer alignment mark 1166 in the X direction. Once the via layers are formed an upper layer metal mask aligned to the upper layer alignment mark 1166 could be used to form connection between the transferred upper stratum and the target stratum underneath. FIG. 11G illustrates connecting the upper stratum strips 1178 to memory control lines 1176 in the target wafer using the 'smart alignment' technique individually connecting to each control lines even for bonding misalignment which far exceed the memory control lines pitch.

Yet the target wafer 1164 in most cases of memory array would have at least two set of control lines one in X direction and one in Y direction. To allow effective connectivity the 'Smart Alignment' technique could be enhanced to have two sets of TLV. One $TLV_{21}$ aligned to target wafer's alignment mark 1162 in Y direction and to the transferred layer's alignment mark 1166 in X direction. And the other $TLV_{12}$ aligned to target wafer's alignment mark 1162 in X direction and to the transferred layer's alignment mark 1166 in Y direction. This may require two step of lithography. FIG. 11H illustrates such two connection sets. Bit-lines in X direction 1180 connected to upper stratum by strips in Y direction 1182 while word-lines in Y direction 1184 connected to upper stratum by strips in X direction 1186.

An additional inventive embodiment relates to monolithic 3D by layer transfer whereby a unique structure may be formed by replacing silicon with high quality oxide prior to the layer transfer at the time that high temperatures processes are acceptable. For example, the silicon in the zone 1179 that is being designated for TLVs may be etched and filled in with high quality oxide (or a lower quality oxide deposition followed by a high temperature anneal) that would have leakage current of less than one picoamp per micron at a device power supply voltage of 1.5 and at a measurement temperature of 25° C. Thus, as well, the TLVs would not require any insulative lining to pass thru the TLV transiting layer, which could be islands/mesas of silicon in a sea of oxide, or vice versa.

An alternative to, two lithography steps with two via masks, could be the smart use of direct write eBeam in which the eBeam alignment could be managed to provide proper placement for the $TLV_{12}$ and $TLV_{21}$.

In some applications, it could be desired to transfer stratum including interconnection performing what could be called parallel integration instead of sequential integration. Bonding layer or die in such case could utilize hybrid bonding forming bonding and direct metal to metal connection in the process. In general, such hybrid bonding utilizes connection pads that are large enough to accommodate the bonding misalignment which in advanced bonder is approaching 100 nm worst case misalignment Yet some memory stratum might use control line pitches which could not accommodate the bonder misalignment. An alternative for such cases could be use of bonding oxide that could be made to conduct by electrical signal, using what is known as One Time Programmable—"OTP" or Resistive RAM technologies. In such case one stratum could have some control signal and power signal connected using the hybrid bonding while the memory control lines could be connected by programming.

Figure 11J:
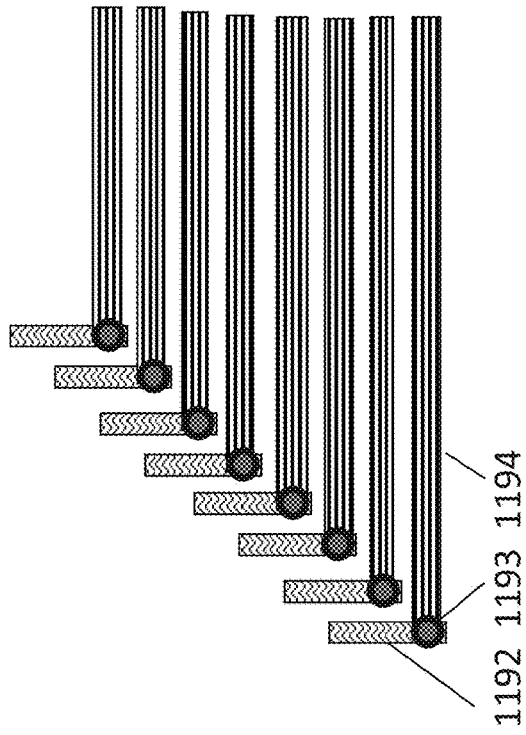
Figure 11I:
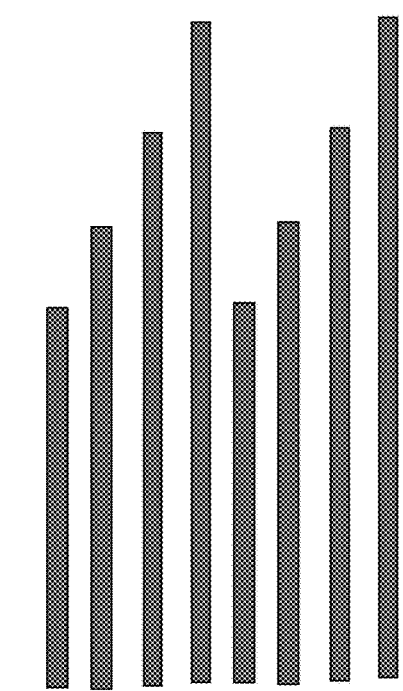
Figure 11K:
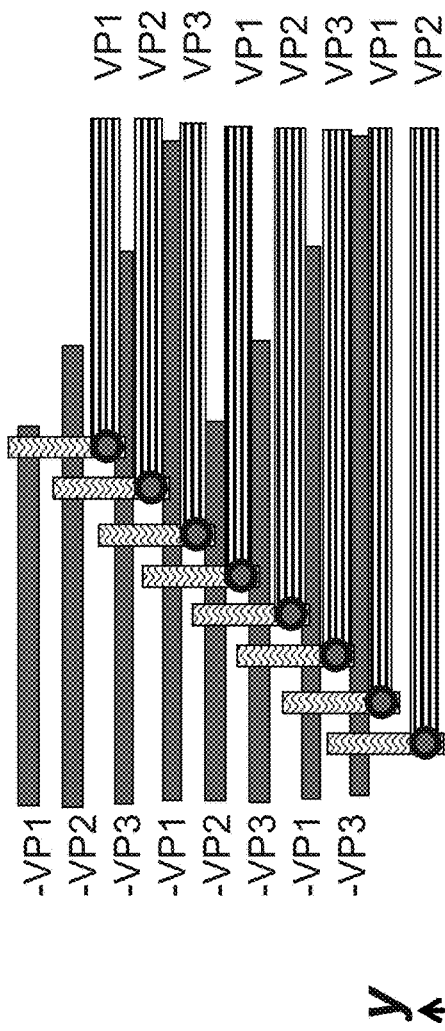

FIG. 11I illustrates a section of memory control lines in one stratum. FIG. 11J illustrates connection segment on the other stratum. For the case in which the memory stratum is the one under the connection structure of FIG. 11J includes connection strips in Y direction 1192 that are formed long enough to cover the bonding misalignment in Y direction, connected by via 1193 to the X direction connection wires 1194 on the upper layer. FIG. 11K illustrates these connection structures after the bonding. For misalignment of less than three memory control lines pitch, three independently controlled programming signal VP1, VP2, VP3 could be used to form the connection between the memory stratum and the logic stratum. These could be provided using properly arranged and connected diodes. Other arrangements could be designed and engineered.

Figure 12D:
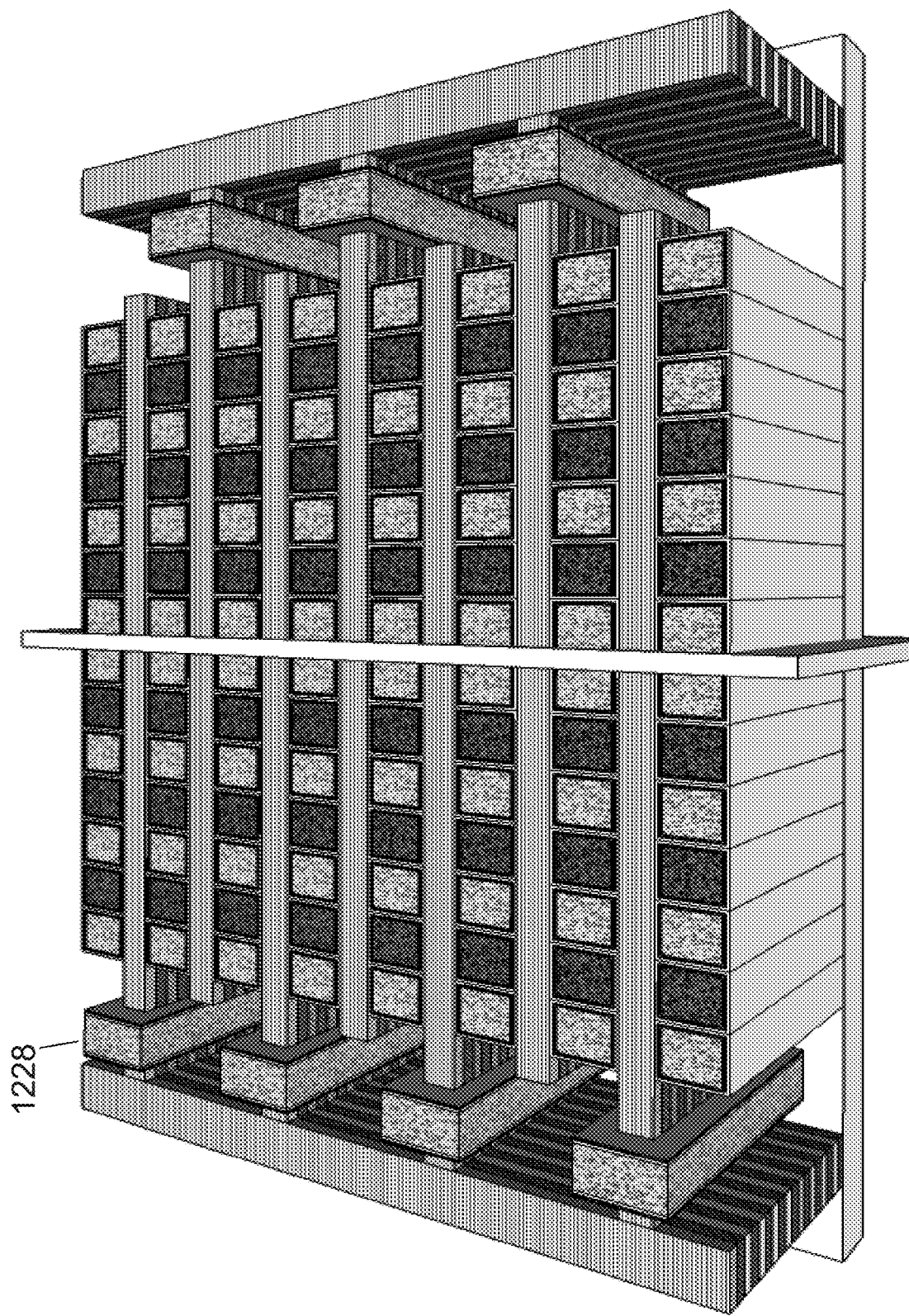
Figure 12E:
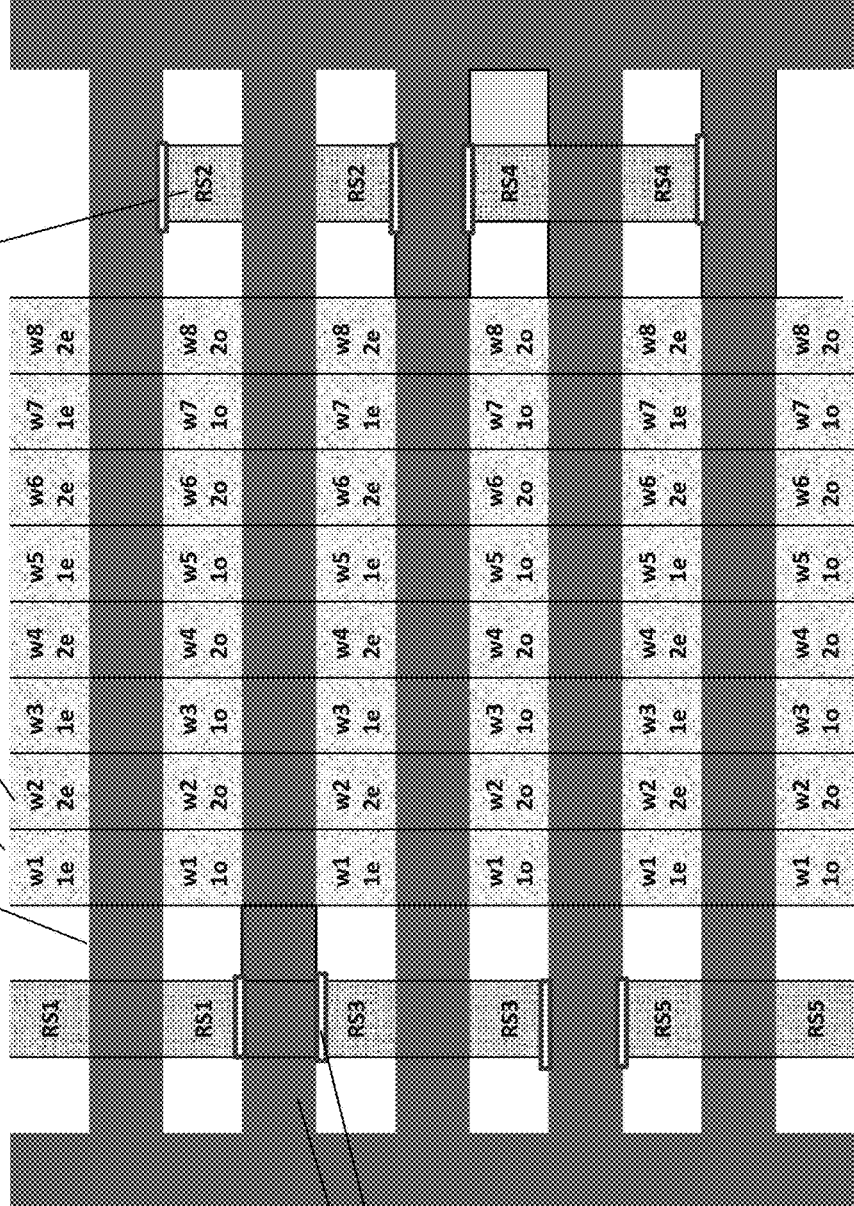

FIG. 12A and FIG. 12B correspond to FIG. 13E and FIG. 14D of PCT/US patent application 16/52726. FIG. 12A illustrates an optional alternating allocation of ridge select transistors 1202, 1203 formed in series of the S/D lines on both ridge ends. The ridge select transistor 1202, 1203 can allow selectively the specific S/D lines. FIG. 12B illustrates the 'Y' direction per S/D layer staircase structure 1204. FIG. 12C illustrates X-Y cut (top view) of such alternating ridge select 1213 (RS1, RS3, RS5), 1222 (RS2, RS4) with 'Y' oriented common staircase access on both sides 1214, 1224. The ridge such as 1216 may be associated with multiple word line controls (w1, w2, . . . ) which could be consider first gates w-1, and second gates w-2 and controlling channel from both sides of the ridge, odd side w-1o, w-2o, and even side w-1e, w-2e. FIG. 12D illustrates similar structure with a perspective 3D illustration of FIG. 12C except that the select transistors are staggered on left and right end of ridges. Such arrangement of staggered select gates on left and right end of ridges allows sufficient space for the per ridge select gate (without affecting the adjacent ridge). FIG. 12E illustrates a variation on FIG. 12C in which the side of ridge with no ridge select 1217 is directly connected to the respective 'Y' direction staircase structure 1214, yet isolated from the ridge select of its adjacent ridge 1233. The isolation layer 1233 may be a relatively thick oxide in order to minimize electrostatic coupling from the gate and the ridge across the isolation layer 1233. So, the select gate would only control a ridge on its relatively thin oxide side. Such arrangement of select gate enables equivalent function of FIG. 12C. The variation of FIG. 12E would allow access to each cell from both ridge ends, as there are both still connected to the respective staircase access 1214, 1224.

Figure 12H:
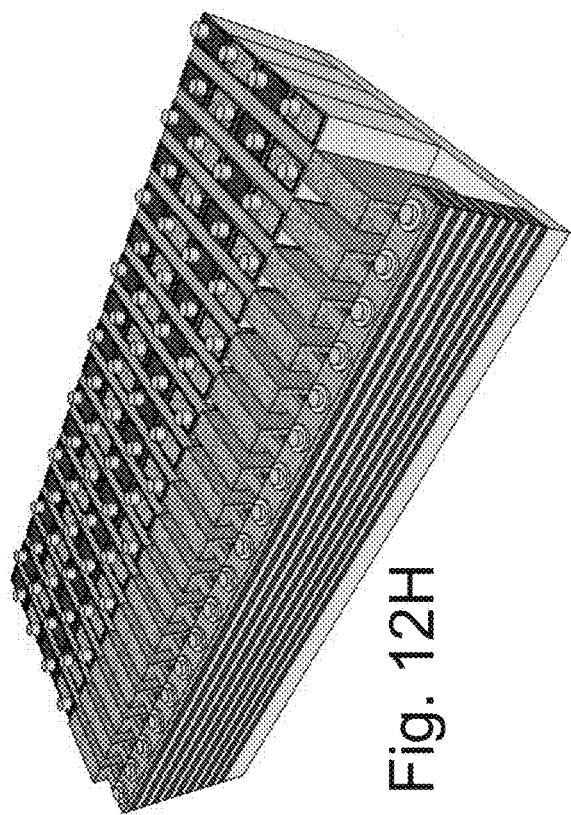
Figure 12J:
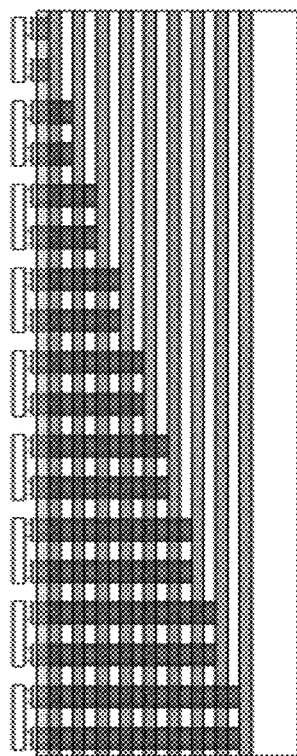
Figure 12G:
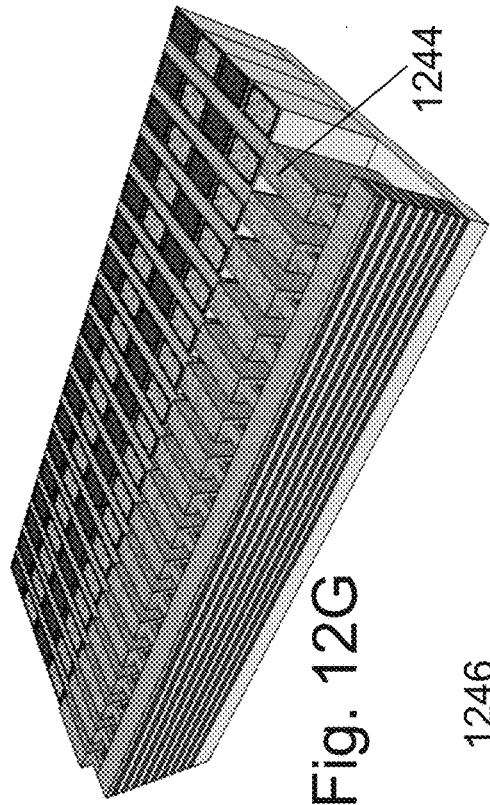
Figure 12I:
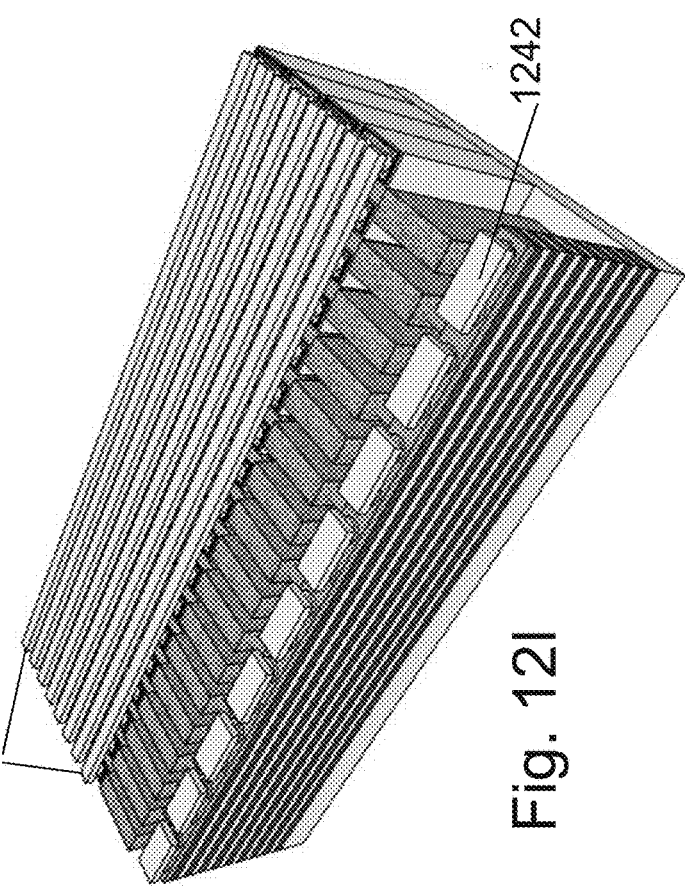

In consideration of the 'smart alignment' as was previously discussed in respect to FIG. 11H, the 3D NOR fabric as is illustrated in FIG. 12B could be modified to allow easier connection to upper stratum accommodating bonding misalignment in X and Y direction. FIG. 12F illustrates such accommodation in modifying the structure of FIG. 12E. Two global wordlines (WL) are assigned for one local WL pitch; one for the odd side and another for the even side of a single ridge. The global word-lines WL1 1236 and WL2 1238 are oriented in the Y direction and correspond to Y direction word lines 1184. Alternatively, no global WL is used but each vertical local WL may be directly accessed by a 3D stacked peripheral circuit on its top. The ridge select transistor 1228 could be modified as illustrated in FIG. 12F to be extended in the X direction 1234 to accommodate X direction misalignment. Thus the ridge select transistor 1228 may be a long channel transistor, which improves the leakage behavior for an unselected ridge. The per level via 1205 of FIG. 12B could be extended in the Y direction 1232 to accommodate Y direction misalignment FIG. 12G is a 3D perspective illustration with extended gate length ridge select transistor 1244 corresponding to 1234. FIG. 12H illustrates the addition of connection vias, and FIG. 12I illustrates adding the word lines 1246 and the extended per S/D layer connections 1242. FIG. 12J illustrates side view of the extended per S/D layer connection. Precise wafer bonders available in the industry are proven and capable of bonding misalignments of less than 100 nm. Accordingly the structures to support such a bonder could be made with connection pad of about 100 nm which could be used for ridge select pad 1234 to be about 100 nm in the X direction and the per layer pad 1232 to be about 100 nm in the Y direction.

Placing the staircase along the Y direction vertically aligned to the ridge direction reduces the area overhead associated with per layer access. When combined with the 3D integration of memory control circuits transferred and added on top and/or under the memory matrix, this supports an array built from many micro-arrays each with its own memory control circuits. Such a micro array or unit could have X direction and/or Y direction size of few tens of microns, or few hundreds of microns. This arrangement reduces the capacitance and resistance of the memory control lines thus allowing lower power and higher speeds for the memory device.

Additional variation for the 3D NOR fabric is to use SiGe with 5% Ge content for the S/D layers and SiGe with 20% or higher content for the channel layers to achieve higher growth rate for the epitaxial growth of the multilayer structure which could be used for cost reduction or alternatively reduce epitaxial process temperature with lower effect on the growth rate.

Additional alternative for the 3D NOR fabric is to utilize charge trapping also as a variable memory function for brain type functionality in a similar fashion to what have been proposed in PCT/US2016/052726 for the RAM part of the fabric.

FIG. 18 of PCT/US patent application 16/52726, presents a programming table for the 3D NOR memory. It utilizes what is called Hot-Electron injection. FIG. 13 of that same application depicts table for Flash memory programming. It presents Fowler-Nordheim tunneling ("FN") which is a common flash programming and erasing technique and could allow lower energy per bit writing and erasing. Use of FN programming for NOR type flash memory is presented in a paper by Masayoshi Ohkawa et al titled "A 98 mm$^2$ Die Size 3.3-V 64-Mb Flash Memory with FN-NOR Type Four-Level Cell" published at IEEE JOURNAL OF SOLID-STATE CIRCUITS, VOL. 31, NO. 11, NOVEMBER 1996, incorporated herein by reference. The use of FN tunneling as a programming mechanism may save write energy when compared to the less efficient hot-carrier programming. The FN tunneling can be bit-specifically conducted for the presented 3D-NOR architecture. In an unselected ridge, the ridge-select gates are turned off so that the S/D lines become floating so to inhibit writing (programming) of those ridge memory cells. In a selected ridge, the ridge-select gates are turned on so that the S/D voltages for writing or reading can be applied through it. For the selected cell in the selected ridge, a high enough programming voltage is applied to the selected wordline and a pair of S/Ds could be connected to a lower voltage, such as grounded, so that there is sufficient electric field across the selected S/D line and the selected wordline to effect charge transfer into the charge trap layer or into the floating gate. For the unselected cell in the selected ridge, a disabling high enough positive voltage could be applied to all unselected S/D lines to reduce the electric field across the unselected memory cells, and thus minimize program disturb. Note, under typical FN voltages wherein the WL voltage for writing is assumed to be 20V, the inhibit voltage for the non-selected cell S/D could be ~10V. The half-selected cells are those cells that are sharing one of the selected S/D lines and thus may suffer from disturb. The S/D lines could be designed to withstand such voltage differential to avoid source-to-drain breakdown or punch-through from selected S/D line to the adjacent unselected S/D line Alternatively, the method is suitable for lower PGM (programming) voltages (assuming ~5V), possibly adequate for thinner O/N/O. Mirror bit techniques might not be useable with FN tunneling or direct tunneling programming and some other disadvantages could be associated with such FN or direct tunneling programming.

Despite the term "FN tunneling" solely appearing throughout here, it should be understood that it is not intended to differentiate FN tunneling from direct tunneling, rather there is also contribution due to direct tunneling as well as FN tunneling. Unless otherwise specified, the sole use of "FN tunneling" herein contains the meaning of direct tunneling.

FIG. 13A illustrates a small section of the 3D NOR structure which could assist in presenting alternative writing and erasing schemes of memory cells within the 3D NOR memory. Illustrating two columns, each with its local word-line, WL1 1304, WL2 1306, with 8 S/D lines 1311-1318, and Ridge Select gate 1302.

The entire ridge could be Fowler-Nordheim ("FN") erased by selecting the ridge and either by grounding all S/D lines and channel while powering all the word-lines with negative erase voltage −Ve, or by positively biasing the channel while grounding all S/D lines and WL's. Optionally, positively biasing S/D lines and grounding WL and Channel lines can be carried out as well. As discussed herein before, specific voltages could be set for specific structures. For example, −5 volts could be used for FN erase for −Ve, and +5 volts for Ve. For use of the channel access for any programming or erasing explained, the body contact structure needs to be disposed, which will be explained later herein.

Alternatively, the entire ridge could be hot-hole erased, by selecting the ridge and grounding one S/D line from S/D pair and positively biasing the other S/D line while powering substantially all the wordlines with a negative erase voltage and optionally grounding substantially all channel lines. In this case, the hot-hole erase favorably occurs near the positive biased S/D region. Therefore, such hot-hole erase may be used to one-side ridge erase in a mirror-bit memory system. In order to completely erase both the source side and the drain side storage nodes using hot carriers, the erase may be accomplished by two steps; one-side erasing followed by opposite-side erasing by swapping grounded S/D line and positively based S/D line.

A specific column within the ridge could be FN or direct tunneling erased by having all the other word-lines at the same voltage as the S/D lines while the selected column word-line would be at negative differential Ve. For example, such as grounding all the S/D lines (and channel 'body' if such is used in the structure) and all the non-selected word-lines and driving the selected column word-line with an erase voltage such as −5 volt in some specific structures.

FIG. 13B illustrates FN erase condition for one cell 1320. That cell word-line could be set to −5*v* while the other column word-lines are kept at ground. The S/D line and channel 'body' of the selected cell could be grounded while all other S/D and channel lines are left floating. In such FN single cell erase the adjacent cells (the half selected cell) with the column 1322 might be disturbed and partially erased. All the other cells 1324 should be unaffected. The partially erased cell could be refreshed to their original state by per cell write steps. Alternatively, the use module could be utilized only unaffected cells such as using only the odd level cells. This would reduce the memory density while simplifying the operation of FN per cell erase.

The inverse of FN erase could be used for FN write (programming) so instead of negative differential using a positive differential such as +5 v instead of −5 v of FIG. 13B. Accordingly the above discussion would apply to FN writing.

Many variations known for Flash memories could be applied and adapted to the 3D NOR fabric. Such could be reversing the gate stack order by having the tunneling oxide between the gate and the charge trap layer. Such could be used for FN write and erase from the word-line to the charge trap or the floating gate. Other variations could be engineered by memory artisan using the techniques known in the flash memory art.

In general FN is known to be few orders of magnitude more efficient in power then hot electron techniques, and accordingly preferred for many applications. Yet, the additional benefit of using Schottky Barrier techniques is its highly efficient hot electron programming, which could be effective enough for many of these applications. Additionally the use of SiGe for the channel with N+ silicon for the S/D, could provide an additional enhancement to secondary hot electron injection as presented in a paper by Kencke, D. L., et al. "Enhanced secondary electron injection in novel SiGe flash memory devices," Electron Devices Meeting, 2000. IEDM'00. Technical Digest. International. IEEE, 2000. This mechanism combines both the secondary electron injection with the smaller bandgap to generate higher impact ionization rates and subsequent electron injection probability. The proposed mechanisms may significantly reduce maximum voltages required for the program operation applied to WL, S/D and channel lines.

The 3D memory structures shown in FIGS. 13C and 13D may include floating-body devices, so the body potential may be strongly capacitively coupled with the S/D line voltage. So, it is assumed that when both S/D line voltages are positively raised up, the body potential is also raised up accordingly. As a result, no sharp energy band bending near P-N junction is made to cause the band-to-band tunneling. It is assumed that the minimum voltage for FN tunneling erasing across the gate and the S/D line was −5V as shown in FIG. 13B. Therefore, the voltage difference of −4 V across the gate and the S/D lines shown in FIG. 13C and FIG. 13D most likely will not cause the FN tunneling erasing. However, the techniques illustrated in FIGS. 13C and 13D are intended for hot-hole injection caused by a potential gradient induced by asymmetric voltage for one grounded S/D line and another partially positively biased S/D line along with a partially negatively biased gate.

FIG. 13C illustrates Gate Induce Drain Leakage ("GIDL") erase for one cell 1330 within a selected ridge 1332 wherein channel lines are floating. The selected cell 1330 Source line 1352 could be grounded (0 volt), its Drain line 1353 could be powered with positive voltage such as 2 v, and its word-line 1334 is connected to negative erase voltage such as −2 v. The differential voltage between the positive Drain line and the negative word-line (−4 v) should be below the voltage inducing FN erase. The specific voltage could be set for specific device as previous discussed. The non-selected word lines 1336 could be grounded in order to disable GIDL current. The S/D lines above the selected cell 1351 could be grounded and the S/D lines below the selected cell 1354-1358 could be powered to positive 2v. The non-selected cells 1344 could therefore see their Source and Drain at same potential and accordingly no current is induced to the channel and accordingly non creation of hot-holes. And having the voltage difference across a gate and S/D line below the threshold level of FN tunneling should keep the trap charge with no change. In the selected cell the differential voltage between its Source and Drain could induce leakage under the negative gate bias, such leakage could form hot-holes, and the negative field of the word-line 1334 will pull these holes into the charge trap (or floating gate) layer to erase its stored electrons charge.

Using positive voltage (+2 v) for the selected word-line 1334 of FIG. 13C could allow writing in the charge trap (or floating gate) layer of the selected cell 1330. Having a positive gate would actually open the selected cell transistor strongly increasing the transistor current and accordingly the formation of Hot-Electron to be pulled in by the positive word-line voltage. Using the up side flip similar to FIG. 13D could change the location of trap charge. Note, the above mentioned voltages are extremely small for typical NVM device and may be obtained if extremely thin ONO thickness is selected, such as bottom-oxide of 1 nm, nitride thickness of 2 nm and top-oxide such as 2 nm. Further, for CHE programming the drain to source voltage must be typically larger than ~3V. Other mechanisms such as SB injection may require lower drain voltage (absolute value), such as −2V.

An alternative writing and erasing could be performed by having the non-selected S/D lines floating. In order to use such a scheme, the floating body 3D structure is preferred as the body region can be also floated according to the floated S/D.

As stated the specific voltages for write erase of selected cell and not affecting of non-selected cells could be tuned for specific devices. These tuning could include the presented write and erase techniques and variations of those as known in the flash memory art including mixing techniques such as FN and Hot-Electron/Hot-Holes. Many variations are known in the art and could be adapted for the 3D NOR memory. Such as those presented in U.S. Pat. Nos. 7,113,431, 7,220,634, 7,590,005, 8,183,616 and applications 2006/0125121, 2009/0086548, 2011/0095353 and 2012/0231613, incorporated herein by reference. And papers such as by Lei SUN et al. titled "Characteristics of Band-to-Band Tunneling Hot Hole Injection for Erasing Operation in Charge-Trapping Memory" published at Japanese Journal of Applied Physics Vol. 45, No. 4B, 2006, pp. 3179-3184, by Alvaro Padilla et al titled "Enhanced Endurance of Dual-bit SONOS NVM Cells using the GIDL Read Method" published at 2008 Symposium on VLSI Technology, by Kyoung-Rok Han et al titled "5-bit/cell Characteristics using mixed program/erase mechanism in recessed channel non-volatile memory cells" published at Current Applied Physics 10 (2010) e2-e4, by LIU LiFang et al, titled "A 1G-cell floating-gate NOR flash memory in 65 nm technology with 100 ns random access time" published at SCIENCE CHINA, Information Sciences April 2015, Vol. 58, by Yu Wang et al titled "A 65-nm 1-Gb NOR floating-gate flash memory with less than 50-ns access time" published at Chin. Sci. Bull. (2014) 59(29-30):3935-3942, by Ken Uchida et al titled "Enhancement of hot-electron generation rate in Schottky source metal-oxide-semiconductor field-effect transistors" published at Applied Physics Letters 76, 3992 (2000); by Kyeong-Rok Kim titled "Design of NOR flash memory cells, with high speed programming by utilizing an asymmetric Silicide(TiSi2) Drain" published at ICASIC07, by E. J. Prinz et al titled "90 nm SONOS Flash EEPROM Utilizing Hot Electron Injection Programming and 2-Sided Hot Hole Injection Erase" published at NVM Workshop 2003, by Li-Jung Liu et al titled "Performance enhancement in p-channel charge-trapping flash memory devices with Si/Ge super-lattice channel and band-to-band tunneling induced hot-electron injection" published at Thin Solid Films 533 (2013) 1-4, by Choi, Sung-Jin, et al. "A novel TFT with a laterally engineered bandgap for of 3D logic and flash memory," published at VLSI Technology (VLSIT), 2010 Symposium, IEEE, 2010, and by Yu-Hsien Lin et al, titled "Band-to-Band Hot Hole Erase Mechanism of p-Channel Junctionless Silicon Nanowire Nonvolatile Memory" published at IEEE TRANSACTIONS ON NANOTECHNOLOGY, VOL. 15, NO. 1, JANUARY 2016, all incorporated herein by reference.

The silicidation process suggested in PCT/US patent application 16/52726 and U.S. application Ser. No. 15/333,138 could be done by known technique in the art. These could include two annealing steps. First to form the metal penetration into the silicon followed, then removal of the excess metal by dry or wet etch, followed by second anneal to activate the silicide metal. These processes could include microwave annealing which was demonstrated to allow reduced temperature. Such process has been presented in papers such as by Xiangbiao Zhou et al titled "Schottky Barrier Height Tuning via Nickel Silicide as Diffusion Source Dopant Segregation Scheme with Microwave Annealing" published at 15th International Workshop on Junction Technology (IWJT), by Shih, Tzu-Lang, and Wen-Hsi Lee. "High Dopant Activation and Diffusion Suppression of Phosphorus in Ge Crystal with High-Temperature Implantation By Two-Step Microwave Annealing" ECS Transactions 72.4 (2016): 219-225, by Chun-Hsing Shih et al titled "Metallic Schottky barrier source/drain nanowire transistors using low temperature microwave annealed nickel, ytterbium, and titanium silicidation" published at MSSP 16, by Sounak K. Ray et al titled "Enhanced charge storage characteristics of nickel nanocrystals embedded flash memory structures" published at Journal of Experimental Nanoscience, 2013 Vol. 8, No. 3, 389-395, by Chaochao Fu et al titled "Schottky Barrier Height Tuning via the Dopant Segregation Technique through Low-Temperature Microwave Annealing" published at Materials 2016, 9, by Jian Deng et al titled "A modified scheme to tune the Schottky Barrier Height of NiSi by means of dopant segregation technique" published at Vacuum 99 (2014) 225e227, by Y.-J. Lee et al. titled "Record-Thin 10.5 nm Ni Silicide Film for 2012-2021 by Two-step Low Temperature Microwave Anneal" published at IEDM 11; Y.-J. Lee et al. titled "Full Low Temperature Microwave Processed Ge CMOS Achieving Diffusion-Less Junction and Ultrathin 7.5 nm Ni Mono-Germanide" published at IEDM 12; by Y.-J. Lee titled "A Novel Junctionless FinFET Structure with Sub-5 nm Shell Doping Profile by Molecular Monolayer Doping and Microwave Annealing" published at IEDM 14; by Y.-J. Lee et al. titled "Low-Temperature Microwave Annealing Processes for Future IC Fabrication—A Review" published in IEEE TRANSACTIONS ON ELECTRON DEVICES, VOL. 61, NO. 3, MARCH 2014; by T. Yamaguchi et al. titled "Low-Resistive and Homogenous NiPt-Silicide Formation using Ultra-Low Temperature Annealing with Microwave System for 22 nm-node CMOS and beyond," published at IEDM 2010; by Ming-Kun Huang et al. titled "Dopant segregated Schottky barrier nanowire transistors using low-temperature microwave annealed ytterbium silicide" published in Japanese Journal of Applied Physics 53; and by Ming-Kun Huang et al., titled "Dopant segregated Schottky barrier nanowire transistors using low-temperature microwave annealed ytterbium silicide" published in Japanese Journal of Applied Physics 53, 116501 (2014), all of the forgoing are incorporated herein by reference. Equipment for Microwave Annealing has been offered by DSG technologies of California. An additional advantage for use of Microwave Annealing and ALD is the compatibility of these processes with 3D structures. For example, the laser annealing might deliver non-uniform energy along the depth of the multiple stacks of semiconductor layers, which may result in non-uniformity. Microwaves could be designed to penetrate inside the semiconductor so that the annealing result may be uniform across the multiple stacks of semiconductor layers. In addition, the metal ALD may further enhance the metal silicidation, as the metal ALD can enable a deposit of a precise amount of metal to be used for the silicidation. Consequently, no residual metal unreacted with the silicon may left and thereby no subsequent residual metal removal may be necessary. In some embodiments, the exact amount of the layered metal may be fully consumed during the silicidation process, which could save the subsequent removal process of non-reacted metal. Such could be also effective for additional applications such as FinFET and nano-wires providing additional advantage to reduce Schottky Barrier variations.

Figure 14A:
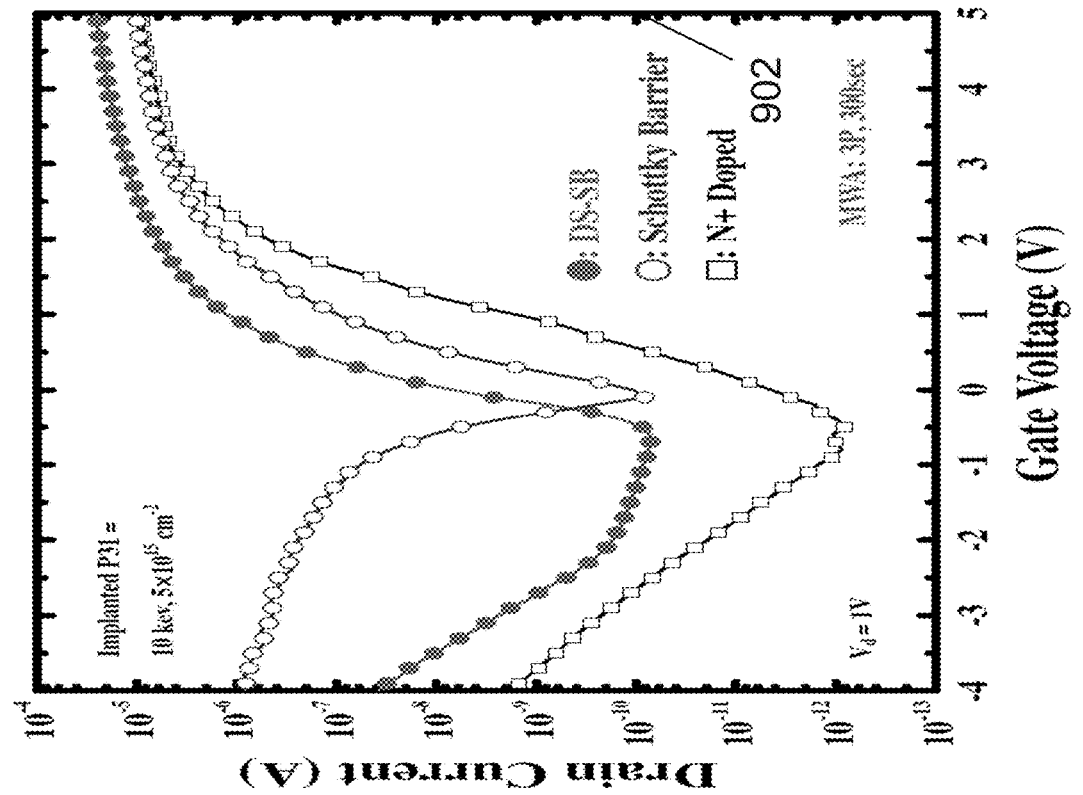
FIG. 14A is an example illustration of I(V) curves of a silicided nanowire formed with microwave annealing technology.

FIG. 14A presents a drain current versus gate voltage (Id-Vg) curve taken from FIG. 8 of the paper by Ming-Kun Huanget et al. It illustrates the advantage of microwave annealing of a silicided nano-wire transistor. The chart illustrates the advantage of Dopant Segregation for Schottky Barrier in respect to reducing ambipolarity without sacrificing the drive current. Yet in some alternatives a 3D NOR memory structure could be made with transistors having some level of ambipolarity. In such cases the sense amplifier could be made to support improved memory function. Assuming that the chart related to Schottky Barrier 1402 represent the memory cell of such 3D NOR. Assuming that the VT shift effected for '0' state is 1 v while '1' state is as plotted in FIG. 14A. The sense amplifier for read circuit could be made to senses the differential drain current for gate voltage of 2 v and 0 v. For state '1' such differential current could be about $10^{-6}$ A, while for state '0' the differential current could be about $10^{-7}$-$8*10^{-8}$~$2*10^{-8}$ A. Accordingly such differential sense amplifier could enable range of memory transistors to effectively function.

FIG. 14B is an Id-Vg curve taken from FIG. 11. (b) of a paper by Liu, Yongxun, et al., "Comparative Study of Charge Trapping Type SOI-FinFET Flash Memories with Different Blocking Layer Materials," Journal of Low Power Electronics and Applications 4.2 (2014): 153-167, incorporated herein by reference. It illustrates that in some memory applications a self-reference differential sense amplifier could be an effective technology for sensing the memory information. For example, if the Id differential read is determined by two step gate biasing between $Vg_2$=4 v and $Vg_1$=0.5 v, then in the erase state the differential Id is relatively large compared to the programmed state. Accordingly such self-reference differential sense amplifier could be a useful memory sensing technique for memory structure presented herein and elsewhere. Setting the gate voltages for such detection technology could be so the memory transistor threshold voltage (Vt) is in the voltages range (Vg1<Vt<Vg2) for one memory state and out of it (Vg1>Vt or Vt>Vg2) for the other. Such self-reference differential sensing could be effective in reducing the effect of absolute Id current value that is not related to the change in that cell wordline voltage.

An additional inventive embodiment is to reduce the ambipolarity effect by using a relatively reduced drain to source voltage ($V_{DS}$) such as 0.5-1 V during the read operation (for example, as compared to state of the art Mirror-bit technology of 1.4-1.6 V). Lowering drain voltage can suppress the band-to-band tunneling leakage causing ambipolarity. Thus, effectively reducing the ambipolar current of the unselected bitline cell during the reading of the selected wordline cell. The reduced $V_{DS}$ may still distinguish between two physical bits per cell such as mirror bit scheme in reverse and forward read operations when a small Vt shift between the programmed and the erased states such as about 1 volt may be implemented and as a narrow charge distribution is obtained using SB or DSSB injection compared to Channel Hot Electron injection in doped np junction. Furthermore, the reduced $V_{DS}$ improves immunity to read disturb and extends the retention time and endurance of the memory transistor.

Figures 15C, 15D:
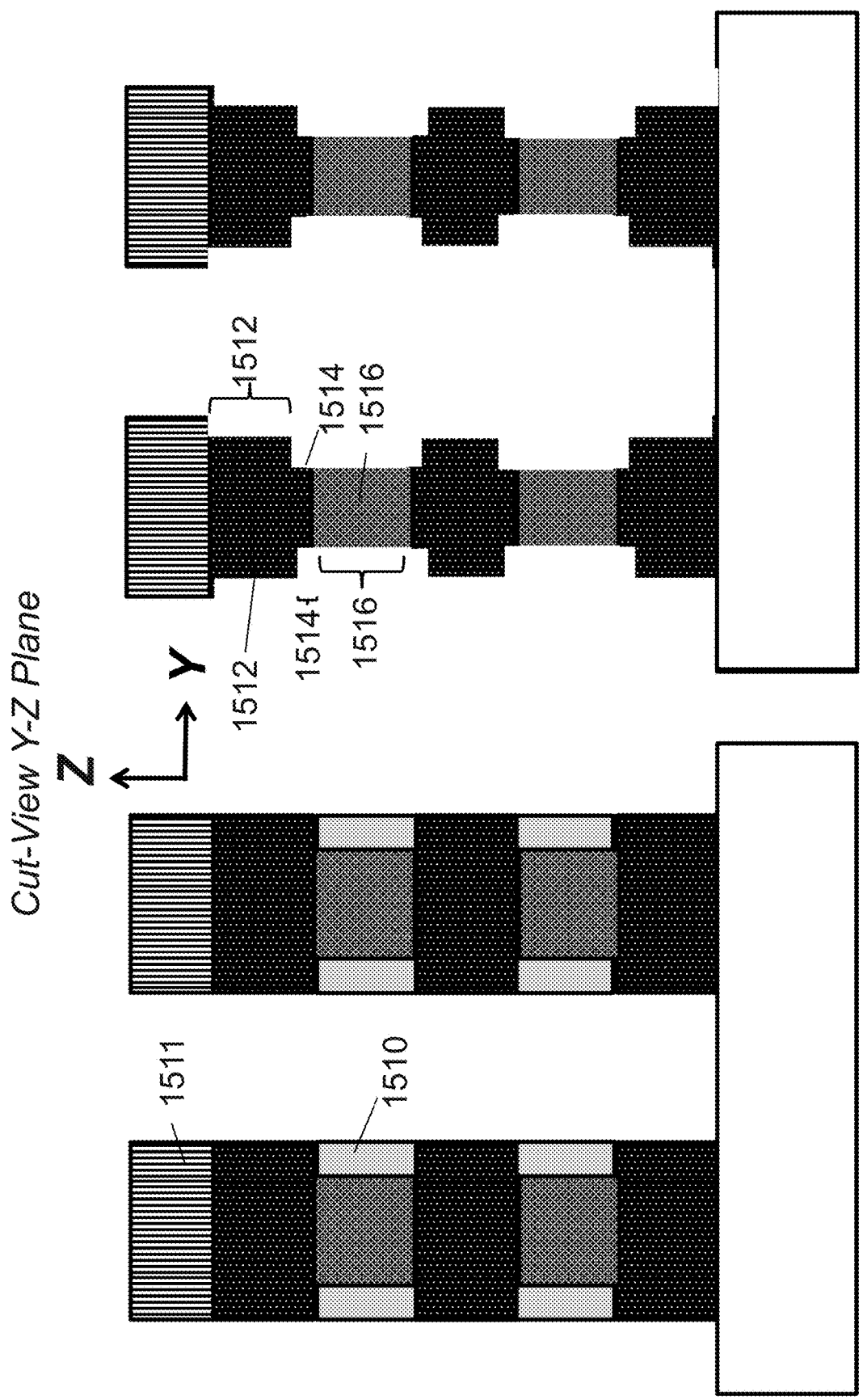

The Dopant Segregation Schottky Barrier ("DS-SB") formation process suggested in PCT/US patent application 16/52726 in respect to at least FIGS. 8E and 41E, could be modified to allow broader device control. FIG. 15A illustrates a Y-Z cut-view of two level 3D NOR memory (resembling FIG. 2 of 16/52726). On top of a section of a carrier wafer 1500, illustrated are side view of two ridges, having two layer of memory having channels 1502, 1504 each between two S/D regions 1501, 1503 and 1506. A hard mask portion on top 1508 that could have been used for the etch mask forming these ridges. The S/D regions 1501, 1503 and 1506 could be made of N+ doped silicon and the channel 1502, 1504 could be made with P doped SiGe, or many other variations including replacing the NPN with PNP SiGe with Silicon etc. For the following process alternatives, the materials of the channel 1502, 1504 could be selectively or non-selectively isotropic etched in respect to the S/D 1501, 1503, 1506 in order to create selective indentation. FIG. 15B illustrates the structure after a selective isotropic etch of the channel regions 1505. For the case in which the S/D is N+ silicon and the channels are P type SiGe the selectivity could be applied to about 100:1 as is illustrated in FIG. 1. FIG. 15C illustrates the structure after deposition of protective isolation 1510 such as silicon dioxide followed by directional etch using the hard mask 1511 to remove protective isolation on S/D side walls while leaving the protective isolation 1510 only at the region of the etched away SiGe. The structure is now ready for the extra S/D diffusion doping and S/D silicidation. The protective isolation could be later replaced with O/N/O (Tunneling Oxide/trapping Nitride/isolation Oxide) or be already design to be used as at least part of the O/N/O structure. In this step, the process temperature may be determined with consideration that doesn't substantially impact on the silicide and avoid junction spike.

Adding the metallic material for the silicidation could be done by known in the art deposition techniques, for example, such as ALD. Examples may be found in a paper by Hyungjun Kim, titled "Atomic layer deposition of transition metals for silicide contact formation: Growth characteristics and silicidation" published at Microelectronic Engineering 106 (2013) 69-75; in a paper by Viljami Pore et al. titled: "Nickel Silicide for Source-Drain Contacts from ALD NiO Films" published at the Interconnect Technology Conference and 2015 IEEE Materials for Advanced Metallization Conference (IITC/MAM), 2015 IEEE International; and by Jinho Kim et al. titled "Characteristics of Nickel Thin Film and Formation of Nickel Silicide by Remote Plasma Atomic Layer Deposition using Ni(iPr-DAD)2": published at Journal of the Korean Physical Society, March 2015, Volume 66, Issue 5, pp 821-827; and by Kinoshita, A., et al. "Solution for high-performance Schottky-source/drain MOSFETs: Schottky barrier height engineering with dopant segregation technique," published at VLSI Technology, 2004. Digest of Technical Papers. 2004 Symposium on. IEEE, 2004, all of which are incorporated herein by reference.

An embodiment of the invention is to form full metallic source/drains. Such could include tuning the Schottky Barrier height or Fermi level de-pinning by a very thin deposition of isolation, for example, such as silicon oxide or high-k dielectric, prior to the deposition of metal. Such could be achieved by first fully etching away the S/D regions and then filling in, the isolation using deposition techniques such as ALD, followed then by metal deposition and completed by removing the excess metal using etching, for example, anisotropic etching. Such techniques are known in the art as Metal Isolation Silicon ("MIS"). Such has been presented by Connelly, Daniel, et al. in a paper titled "A new route to zero-barrier metal source/drain MOSFETs," published in IEEE transactions on nanotechnology 3.1 (2004): 98-104; by Demaurex, Bénédicte in a dissertation titled "Passivating contacts for homojunction solar cells using a-Si: H/c-Si hetero-interfaces." at ÉCOLE POLYTECHNIQUE FEDERALE DE LAUSANNE, 2014; by Chiu, Fu-Chien titled "A review on conduction mechanisms in dielectric films," published in Advances in Materials Science and Engineering 2014 (2014); and B. E. Cossa, et al. in a paper titled "CMOS band-edge schottky barrier heights using dielectric-dipole mitigated (DDM) metal/Si for source/drain contact resistance reduction" VLSI Technology 2009, pp. 104-105; all of the forgoing are incorporated herein by reference. The full metal source/drain to channel junction can be formed on one or more well-defined crystallographic orientation surfaces of the semiconductor channel as referenced in U.S. patent application publication 2010/0065887, incorporated herein by reference. Such approaches may be used to control the effective Schottky Barrier height. The metal source/drain can include a single type of metal such as tungsten, cobalt, platinum, nickel, or their silicide. Alternatively, the metal source/drain may include a stack of multiple metals in order to form a desired metal work-function and thereby a specific effective Schottky Barrier height. Alternatively, the stack of multiple metals may be used where the first metal contacts the semiconductor channel is thin, but predominately defines the effective Schottky barrier height and the subsequent metal(s) may be chosen for process convenience. For example, such as is disclosed in U.S. patent application publication 2011/0008953, incorporated herein by reference. For the memory application as presented herein the Schottky Barrier could be tuned to about 0.1-0.5 eV. Alternatively, the multilayer substrate, such as is illustrated in FIG. 3A of PCT/US16/52726, could be made with undoped or P doped silicon designated to become the memory channel while the S/D layers could be first be made of sacrificial SiGe to be replaced with metal and function as the S/D of the memory structure, effectively exchanging the role of the silicon and SiGe in the structure. A variation of such a sacrificial SiGe flow could include doping the bottom most and the upper most of the silicon strips after the removal of the SiGe strips. Such doping could use techniques such as solid phase or gas based diffusion or monolayer doping (MLD), as previously discussed. Such could be used to form N+ regions in the silicon forming NPN type vertical transistors, and by adding metal into the grooves left by the removal of the SiGe the S/D lines could be completed reducing the bit lines resistivity, and could include forming DSSB vertical memory cells.

FIG. 15D illustrates an alternative in which the structure of FIG. 15B is formed via a two-step etch; selective SiGe etch followed by non-selective isotropic etch, etching both the S/D and the channel at about equal rate, which create notch near Si and SiGe corners. The results should have round corner unlike what is in FIG. 15D illustration. The channel region 1516 are narrowed further but the S/D regions are also etch forming an S/D neck 1514 regions for the space etch from the side that was open by the prior channel etch, and a thinner S/D 1512. The height of the neck 1514 in Z direction could be controlled by the etch depth of this second etch step. FIG. 15E illustrates the structure of FIG. 15D after similar formation of protective isolation 1520. Since the protective isolation 1520 is extended over the junction near the S/D 1521, the silicidation junction direct short with the channel may be substantially avoided while the silicidation proceeds along the S/D sides. The protective isolation could be later replaced with O/N/O (Tunneling Oxide/trapping Nitride/isolation Oxide) or be already design to be used as at least part of the O/N/O structure. In this step, the process temperature may be determined with consideration that doesn't substantially impact on the silicide and avoid junction spike. The top most S/D 1521 could be used as mask for excess protective isolation directional etch removal. Alternatively, the hard mask 1508 could be trimmed to guarantee the S/D side wall exposure for the following silicidation. This second etch step allow forming a neck to the S/D providing more control for the DS-SB formation.

An additional inventive embodiment is an additional alternative for the 3D NOR formation process, wherein it use a multilayer in which the S/D layers are kept un-doped prior to the subsequent silicidation process. Such undoped S/D layer and S/D doping last process can prevent the channel autodoping problem during a multilayer epitaxial growth process. For the SB type that would be fine as the S/D are defined by the silicidation process. For other types of memory cells and for DSSB the moderate N concentration such as order of $10^{16}$/cm3 or higher concentration of N+ dopant such as higher than $10^{20}$/cm$^3$ could be selectively added to the S/D region. which could be silicided after the ridge formation. In these cases, the channel regions could first be protected by techniques similar to those in reference to FIG. 15C-15E herein. Solid phase or gas base diffusion could be used to dope the vertically arranged multiple layers though the exposed S/D regions. An example of these types of doping techniques are presented in papers by Ajay Kumar Kambham et al. titled "Three dimensional doping and diffusion in nano scaled devices as studied by atom probe tomography" published in Nanotechnology 24 (2013) 275705 (7 pp); by Thomas E. Seidel titled "Atomic Layer Deposition of Dopants for Recoil Implantation in finFET Sidewalls" published at Ion Implantation Technology (IIT), 2014 20th International Conference on Ion Implantation; and by U.S. patent U.S. Pat. No. 5,891,776, and by D. Raj titled "Plasma Doping of High Aspect Ratio Structures" published at Ion Implantation Technology (IIT), 2014 20th International Conference on Ion Implantation; all of the forgoing incorporated herein by reference. A similar technique is also called Mono Layer Doping (MLD) as presented by Ye, Liang, et al. "Doping of semiconductors by molecular monolayers: monolayer formation, dopant diffusion and applications." Materials science in semiconductor processing 57 (2017): 166-172, all are incorporated herein by reference. These techniques could be used with substantially every 3D memory herein. For example, MLD techniques could be used on a dedicated region designated for S/D or on the outer side of a region designated as channel. It could also be used for DSSB formation.

The epitaxial process forming the multilayer base structure of the 3D NOR formation process could utilize an alternative technique to reduce the probability of dopant transition from the future S/D regions to the channel regions. In a paper by Robert J. Mears et al. titled "Punch-Through Stop Doping Profile Control via Interstitial Trapping by Oxygen-Insertion Silicon Channel" presented at EDTM 2017, incorporated herein by reference, an ultra thin layer of oxide integrated in the epitaxial process is suggested to keep dopant from drifting or diffusing by heat. A mono layer or even less than monolayer of oxide is an effective barrier to dopant pass through. Accordingly, for the multilayer epitaxial process, such oxide blocking could be integrated to support in-situ doping of the S/D regions with blocking oxide at the interface of the S/D layer to the channel layer. Such a method should be carefully considered as it may degrade SB current performance if SB technology is to be implemented.

As note previously, the role of S/D and Channel may be replaced wherein Si serves as the channel and SiGe as the S/D region. Further and in accordance with 15A-E, SiGe may be completely selectively etched wherein top and bottom planes of silicon layers may be doped by various methods such as Molecular Monolayer Doping, thus forming both channel and S/D region within the Silicon crystalline layer.

A known concern with memory arrays is various types of disturbs. Some of those are related to parasitic capacitance and similar forms of signal coupling due to the relatively long and close proximity of parallel memory control lines such as bit lines and word lines. These concerns are part of the engineering challenge of any memory device and could be included in the engineering of a 3D NOR memory structure. Some of the alternative techniques in the following could be adapted for such memory engineering.

A body contact as discussed in respect to FIG. 42A-42E of PCT/US16/52726 could be engineered either at the edge of a memory unit or multiple times along the ridge. The connection lines (4248 of PCT/US16/52726) could be called body-lines and could be connected to ground, or to a 'body control' which could be connected to a specific voltage control as part of the memory control circuit and logic. Such 'body control' could be set to a positive voltage to assist the memory erase step. In some embodiments, a positive body voltage erase may be accomplished with the ground voltage to the selected word lines, eliminating the need of a negative voltage for all operations, thus as a result the periphery area (memory control circuits) used for a negative voltage generator can be saved. In some applications it could be combined with higher doping in the center of the channel, for example, such as indicated in FIG. 1B as $Si_{0.8}SiGe_{0.2}$, to improve the body horizontal conductivity.

An additional embodiment is to have within a selected ridge all of the unselected S/D lines left floating (e.g. FIG. 13B), which may be connected together, for example, through a multiplexer in the periphery circuits. By connecting together all the S/D lines left floating, they will form a much larger capacitive load thus significantly reducing the capacitive coupling to the two active S/D lines.

An additional embodiment, such as when using in FN or direct tunneling, is to sequence the writing sequence to reduce cross talk by first activating the selected Source and Drain (the two adjacent S/D lines), then assert the selected word-line to turn on the vertical transistor of the selected bit cell. Then after the cross-talk ripple to adjacent S/D lines has subsided, move the wordline bias high enough so that the writing process will be effective only in the selected memory cell, thus reducing the disturb effect.

An additional embodiment is a 3D NOR structure alternative: to replace the full ridge shared body contact with a per layer body contact using a stair-case to allow selective access control for each body layer. FIG. 15F illustrates such structure in which the body between S/D1 and S/D2 could be controlled by signal B1, the body between S/D2 and S/D3 could be controlled by signal B2, and so forth. In such a 3D NOR structure, an alternative writing technique could be achieved by using one word-line such as WL1 and one body layer of a selected ridge, such as B2, to select a specific cell 1540. Using FN tunneling or direct tunneling by having the voltage difference between B2 and WL1, for example using a positive voltage for the selected WL and zero or a negative voltage for the selected channel 'body' line will pull charge into the related charge trapping region. All S/D lines may be left floating. For the erasing operation using a positive body contact voltage, all S/D lines could be left floating while the selected WL is grounded and the remainder of the WL's floating. Alternatively, the aforementioned configuration of sharing voltages between selected WL and Channel lines may benefit by requiring a smaller voltage range to perform program and erase operations. Such may be accomplished by negative half of erasing voltage to the gate and positive half of erasing voltage to the body to create a full erase voltage across the gate and the body while all S/D lines could be left floating. Furthermore, inhibit of non-selected cells is obtained naturally. Alternatively, to avoid the need of negative voltages and associated array size penalty, only positive voltages may be utilized. Programming operation using only positive word line voltages is accomplished by grounding the channel line and all other unselected channel lines are left floating. The unselected S/D lines could be biased by half voltage of the programming word line voltage so that the voltage difference between the selected word line and unselected cells is low enough to avoid any undesired FN tunneling. Alternatively, for programming operations using a positive word line voltage, the unselected S/D lines could be left floating or alternatively biased by half voltage of the programming word line voltage so that the voltage difference between the selected word line and unselected S/D line is low enough to avoid any undesired FN tunneling from the S/D lines. The selected body voltage to the selected channel B2 should be selected per ridge to avoid writing in the non-selected ridge. An additional embodiment in respect to such form of writing is to steer the charges to be close to one of the S/D lines such that at least two charge locations could be formed to increase the memory density. Such could be done for example by having S/D3 at ground while all other S/D lines are floating, preferably shorted together. The electric field between the negative body B2 and the grounded S/D3 during program operation wherein also a positive voltage is applied on WL's could pull the electrons toward the S/D3 side for writing on that side of the charge trap region and for the other side replace roles with S/D2. Accordingly, the storage locations per facet could be made effective with such a writing technique. Additional variations could include a blend by combining FN type writing with some level of hot electron by proper voltage control of S/D2 and S/D3. An additional alternative for charge steering could include modulating the steering S/D line by a wavelet function similar to what has been presented in at least U.S. application Ser. No. 15/333,138 with respect to at least FIG. 27 to FIG. 32.

FIG. 15G is an Y-Z cut view illustrating an optional alternative to a staircase for forming a per layer 'body' contact presented in respect to FIG. 15F herein with reference to B1-B7. It illustrates a pillar electrode 1558 to form a programmable connection per layer through programmable isolation 1556 such as a one-time programmable antifuse, for example, formed with silicon oxide or other resistive switching material that could be electrically programmed to form a conductive connection from the pillar electrode 1558 to the designated body such as body 1564. The side view illustrates S/D lines that could be referred as S/Dn+2 1552, S/Dn+1 1560, S/Dn 1568 and S/Dn-1 1570. The designated channels to form a programmable connection to, are illustrated as 1562, 1564, 1566 for which 1564 could be considered as the 'body' for channel 'n'. During the formation of the structure, the S/D protective isolations 1550, 1554 could be processed in a similar way to the process used to form channel protection 1510. The structure illustrated in FIG. 15G could be designed to form enough vertical pillars 1558 to allow at least one pillar per body. Then the per layer contacts to the S/D lines could be used to program the connection between the vertical pillar electrode 1558 to the designated body. Such programming could be formed by pulsing +Vpp to the vertical pillar 1558 and −Vpp/2 to S/Dn and S/Dn+1 resulting in forming programmable link 1580 between the vertical pillar electrode 1558 and the Channel n body 1564. The adjacent S/Dn−1 and S/Dn+2 could be pulled-up as additional protection. The vertical connection illustrated in FIG. 15G could also be made oriented in Y direction parallel to the connection structure for the S/D lines as is illustrated in FIG. 12B.

An additional alternative when the memory structure includes body access is to use the programming method known as Channel Initiated Secondary ELectrons injection ("CHISEL") which could allow lower writing voltages. For example, the Source line could be held at Vs=0 v the Drain at Vd=2 to 3 v and the 'body; at Vb=−2 to −3 v. Such programming techniques has been detailed in a paper by Mahapatra, Souvik, S. Shukuri, and Jeff Bude. "CHISEL flash EEPROM. I. Performance and scaling," *IEEE Transactions on Electron Devices* 49.7 (2002): 1296-1301; by Mahapatra, Souvik, S. Shukuri, and Jeff Bude. "CHISEL flash EEPROM. I. Performance and scaling," *IEEE Transactions on Electron Devices* 49.7 (2002): 1296-1301; by Driussi, Francesco, David Esseni, and Luca Selmi. "Performance, degradation monitors, and reliability of the CHISEL injection regime" *IEEE Transactions on Device and Materials Reliability* 4.3 (2004): 327-334; by Nair, Deleep R., et al. "Explanation of P/E cycling impact on drain disturb in flash EEPROMs under CHE and CHISEL programming operation." *IEEE Transactions on Electron Devices* 52.4 (2005): 534-540; and by Stefanutti, Walter, et al. "Monte Carlo simulation of substrate enhanced electron injection in split-gate memory cells." *IEEE Transactions on Electron Devices* 53.1 (2006): 89-96, all of the forgoing are incorporated herein by reference.

The memory structure herein was presented as a charge trap memory. When the target application could make tradeoffs between write speed and retention time, the charge trap layer may be tuned accordingly. As illustrated in IEEE ELECTRON DEVICE LETTERS, 16, 11, p. 491, 1995 by H. Clement Wann and Chenming Hu, "High-Endurance Ultra-Thin Tunnel Oxide in MONOS Device Structure for Dynamic Memory Application", while thinning down the bottom-oxide thickness improves program speed, retention time decreases significantly. An alternative approach may be considered wherein the bottom-oxide may be replaced with low-trapping nitride such as oxinitride as published in Masayuki Terai, Koji Watanabe, and Shinji Fujieda, "Effect of Nitrogen Profile and Fluorine Incorporation on Negative-Bias Temperature Instability of Ultrathin Plasma-Nitrided SiON MOSFETs", IEEE TRANSACTIONS ON ELECTRON DEVICES, VOL. 54, NO. 7, JULY 2007 or JVD nitride as published in IEEE ELECTRON DEVICE LETTERS, VOL. 21, NO. 11, pp. 540 2000, by Yee Chia Yeo, Qiang Lu, Wen Chin Lee, Tsu-Jae King, Chenming Hu, Xiewen Wang, Xin Guo, and T. P. Ma, "Direct Tunneling Gate Leakage Current in Transistors with Ultrathin Silicon Nitride Gate Dielectric". For a similar retention time, such a layer may provide better control of ONO formation as the required thickness is significantly larger, directly related to the ratio of dielectric constants, 7/3.9. Such an advantage may be realized with very a thin nitride layer of about 1 nm which may be production worthy compared ~0.6 nm silicon-oxide which may not feasible to realize in a production environment. An additional advantage is a faster FN erase speed thanks to the significantly smaller offset in valence band with respect to the silicon. Such a method may therefore enable an erase operation and limit erase voltages to lower or similar values as the program voltage. Program speed may also be improved significantly thanks to the smaller band offset if a hot electron injection mechanism is utilized. Such a method may be Channel Hot Electron Injection (CHEI) or Channel Hot Injection Secondary Electrons (CHISEL) in doped np junctions or alternatively in Schottky Barrier or DSSB transistors hot electrons are generated next to the source wherein injection also takes place. Further improvement in program and erase speed or voltages may be brought about by thinning down to about 2 nm the trapping nitride layer which may be formed either by LPCVD or ALD methods with a potentially significant program window of 1-2V as referred in IEEE ELECTRON DEVICE LETTERS, VOL. 32, NO. 11, p. 1501, 2011 by G. Van den bosch, G. S. Kar, P. Blomme, A. Arreghini, A. Cacciato, L. Breuil, A. De Keersgieter, V. Paraschiv, C. Vrancken, B. Douhard, O. Richard, S. Van Aerde, I. Debusschere, and J. Van Houdt, "Highly Scaled Vertical Cylindrical SONOS Cell With Bilayer Polysilicon Channel for 3-D NAND Flash Memory". Other forms of such multilayers could be engineered to fit the specific design objective of retention vs. write time.

An additional option is to use the low trapping nitride, such as oxynitride and Jet Vapor Nitride mentioned above, as a replacement to the high doping charge trapping nitride layer, thus realizing a layer which accommodates injected charges in the conduction band of the low trapping nitride. Such a method would be an alternative approach to the common industry standard of floating gate polysilicon.

The memory structure herein was presented as a charge trap memory. Recently good progress has been made in respect to ferroelectric type memories, especially in respect to utilizing Hafnium Oxide and Zirconium Oxide based materials (HfO, ZrO, HfZrO, ZrSio, . . . ). These memories are referenced as FRAM and could provide higher write and erase speeds compared to charge trap based memories. At the current time a development effort is being pursued by the industry to develop such FRAM technology to be commercially viable. The technologies in development for such FRAM include advanced ferroelectric deposition techniques such as ALD. Adapting FRAM to the 3D-NOR fabrics presented herein could be a good option. These could include also a mix, in which some of the regions are processed with O/N/O and some of the other regions with FRAM materials such as $HfO_2$ and silicon doped HfO2 (Si:HfO2) or Zr doped $HFO_2$ based materials. For example, the locations where the O/N/O layer used to be formed can be replaced with a stack of dielectric to function as a ferroelectric memory transistor. Alternatively, such locations may instead be formed with a stack of a charge trapping layer and a ferroelectric layer. Such a mix could be attractive for many systems as it provides multiple memory technologies, low power, and time for transferring data between these memory technologies as was discussed herein. Using FRAM within the 3D-NOR memory could include many of the variations referred herein in respect to charge trap memories. These could include multi-level cells in which multi-bits are coded in via different writing voltages or different write times. These could also include multi-bit locations similar to mirror bit and multi-gates steering of bit location such as discussed in respect to at least FIG. 10E of PCT/US16/52726 and FIG. 15A to FIG. 23 of U.S. Ser. No. 15/333,138 Similar to charge trap, FRAM is an electric field based memory and is an isolative material, and accordingly could support these multi-bit coding techniques to support higher memory density. As such, the stored data states can be differentiated by either or both the degree and the location of polarization of the ferroelectric. The use and methods of constructing an FRAM memory is covered in many recent papers and their teaching could be applied to incorporate such ferroelectric dielectric for the 3D NOR. Such papers as by J. Muller et al. titled "Ferroelectric Hafnium Oxide Based Materials and Devices: Assessment of Current Status and Future Prospects" published in ECS Journal of Solid State Science and Technology, 4(5) N30-N35 (2015); by Patrick D. Lomenzo et al. titled "Annealing behavior of ferroelectric Si-doped HfO2 thin films" published at Thin Solid Films 615 (2016) 139-144; by Uwe Schroeder et al. titled "Chapter 3, Nonvolatile Field-Effect Transistors Using Ferroelectric Doped HfO2 Films" published by Springer Science & Business Media Dordrecht 2016, B.-E. Park et al. (eds.), Ferroelectric-Gate Field Effect Transistor Memories, Topics in Applied Physics; by U. Schroeder et al. titled "Impact of field cycling on HfO2 based non-volatile memory devices" presented at ESSDERC16; by Shinji Migita titled "Thickness-Independent Behavior of Coercive Field in HfO2-based Ferroelectrics" presented at EDTM 2017; by Cheng, Chun-Hu, et al. titled "Low-leakage-current DRAM-like memory using a one-transistor ferroelectric MOSFET with a Hf-based gate dielectric" published in IEEE Electron Device Letters 35.1 (2014): 138-140; and by Zhen Fan titled "Ferroelectric HfO2-based materials for next-generation ferroelectric memories" published at JOURNAL OF ADVANCED DIELECTRICS Vol. 6, No. 2 (2016); all of the forgoing are incorporated herein by reference.

Some of the ferroelectric materials could act also as a charge trapping materials. These two could impair each other as discussed in a paper by Yurchuk, Ekaterina, et al. titled "Charge-Trapping Phenomena in HfO 2-Based FeFET-Type Nonvolatile Memories," published in IEEE Transactions on Electron Devices 63.9 (2016): 3501-3507; the forgoing is incorporated herein by reference. On the other hand the memory cell could be engineered to have these two enhancing each other, so the ferroelectric and charge trap could be combined for enhanced memory functionality, such as presented by Yu-Chien Chiu et al. titled "Low Power IT DRAM/NVM Versatile Memory Featuring Steep Sub-60-mV/decade Operation, Fast 20-ns Speed, and Robust 85oC-Extrapolated 1016 Endurance" presented at 2015 Symposium on VLSI Technology; Chiu, Yu-Chien, et al. "On the variability of threshold voltage window in gate-injection versatile memories with Sub-60 mV/dec sub-threshold swing and $10^{12}$-cycling endurance" Reliability Physics Symposium (IRPS), 2016 IEEE International, IEEE, 2016; and by Chia-Chi Fan et al. titled "Impact of Ferroelectric Domain Switching in Nonvolatile Charge-Trapping Memory" presented at EDTM 2017; and in U.S. patent application publication 2016/0308070; all of the forgoing are incorporated herein by reference. Such enhancement is accomplished when the electric field generated by the charge trapping and the polarization of ferroelectric are oriented to enhance each other.

Writing a ferroelectric memory cell techniques are provided, for example, in U.S. Pat. No. 6,667,244, incorporated herein by reference. The following ferroelectric writing example for the 3D-NOR structure could be also adapted to charge trap programming using FN by adapting voltage levels and to the above structure for which ferroelectric cells are designed to be enhanced by charge trapping.

An example of writing conditions in the following assumes that the 4 V difference across the gate and the S/D is engineered to be sufficient to polarize the ferroelectric while the voltage difference below half of it (2V) is not sufficient to disturb the states of the ferroelectric.

FIG. 16A illustrates a schematic of a single cell written to the '0' logic state. FIG. 16B illustrates such single cell structure in a simplified cross section.

FIG. 16C illustrates a schematic of a single cell written to the '1' logic state. FIG. 16D illustrates such single cell structure in a simplified cross section.

The specific voltages of these structures are for illustration only and are to be defined specifically for a specific memory cell as part of such memory cell engineering. In a case where the selected word-line (the gate) is shared with other cells in the array the unselected cell could have their bit-lines (Source-lines and Drain-lines—S/D lines) at ground (zero volts—0V) or in some alternatives floating. Likewise, in a case where the selected bit-line (the source and the drain—S/D lines) is shared with other cells in the array, the unselected cell could have their word-lines (the gate) are at ground or in some alternative floating.

FIG. 17A-17D illustrates an alternative in which two bits are stored in one facet of the memory cell by directing the electric field only to the source side of the memory transistor, or alternatively (not illustrated) to the drain side. This could resemble the mirror-bit concept in charge trapping cells. This writing method could be adapted for the 3D NOR fabric. The channel could be floating in the cases outlined above.

FIG. 18A illustrates a small section of a ridge of the 3D-NOR fabric. These writing schemes are driven by an electric field between the channel, driven from the S/D lines, and the word-lines. Note that the symbol 'x' in the figures represents that no writing is to be effected at the related ferroelectric zone. For such writing techniques, the odd level cells are to be used while the even level memory cells could be ignored. This is since in this writing technique both sides of the active S/D are affected in the regions close to the active word-line. FIG. 18A illustrates writing 'zero' to a memory cell. FIG. 18B illustrates writing 'one' to a half of a memory cell. FIG. 18C illustrates writing 'one' to a group of memory cells sharing the same bit-lines (S/D lines). FIG. 18D illustrates writing 'zero' to a group of memory cells having common word-line (gate line). These write modes illustrations are indicative of the options available for writing of a ferroelectric memory option within 3D NOR structure. These could be combined with multilevel programming techniques to increase storage capacity. Such multilevel storage is presented in a paper by Mulaosmanovic, Halid, et al. titled "Switching kinetics in nanoscale hafnium oxide based ferroelectric field effect transistors," published at ACS Applied Materials & Interfaces (2017), incorporated herein by reference.

These could also include multi-bit locations similar to mirror bit and multi-gates steering of bit location such as is discussed in respect to at least FIG. 10E of PCT/US16/52726 and FIG. 15A to FIG. 23 of U.S. Ser. No. 15/333,138 for further increases of memory capacity. The multi storage locations writing, is similar to that of charge trap: the side gates could be used to modify the electric field directing the effect of the major gate to the selected location of the related facet. Also the techniques presented for transferring memory, from and to high speed cells, and high density cells, could be used in respect to ferroelectric based memory cells.

In hot-electron writing techniques the side gate steering is targeting the channel region in which the hot electrons are being formed along the channel width direction perpendicular to the source-drain direction. In FN and even more so for FN in which the gate is the source of the charge, or in ferroelectric writing techniques, the steering could also be directed to the electric field formed in the O/N/O and/or the ferroelectric regions. Accordingly it would be enough if the side gates are positioned to affect the electric field between the primary gate and the semiconductor region.

FIG. 18E and FIG. 18F are example illustrations how this effect might be arranged and performed. FIG. 18E is an X-Z cut-view of a small ridge region of a 3D NOR. It shows a section of two $1^{st}$ gates 1821, 1823 and two $2^{nd}$ gates 1822, 1824. It also shows two S/D regions 1801, 1803 and the channel 1802 in between them. FIG. 18F is an X-Y cut-view at the active region of the ridge 'marked plane' 1805 of FIG. 18E. It shows the side view of the channel 1802 marked channel 1832, the respective gates 1821, 1822, 1823 and the O/N/O or ferroelectric or combination 1834. It also illustrates two memory sites that could be formed by these steering techniques. By assigning the role of main gate to 1822 and pulling the electric field by side gate 1823 and pushing the electric field by side gate 1821 the write location could be made to 1828. And, for example, by pulling the electric field by side gate 1821 and pushing the electric field by side gate 1823, the write location could be made to be 1826. To avoid disturb to the memory related to the side gate, the side gate voltage could be set to be below the level that could disturb the side memory. The specific voltages could be set for a specific memory structure and all numbers presented in here are for illustration only.

The writing techniques presented with respect to FIG. 15F, could also be used for ferroelectric based memory and the presented charge-trap/ferroelectric structures presented herein. In such case at least one of the channel facets storage layer (O/N/O) could incorporate ferroelectric material such as $HfO_2$ as presented herein before. The writing techniques presented in respect to FIG. 18A-18D could be adapted accordingly, so that the writing and erasing electric field is formed between the selected word-line and the selected 'body' while the S/D lines are left floating, or used for electric field steering as has been described herein.

An embodiment of the invention is to use such memory structures or a portion of such for Synapse-like functions. Such use of memory has been suggested in the art for RRAM and PCM cross bar but could be applied to charge trap or other memory types presented herein. Published work for RRAM and PCM cross bar has been by Chen, C-Y M et al. titled "A solid-state electronic linear adaptive neuron with electrically alterable synapses" published at Neural Networks, 1991, 1991 IEEE International Joint Conference on. IEEE, 1991; by Lee, Myoung-Sun, et al. titled "Implementation of Short-Term Plasticity and Long-Term Potentiation in a Synapse Using Si-Based Type of Charge-Trap Memory" published at IEEE Transactions on Electron Devices 62.2 (2015): 569-573; and by Komijcuk, Vladimir, et al. titled "Leaky integrate-and-fire neuron circuit based on floating-gate integrator" published at Frontiers in neuroscience 10 (2016); all of the forgoing are incorporated herein by reference.

In many of the memory structure herein the writing technique could include a reduced gate voltage in conjunction with use of negative voltages on the S/D to reduce the overall power requirements of the device. Such technique could also take advantage of the heterogeneous integration of memory control circuit layer(s) disposed over a memory matrix.

An additional inventive embodiment is an alternative for a 3D device-system; such a system as is illustrated in FIG. 11E. It is to construct the system as array(s) of memory units, such as illustrated in FIG. 12B, and with a corresponding processor cores on top of it or underneath. For many compute tasks the program code loaded on a processor core could be set according to the content loaded in its corresponding memory unit on top or under it. Thus processing of data could be accomplished with a short distance data transfer of less than about 1 mm or less than about 100 microns or even less than about 20 microns, as opposed to PCB (Printed Circuit Board) based computers in which the data from the memory being fed though over 20 mm wires using the PCB. The memory unit and the processor core could be rectangular in shape with an area of less than about 4 $mm^2$, or less than about 1 $mm^2$. Alternatively, the data transfer into the 3D device-system could be set such that data is placed in correspondence with the designated processor to process it. An additional alternative is the use programmable logic as part of the processing logic. With the use of programmable logic, or FPGA, the logic configuration could be adapted to the data stored in the corresponding 3D memory to further enhance processing efficiency while reducing data movement power and delay. FIG. 19A illustrates an X-Z cut view of a 3D system in which a first strata of memory units 1902, 1904, 1906, 1908, is overlaid by a second strata of memory units 1912, 1914, 1916, 1918, is overlaid by a third strata of memory control circuits 1922, 1924, 1926, 1928, and is overlaid by fourth strata of processor core units 1932, 1934, 1936, 1938. In some embodiments, the first strata of memory units may be high density non-volatile memory such as Flash memory or RRAM. In some embodiments, the second strata of memory unit may be high-speed memory such as DRAM or static memory such as SRAM. For example, such computer system could be tasked to search for a person which meets a specific criterion. Accordingly the fourth strata cores could be set with the search in parallel in which core 1932 is access using memory control 1922 for that person in the data base being hold at memory cores 1912 and 1902. In another case only one core at a time will perform the search while the other cores perform other tasks, yet the search is perform by a core 1932 in the data bank in 1912, 1902, and then the search task is assigned to core 1934 which will run it for the data in 1914, 1904 and so forth.

An additional advantage in such a 3D memory system relates to the potential defects in semiconductor manufacturing. For example, the structure illustrated in FIG. 19A could be processed at full reticle level with the expectation that some of the cores or the memory units could be defective and would not be activated on the end product, which could be designed to function with only 80% of the units functional. As such, the third strata of memory control circuits may have an on-chip testing function (not shown) in order to assess the functionality of the memory layers underneath and allocate those memory blocks into the enabled and the disabled blocks, and update the data routing path(s) accordingly. An important advantage of this 3D structure is the ability to effectively support a very fine grain of unit based construction. Such units could be designed and engineered to be sized to less than about 1 $mm^2$ or less than about 0.2 $mm^2$ or even less than about 0.05 $mm^2$. While the 3D system size could be larger than 100 $mm^2$ or larger than 600 $mm^2$, or larger than 2,000 $mm^2$ or even larger than 10,000 $mm^2$.

Moreover, a mix of redundancy techniques could be used. As such the multi-core multi-unit 3D system of FIG. 19 could have a system control function 1940 which controls the overall 3D system and could be constructed with two strata: one strata provides redundancy to the other at the logic cone level as been presented in U.S. Pat. No. 8,994,404, incorporated herein by reference, in respect to at least FIGS. 24A-44B.

The system control function 1940 could include input output channels to other systems, or to a communication channel such as the internet or to wireless systems such as G4, G5. This could include such as fiber optic channel, free space optical channel, wireless channel and other forms of communication channels. The Monolithic 3D technology presented herein enables heterogenous integration to enable those forms of communication.

The 3D architecture also could be useful to enable common manufacturing of a modular system that could be customized to specific needs by techniques presented herein, such as the use of each of a continuous structure as presented U.S. Pat. No. 8,994,404 as related to at least FIGS. 11A-12E, FIGS. 14-17, and FIGS. 22A-23D. FIG. 19B illustrates such customization. The upper portion 1952 is a magnification of section of a structure such as is illustrated in FIG. 19A, and it overlay a substrate 1954. The generic wafer could be then customized by dicing it to the desired end chip size. The dicing 1956 could be done by many of the known techniques including conventional dicing saw, or plasma etching also called plasma dicing or laser assisted dicing. The dicing could be done at designated potential dice lines 1958. These potential dice lines could include various restrictions (for example, design rule restrictions) and support for potential future dicing including guard rings and avoiding active regions or metal lines through them. Alternatively, the dicing could be done by advanced dicing techniques such as laser assisted or plasma assisted dicing. And could be supported by additional techniques to seal and provide side wall protection to support good functionality and reliability of the end device.

An additional inventive embodiment is an additional aspect of a 3D computer system, such as is related to FIG. 19A, where there is the need to integrate multiple memory stratums to achieve a larger memory bank. In one alternative, multiple stratums could be integrated via 3D integration with minimum per strata processing, and then a memory control stratum could be added to control each and every memory cell in the strata underneath. These memories could be structured for such integrations. These memories could be volatile memory such as DRAM, Non Volatile memory such as 3D NOR, or 3D NAND or even a mix of such. In the following description of such integration, it is assumed that the memory are constructed in a same size memory unit array and each such unit is controlled by the same pitch of memory control lines so when one memory wafer is bonded on top of another memory wafer these memory units and their control lines (wordlines and bitlines) are precisely overlaid to each other, This overlaying is subject to the wafer to wafer or die to wafer misalignment precision of the bonding equipment. The integration technique leverages copper to copper, hybrid or 'fusion' bonding in which the bonding process also functions as an electrical connection process between these wafer/strata. Such precise bonding is presented in a paper by Kurz, Florian, et al. "High Precision Low Temperature Direct Wafer Bonding Technology for Wafer-Level 3D ICs Manufacturing." *ECS Transactions* 75.9 (2016): 345-353, incorporated herein by reference. Utilizing precise bonder and thin layer transfer to construct 3D generic memory structure and integrating it with a logic wafer to form high performance 3D compute system is presented in a paper by Zvi Or-Bach titled "A 1,000× Improvement in Computer Systems by Bridging the Processor Memory Gap" IEEE-S3S 2017, incorporated herein by reference. FIG. 20A-20F illustrates preparation of a wafer for such connectivity using wafer bonding, including construction of the TLV to allow multiple stratum integration, leveraging the 3D layer transfer techniques presented herein or other thin layer transfer techniques.

FIG. 20A illustrates a Y-Z 2000 cut view of section of a wafer, a base wafer 2002 including a SiGe "cut layer" 2001 and memory circuits 2003.

FIG. 20B illustrates the structure of FIG. 20A after etching hole region 2004 substantially all the way to expose the cut layer 2001.

FIG. 20C illustrates the structure of FIG. 20B after forming top metal landing pad 2006. The isolation layer to protect the silicon sidewall of the memory circuit 2003 (not drawn). This top landing pad 2006 may be drawn larger in the X and the Y direction than the pitch of a TLV as determined by the bonding process, in order to accommodate the wafer bonding alignment tolerance of the TLV. Top landing pad 2006 may be in-plane with the silicon layer of the memory circuit 2003.

FIG. 20D illustrates the structure of FIG. 20C after covering the structure with isolation layer 2008.

FIG. 20E illustrates the structure of FIG. 20D after adding interconnection layer 2010 including at least one via 2014 to the landing pad 2006. This could be a memory control line. The interconnection layer 2010 may be wordline, bitline and/or sourceline of the memory circuit 2003.

FIG. 20F illustrates the structure after adding the bottom connection pad 2012 connected to the interconnection layer 2010.

Such prepared stratum may be bonded onto another target wafer and once the cut is performed the target strata is ready to have additional stratum bonded and connected onto it.

FIG. 20G illustrates an alternative to adapted such technique to die level operation as was presented in reference to FIG. 4H herein. As an example, a multilayer such as is illustrated in FIG. 4H could be used. For such the bottom layer 2042 could be silicon, and SiGe layer 2044 on top of the silicon layer 2042, and top silicon device layer 2046. Then using a similar flow to the one in reference to FIG. 20A-20F herein, bottom pads 2022 and top pads 2044 could be formed. Thus the multilayered structure 2040 could be 'cut' and diced out and bonded at a die level onto another target wafer (not drawn), then a selective etch from the top could be used to first remove the silicon layer 2042 and then thin the die all the way to the device layer, for example, by selectively etching the SiGe layer 2044. These support layers 2042 and 2044 could have a thickness of about 1 micron, 1-3 microns, 3-6 microns or even higher. The device layer 2046 itself could include sub-layers such as n+ and p− to support the back-bias scheme as discussed before herein and in incorporated references. By having the inter-stratum connectivity structure 2022, 2024 pre-built, the stacking process could provide both mechanical bonding and through silicon connectivity—hybrid bonding—thus simplifying the 3D system formation which could includes wafer level stacking and die level stacking yet having thin stratum in the stack. These stratum could be at a thickness of about 10, 20, 40, 100, 200, 400 nm or about one or a few microns.

Figure 21B:
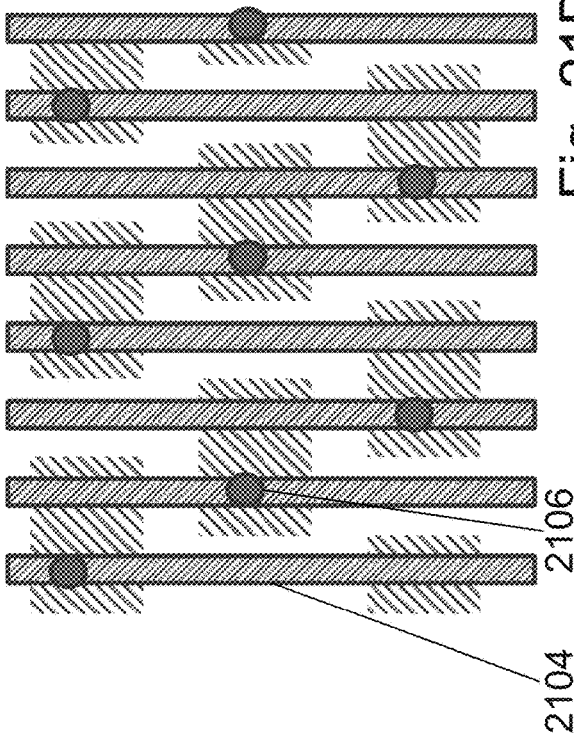
Figure 21D:
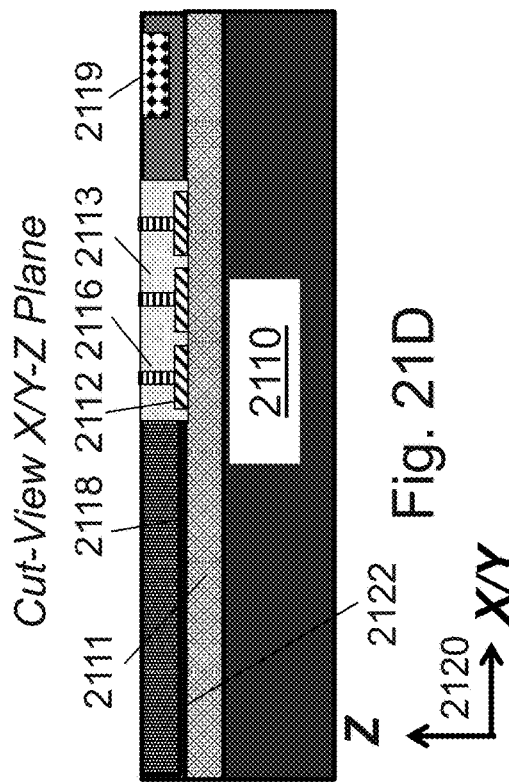
Figure 21A:
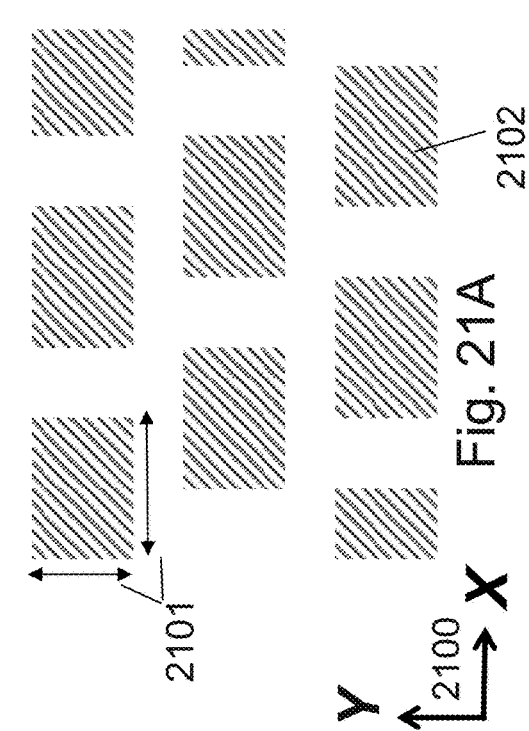
Figure 21C:
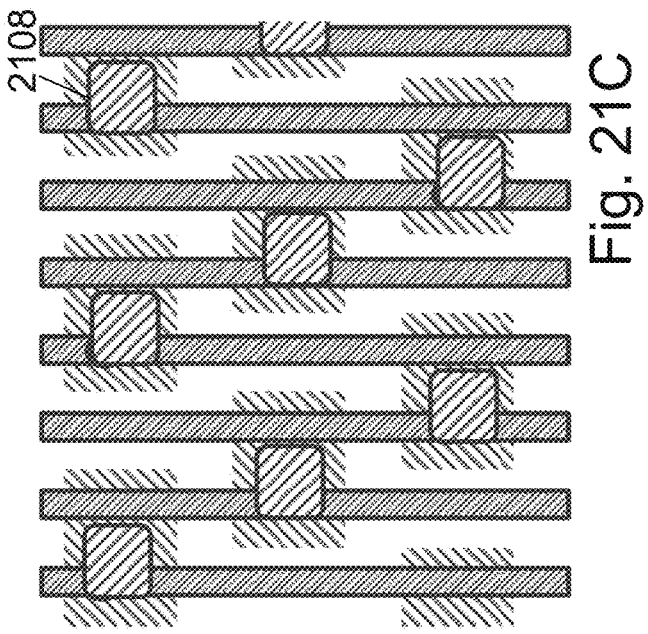

FIG. 21A-21C illustrates a small region of a memory control line X-Y 2100 top view. In this integration technique, a layer selected (not shown) could be used to allow multiple stratum control lines to be connected in parallel yet by enabling the layer select only the selected stratum could be accessed.

FIG. 21A illustrates top metal landing pads 2102 for control lines 2104 such as bit line, word line, or source line that are sized to the maximum bonding misalignment margin 2101 to guarantee that the bottom connection pad 2108 of the following stratum to be bonded will land on the top landing pad of the prior stratum. In some of the advanced wafer bonders the bonding misalignment is less than 100 nm (three sigma).

FIG. 21B illustrates the structure with the added control lines 2104 and their connection 2106 to the top landing pads. In many cases, the control lines pitch is denser than the expected worst-case misalignment and accordingly the landing pads are placed on multiple rows as illustrated. These control lines could be the bit-lines or the word-lines. The connectivity structure of FIG. 21A-21C assumes a control lines pitch of about 80 nm. Using an advanced lithography process, control lines pitch could be further pushed to even below 30 nm. The connectivity approach illustrated in FIG. 21A-21C could be adjusted accordingly.

FIG. 21C illustrates the structure after adding the bottom connection pads 2108. The use of the term bottom and top connecting pads is just for the ease of explanation and being part of layer transfer process top and bottom could be flipped.

FIG. 21D illustrates the X-Z cut-view or the Y-Z cut-view 2120 of the top landing pad during the wafer processing. Having a carrier substrate 2110, the area designated for intra stratum connectivity could be first processed to etch the silicon 2118 all the way to expose the SiGe layer 2111 using selective etch with the SiGe as an etch stop. Silicon 2118 may include a bottom layer silicon layer 2122 (dark black line) which later after flip bonding and 'cut' could become the top layer. The etch process could be wet or dry as the region being etched is relatively large, for example, of about 1 micron by 200 microns, or about 0.5 microns by 300 microns. Then the region could be filled with an electrically isolative material, for example, such as oxide 2113. Then the top landing pads may be patterned and then filled in with a conductive material, for example, such as copper, forming top landing pads 2112. The size of these pads 2112 could be large enough to assure the desired electrical and physical contact after the following wafer bonding step. For example, such as about 100 nm by 100 nm, or about 200 nm by 200 nm, or about 220 nm by 220 nm, or about 180 nm by 180 nm, or about 250 nm by 250 nm, or about 180 nm by 220 nm depending on production, design and other engineering considerations, especially the wafer bonder alignment capability. Then vias 2116 to these landing pads 2112 may be formed and additional isolation 2113 could be added if needed. These vertical connectivity elements pads 2112 and vias 2116 could be called Through Layer Via (TLV) or nano-TSV. The processing of these nano-TSVs could take place after the wafer has completed the high temperature process, often called Front End of the line ('FEOL"), which includes forming all the transistors, their isolation, and contacts in the active silicon 2118. The metal pattern could include a 'bonder alignment marks' 2119 to support the following face-to-face precise alignment. These 'bonder alignment marks' could be placed at the die level or even at the reticle level as they are part of the full wafer alignment process.

FIG. 21E illustrates the structure after completing the interconnect layers—the Back-End of The Line ("BEOL"). The memory array interconnect 2130, the nano-TSV which includes the future bottom pads 2138, the landing pads 2132, and the vias 2136 connecting them, and the bit-lines or the word-lines 2134. An oxide 2131 could be added to cover the array interconnect 2130. The process could be designed so the top surfaces of the future bottom pads 2138 are exposed to support the future metal to metal or hybrid bonding. Such preparation could include a slight height adjustment to ensure connectivity between the stack stratum.

FIG. 21F illustrates the resulting structure after having the structure of FIG. 21E, first structure 2144, flipped and bonded (metal to metal or hybrid bonding) to a second structure, base structure 2142 (may be similar to first structure 2144). The base structure 2142 may not need full nano-TSV or SiGe layer, for example, if it is supposed to be the uppermost stratum of the 3D chip; however, having a unified memory wafer could be preferred and having the ability to connect controls from both sides could be desired.

FIG. 21G illustrates the structure after removal of the base silicon 2146 of the top wafer first structure 2144. This could be done with a conventional grind followed by etch leveraging the SiGe layer 2148 as an etch stop.

FIG. 21H illustrates the structure after removal of the SiGe cut-layer 2148, using selective etch to etch mostly SiGe and not silicon. The exposed silicon layer 2122 could be oxidized to support subsequent hybrid bonding of additional structures, for example, such as first structure 2144 on top to form a three stratum stack or as many as needed. Alternatively, the hybrid bonding could be made of silicon to oxide and metal to metal. A few processes could be used to convert the now top layer silicon 2122 to oxide. Such as simple etch and deposition with potential CMP step to expose the pads, or to oxidize the top silicon surface 2122 using low temperature techniques such as presented in a paper by H. Kakiuchi et al titled "Formation of silicon dioxide layers at low temperatures (150-400° C.) by atmospheric pressure plasma oxidation of silicon" published at Science and Technology of Advanced Materials 8 (2007) 137-141; and by Masaki Hirayama et al titled "Low-Temperature Growth of High-Integrity Silicon Oxide Films by Oxygen Radical Generated in High-Density Krypton Plasma" published at IEDM 99. Alternatively the boding could be made between the top silicon 2122 and oxide 2131 of the added stratum such as presented in a paper by R. Do Black et al titled "Silicon and silicon dioxide thermal bonding for silicon-on-insulator applications" published at J. Appl. Phys. 63 (81, 15 Apr. 1988, all of which are incorporated herein by reference.

The process for removing the base silicon 2146 and the SiGe cut-layer 2148 could include use of grinding and selective etch as previously discussed. First selectively etch silicon using the SiGe layer 2148 for an etch stop, and then etching selectively the SiGe using the silicon 2122 and the pads 2132 as an etch stop. Alternatively the SiGe layer 2148 could be pre etched or mostly etched similar to the process in reference to FIG. 2H to FIG. 3D and FIG. 4E to FIG. 4H herein. The 3D integration between memory control circuits and the bitline/wordline of the memory array could utilize the concept illustrated in FIG. 21A-21C, as an alternative to the 'smart-alignment' technique such as in reference to FIG. 11F-11H, or the programmable technique of FIG. 11I-11K.

FIG. 22A-22B are X-Z 2200 cut view of the stratum select connectivity. It supports a generic stratum design which could be integrated in any stack numbers of 3D integration and allow a top select of each stratum.

FIG. 22A illustrates one stratum section which is designed to support up to four stratum integrations (for example) with top access to select each of the stratum in the stack by the top access—SL1, SL2, SL3, SL4.

FIG. 22B illustrates a stack of four stratum 2211, 2212, 2213, 2214 which are stacked so that SL1 could be used to select stratum 2211 and so forth to SL4 to select the top stratum 2214.

FIG. 22C illustrates a conventional DRAM block diagram. In the 3D computer system presented in herein the memory array could be in one strata while the control circuits, for example, such as Row Decoder, Sense Amps, Column Decoder, and Data In/Out Buffers, are placed on upper most overlaying (or lower most underlying) strata. Such memory multiple array stratums could be combined by techniques such as has been described herein to form a larger memory 3D array. For example, the per layer select to be added per unit array as is illustrated in FIG. 22D for the bitlines and as is illustrated in FIG. 22E for the wordlines. At the edge of the unit array the per layer bitlines—L-BLj could be selected by the control line SLi by activating select transistor 2222, which its output G-BLj is one of the control line 2104 illustrated in FIG. 21B to connected together as General Bit Line-j, as presented in respect to FIG. 21A-21C herein. Herein the symbol i indicates the number of the layers in the stack, and the symbol j to the count of the control lines. Similarly, at the other edge of the unit array the per layer wordlines—L-WLj could be selected by the control line SLi and its inversion NSLi by select transistor 2224, which its output G-WLj is one of the control lines 2104 illustrated in FIG. 21B to connected together as General Word Line-j, with additional transistor 2225 to deactivate the unselected wordlines (as gate signal is preferred not to be left floating).

Figure 22F:
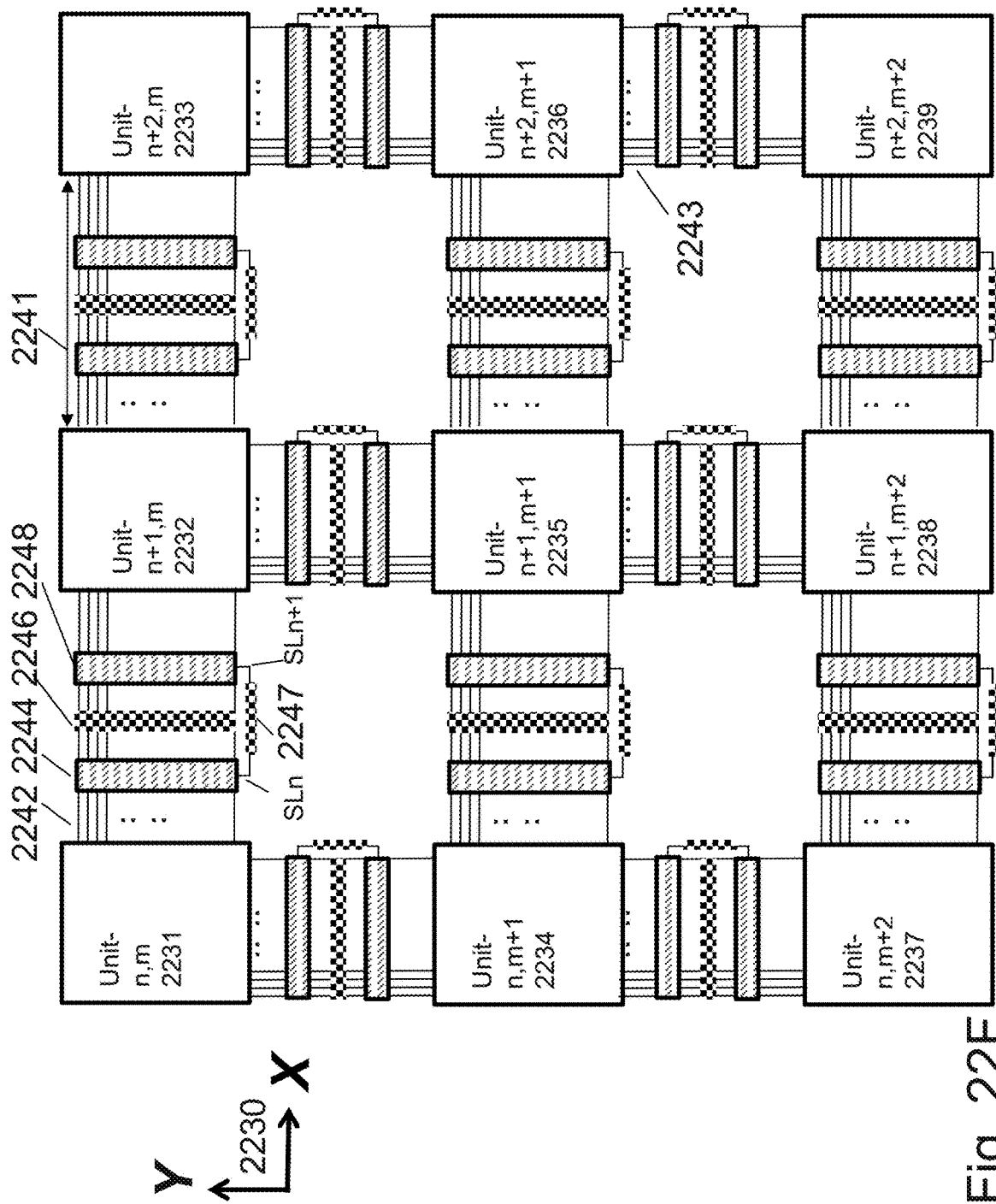
FIG. 22F is a section of a partition an array of memory units.

As an additional embodiment, the per layer select circuits could be made to either the bit lines (FIG. 22D) or the wordlines (FIG. 22E) and the select for the wordlines could be made with primarily N type transistors for which both the SLi and the NSLj signals could be routed from the control stratum. FIG. 22F illustrates a section of such partition to array of units illustrating a section of 3×3 units 2231-2239 along X-Y direction 2230. Each unit may be an array of bit-cells having wordlines 2242 traveling in the X direction and bit-lines 2243 traveling in the Y direction. The memory unit array (2231-2239) size could be about 200 microns×200 microns while the gap between units could be about one micron to allow for the vertical connecting pads 2246 of FIG. 21A-21C, for the layer select 2244, 2268 of FIG. 22E for the wordlines and of FIG. 22D for the bitlines. In the corners between units the 'layer-select' vertical connection structure 2247 of FIG. 22A could be placed. It should be noted that FIG. 22F like many other figures herein is not to scale and the unit size (~200 micron×200 micron) are not drawn in proportion to the size of gap (~1 micron) between units, and so on.

An additional embodiment is to have two layers select circuits for each control line as is illustrated in FIG. 23A. One select sector 2314 controlling the bitlines or the wordlines 2312 coming out from memory array unit 'n' 2304 before the connections pads 2316, and one select sector 2318 after it, in between the adjacent memory array unit n+1

2306. The select signals pads 2317 coming from the memory control circuits could include two signals SLn and SLn+1. This way the vertical memory control lines from the memory control circuits connected to the horizontal memory control lines (Word-line or Bit-lines) via pad structure 2316 could drive each of the adjacent memory array units 2304, 2306. This connectivity structure enables many use options, for example, including redundancy used to overcome defects, or multiple memory access options from single units to multiple units. A 3D computer system could leverage this flexible connectivity to blend between high speed local access with multiple processor cores, each accessing a local memory in parallel operation, combined with global memory access in which multiple units are functioning as a larger memory array. The hybrid bonding of stratum in the 3D stack allows connecting not just the active signals but also support signals such as ground, power and feed-through 2308 as needed for such stratum within the stack and below and on top of it. The space between the memory units 2311 could be designed to accommodate the landing pads 2316 and the layer select transistor 2314, 2318.

FIG. 23B illustrates a block diagram for the generation of per layer select signal SLi. For example, a case in which 8 stratum of memory array are needed, the lower address bits $A_0$-$A_2$ could be decoded 2324 to eight layer select—$SL'_0$-$SL'_7$. In such a 3D system it could be desired to use one extra 9th stratum in which one stratum is used as redundancy to replace a defective stratum. The operation could include first a testing cycle to check if any memory cell in a unit had a defect for which the redundancy could be used. In general, the big memory may be segmented to many small units such as multiple thousands of units each about 200 micron by 200 micron. The likelihood of two defects in two overlaying units is extremely low so repair at the unit level could enable extremely high system yield. For memory unit by redundancy unit replacement, the redundancy stratum may be segmented into multiple units according to the unit size of the memory stratum. For such the 8 signals $SL'_0$-$SL'_7$ could be input to the repair control unit 2326. The repair control unit will allocate the 8 layer select to the 8 good stratum out of potential 9-th stratum leaving one stratum always unselected, by generating the proper 9-th layer select signal $SL_0$-$SL_8$ FIG. 23B illustrates an optional a sub unit repair control by having some additional address lines $A_{10}$-$A_{11}$ control signals to the repair control unit 2326, so to allow different distribution of the layer select lines to the 9-th potential stratum to each quarter of the memory array. The repair control unit 2326 could be constructed to be programmable so after testing the arrays it could be programmed to avoid use of a defective sub array or array region. Using the enhanced access scheme of FIG. 23A, memory stratum of adjacent unit(s) could be used as a replacement of defective unit within a stratum if needed, thereby giving a larger range of recovery options.

Persons in the memory art could adapt these techniques in many variations to engineer 3D Computer system with the desired memory size with consideration to process yield. Such could include, having first the logic stratum then the memory control and then overlaying the memory stack, or having the memory stack first as illustrated in FIG. 11E. The 3D memory array 1131 could be a monolithic memory array or stacked memories array such as been presented in respect to FIG. 20A-FIG. 23, or both above and below. In such a 3D computer system it could be desired to include a thermal isolation layer such as layer 1157 of FIG. 11E to isolate the relatively high operating temperature of the logic layer from the memory structure. Redundancy techniques could be also used for the memory control circuits and the processing logic. The redundancy technology utilized could include techniques presented herein or in the incorporated by reference art, leveraging the unit modularity aspect of the 3D computer system and the 3D integration in which the repair could be provided in a very close proximity overlaying the replaced part and preserving the full system functionality.

In the 3D Memory stack presented herein, the unit partition could be symmetrical in which the length of the wordlines within a unit is similar to the length of the bitlines, or the unit partition could be very asymmetrical. These control line length and accordingly the size of the respective unit size in X direction or in Y direction could be about 50, 100, 200, 400 micron or even one or few millimeters. The number of connections associated with these control lines is order of magnitudes larger than the number of vertical connections associated with the access control, the per layer select (SLi). In some applications the control could be broken into a few banks, each with its own select line allowing more control flexibility to individual memory banks within the unit. Such could allow better granularity for redundancy use or parallel access to the unit memory array. These banks could be allocated horizontally (X, Y) or vertically (Z). Such could also be used for parallel access from logic overlaying and or logic underlying the array. Such could also allow for sections of the memory array to be mapped for global access across multiple units. Such variation and the support control logic to support them are known in the art and could be designed by an artisan in computer architecture and memory controls.

FIG. 24A illustrates an alternative 3D computer system utilizing the technologies presented herein. The base 2410 is a carrier substrate which is also provides cooling to the main multi cores computing stratum 2424, through a first thermal isolation layer 2426 the computer stratum is connected to the multi-unit memory control stratum 2428, which controls the multi-unit memory array strata 2430. Overlaying the memory strata is a second memory control stratum 2432 which provides second access to the same memory strata 2430. Through a second thermal isolation layer 2434 a second computing stratum 2436 could be connected to the second memory control stratum 2432. The second computing stratum 2436 could communicate with external devices utilizing a communication stratum 2438. The communication stratum 2438 could utilize wired, wireless, optical or other communication channels to communicate with external devices. An upper heat removal apparatus could overlay the communication stratum 2438.

An additional alternative is to integrate in such 3D computing structure active cooling. Such active cooling work was recently supported by DARPA and the report on these techniques is presented in a paper by Chainer, Timothy J., et al. "Improving Data Center Energy Efficiency With Advanced Thermal Management." *IEEE Transactions on Components, Packaging and Manufacturing Technology* (2017), incorporated herein by reference. Such active cooling could be incorporated in addition or as replacement of the thermal isolations 2426, 2434. FIG. 24C illustrated a 3D structure with active thermal cooling supporting feed through of electrical interconnects 2472 and thermal vias 2474.

Herein the term layer transfer or layer cut could be applied to use of SiGe as a cut layer either as sacrificial layer with far different etch rate vs. silicon as presented such as in reference to FIG. 2A-FIG. 3D, or as an etch stop layer for back grinding and silicon etch scheme. Either one of these techniques could be used for the 3D system presented herein.

Additionally, alternative structures to SiGe could be used for the formation of the 'cut layer'. In some embodiments, the 'cut layer' may also function as an etch stop layer or sacrificial layer which could be selectively removed. Such alternatives have been detailed in PCT/US patent application 16/52726 and U.S. application Ser. No. 15/333,138, incorporated herein by reference. For example, one may use a highly doped layer of N+ or P+ or porous layers. A unique advantage of a doped layer used as 'cut layer' is the ability to make it at the processing fab as part of the conventional process flow via conventional processes such as ion implantation or in-situ doped epitaxial growth. Another aspect is the ease to make the 'cut layer' selectively using patterning which opens up more options; for example, instead of a full layer or to allow change in the layer thickness in different location across the wafer. The use of a doped layer as a 'cut layer' could be combined with other functions, such as a back bias connection for transistors or other devices. The choice of 'cut' between undercut and lift off or grind and etch back could be in consideration of the type of etch and its selectivity in respect to choice of the 'cut layer' structure.

Many other variations of 3D system could be constructed utilizing techniques presented herein or in incorporated by references. In some applications, the peripherals circuit could be placed on more than one stratum. This could be used for memory partitioning to small units such that the area of a unit is too small to fit all the require memory control on a single stratum. For example, the upper most stratum may be control logic to control about the upper half of memory stratums while the lower most stratum may be control logic to control about the lower half of the memory stratums.

Another approach that could leverage such monolithic 3D technology is multiple port access to the memory array. This could also include non-symmetrical multiport access, such as one access port could access single unit, while another access port could access multiple units. This multiport non-symmetrical access could be achieved by controlling the access to the segments of word-lines and/or bit-lines. The access from the top and the access from the bottom could be independent, yet synchronized. In such, for example, the wordlines and bitlines could be accessed by per unit memory control from the top control stratum, while the bottom control stratum provides access to the same word-lines and bitlines with multiple units control, providing one memory port access per unit from the top, while the bottom control stratum could provide access to a block of memory that could include multiple units.

The 3D memory architectures herein constructed with arrays of memory units each comprising memory strata in which every stratum has at least one select controlled from the overlaying and/or underlying memory control stratum, and the multiple options opened up by such architecture including yield repair, local and global access, is applicable to many memory technologies, including volatile and non-volatile. These architectures benefits are applicable to many of the 3D integration techniques presented herein including epitaxial based with shared lithography and layer stacking with grind and etch-back. A technologist in the art of memory systems could engineer a specific system leveraging the techniques presented herein.

FIG. 24B illustrates a generic 3D memory structure "G3DM" which could be constructed according to the techniques presented herein. Such a 3D memory could include a controller to manage the memory including self test and advanced refresh techniques. The 3D memory could include at least one or two stratum of memory control circuits, first memory control stratum 2448 and second memory control stratum 2452 and the 3D memory stack 2450. The 3D memory stack 2450 structure could be constructed and may include an array of memory units each with its own memory control structure as a tile of the 3D structure, it could also include 3D memory array structures such as 3D NOR or 3D NOR-P disclosed herein or elsewhere. It could be provided as a wafer ready to have additional customer specific circuits, for example, such as control and encryption, which could be similar to those presented in FIG. 24A 2436, 2438. And it could be constructed on top of a 'cut-layer' so it could be cut over other structures. These additional integration steps could be done at a die level after dicing, or at a wafer level to be diced afterwards. Dicing afterward could be performed by: conventional saw dicing, laser assisted dicing, or etch assisted dicing. The structure could be useful to support more than one device size as previously presented forming a continuous structure which could be tiled to specific device size(s) near the final phase of the processing, thus allowing stocking of generic wafers, etc. The external surfaces such as 2454 could include the pads for the additional custom circuits to interface with. Alternatively, such external surfaces with the pads may be used for subsequent conventional chip packaging. The decoding circuits could be part of the generic 3D memory structure "G3DM" such as part of the memory control circuit 2448 or 2452, and accordingly the number of wires per such memory unit (about 200μ×200μ) connectivity with the customer specific circuits could be at the range of 30-100. Such connectivity could be readily achieved with today's face to face bonding capabilities. The G3DM could incorporate self test to invoke redundancy memory stratum per unit at product release and also during normal operation to extend operations with self-repair capabilities. The G3DM could also includes wireless test and report capabilities as discussed such as in U.S. Pat. No. 9,142,553 in reference to at least FIG. 24A-C and FIG. 48-FIG. 50. The system level memory structure herein could be used for many types of memory technologies and products. A very common memory technology is DRAM for which additional enhancements could be integrated in such high granularity memory structures. DRAM is known to require refresh with the common refresh cycle of about every 60 ms. The refresh rate is known to be driven by the worst case of relatively few memory cells that exhibit high leakage. Recent works have suggested adaptive refresh to reduce the refresh energy by adapting the refresh to those sections that require higher refresh rate while reducing the refresh rate for most of the device's cells. Such as presented in papers by Ahn, Jin-Hong, et al. titled "Adaptive self refresh scheme for battery operated high-density mobile DRAM applications," published in Solid-State Circuits Conference, 2006. ASSCC 2006. IEEE Asian. IEEE, 2006; and by Mukundan, Janani, et al. titled "Understanding and mitigating refresh overheads in high-density DDR4 DRAM systems," published at ACM SIGARCH Computer Architecture News. Vol. 41. No. 3. ACM, 2013, all incorporated herein by reference. The high granularity of this 3D structure with arrays of relatively small sized units could enable deploying such techniques at the unit level, or even at a layer of a unit, so the refresh rate could be reduced to units that either have not be written into yet, or that exhibit lower leakage. In addition, for a unit in which all the memory layers are good, the choice of the unit to be left unused could be based on refresh needs. The partition to units with the associated reduction of the word-lines and bit-lines length could itself reduce leakage and accordingly the required lower refresh rate. Alternatively these techniques could enable the reduction of the DRAM capacitor size for some application which could enable significant overall memory cell size reductions.

Memory centric applications such as intelligent systems or search applications could be implemented as a memory focused processing system utilizing such 3D systems as is illustrated in FIG. 24A. In such a system, a new approach could be used, instead of the conventional processor centric approach in which data is transferred to and from the central processing unit, transfer the process to where the data is. As an example, the dashed border 2462 of FIG. 24A may represent a database stored in the memory 2430 associated with people in city A while the dashed line 2464 indicates data bank stored in the array 2430 associated with people in city B. And if a search is needed in respect to city A the program performing the search could be transferred to the processing unit in the logic layer 2436 located in the area marked by 2462, while the program code related to a search in city B could be transferred to the processing core located in the region marked by 2464. Memory centric system operations could leverage the 3D computer system illustrated herein as a new compute paradigm. The program or code itself could also be stored in the memory matrix 2430. Additional option is to run parallel processing on the memory stored in the memory matrix 2430 converting it from one form to another form. There are many form of data transfer such as from amplitude domain to frequency domain as often called Fourier Transform. Another type of transform is to form multiple feature plans with one or very few bits from a many bit per data point representation, which is useful for technique for brain inspired algorithm.

Figure 25D:
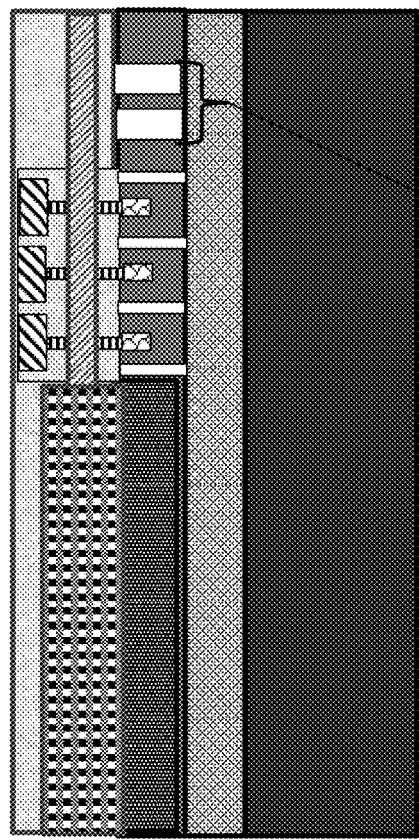

Another alternative for constructing a 3D memory stacked structure is to reduce changes in the memory wafer processing and compensate by adding process steps to the stacking process. FIG. 25A illustrates structure 2500 as alternative in respect to the structure of FIG. 21E. A wafer substrate 2501 with cut-layer 2502, memory semiconductor structure 2504, memory interconnection structure 2506 and oxide layer 2508 may be formed. The in-between units control line 2510, through memory via 2536 and connecting pads 2538 are formed similar to those of FIG. 21E. The difference is that the in-between silicon 2505 is not etched away but rather shallow trench isolation 2512 and bottom dummy contacts 2514 are added, using conventional memory processing. The bottom dummy contact 2514 may be formed at the same step as the source and drain region of memory bit cell formation. The bottom dummy contact may be an n+ diffusion region. The through memory vias 2536 are connected to the respective bottom contacts 2514. FIG. 25B illustrates this alternative in respect to FIG. 21H after having a structure such as 2500 flipped and bonded to similar structure 2508, and have it substrate and cut layer removed, thus shown as processed bonded layer 2506. Then, vias 2582 could be opened by removing silicon 2505 to expose the bottom side of the bottom contacts 2514 as is illustrated in FIG. 25C. If the STI 2512 of the standard process are not deep enough, then the via formation process could include the STI locations to etch through to assure full isolations of the vertical connection from the substrate and each other, thus forming full etch structures 2583. Alternatively, the silicon at the regions could be first be etched out and replaced with isolation material. Then add landing pads 2522 on top of bottom contact 2514 as is illustrated in FIG. 25D, to prepare the structure for the following layer.

Figure 25E:
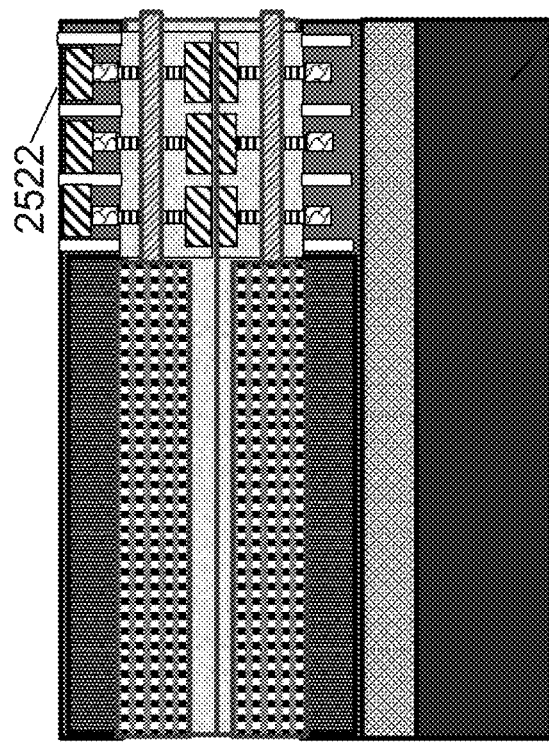
FIG. 25E is an example illustration of forming alignment marks for the method and structure of FIGS. 25A-25D.

An additional step could be added which is forming alignment marks for this stacking process. The bonding alignment mark could be included in the metal layer as the bonder could see these alignment marks from the top view of the wafer. FIG. 25E illustrates the structure of FIG. 25A with alignment marks 2532 utilizing the STI process. These marks could be used once the wafer has been flipped and the substrate and the cut layer have been removed. Other alternatives could be the use of an ion implant process or leveraging the contact process for the alignment marks.

Figure 25F:
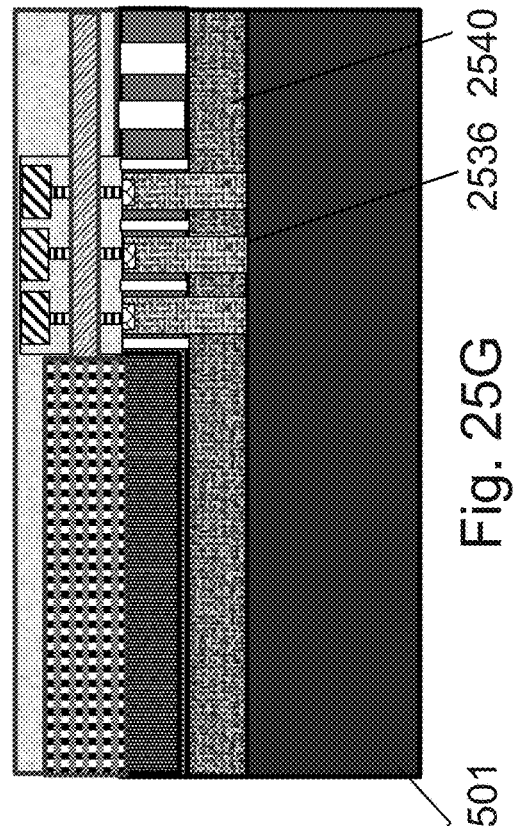
FIGS. 25F and 25G are example illustrations of using a lithographically defined doping process to simplify 3D stacking.
Figure 25G:
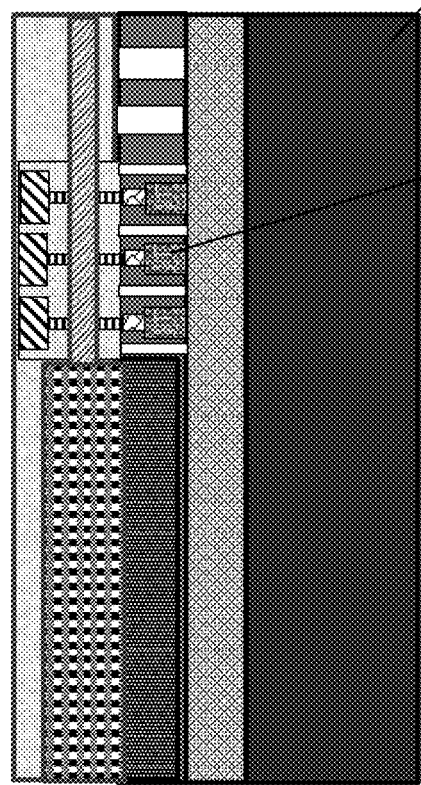

Additional steps that could be taken in the memory fab to help the following stacking process could include using a lithographically defined doping process. FIG. 25F illustrates an optional use of N+ doping for extending the contacts 2514 into the silicon with conductive N+ silicon 2534 reducing the need of forming the metal connections illustrated in FIG. 25C-25D 2502, 2522. Such N+ doping can be accomplished by adding extra high dose deep ion implantation in the memory wafer fab or even attainable using a part of a standard process step. The depth of N+ layer may be the substantially close to the body thickness of the stratum to be transferred, so that N+ regions play as nano-TSVs. FIG. 25G illustrates an optional use of N type silicon as the cut-layer 2540, and leaving the regions 2536 for the nano-TSV as P−. Once flipped and bonded, the process of substrate removal using the N as etch stop could allow etching these P− regions 2536 exposing the contacts 2514. Filling with conductive metal and then removing the excess using processes such as CMP would make the stack ready for the next stratum. As discussed previously, the selective etch of P silicon to N silicon could be an anodizing process which would first etch the P silicon to become porous and then the porous silicon could be selectively etched away. Utilizing these techniques the memory array wafer could be processed using a standard memory process or such with simple changes, and then stacked using simple processes that could be just bond, grind and etch, or with some additional steps as presented herein.

As a general note, the use of top pad and bottom pads herein are exchangeable as with the use of layer transfer techniques. These structures could be flipped for specific applications using the presented technology and structures herein. In some cases there might be a need to flip the layer before bonding it to the target wafer. A carrier wafer, such as presented in at least U.S. Pat. No. 8,273,610, incorporated herein by reference, could be used to support such flipping. The carrier wafer could also leverage techniques presented herein in respect to the term "cut layer", and could be designed to be grind and etched out, or to be reused having it 'refurbished' and used again. Additional techniques for such a carrier wafer, could be to form a porous layer at the top of a carrier, such as presented in respect to the ELTRAN process, without the need for the epitaxial step but rather just use it with silicon top or add oxide for the bonding. Another option is to use a wafer with thick oxide and/or a nitride cover of a few microns and optionally add grooves at the dice lane or between lithographic projection fields. Then detach the carrier wafer by a though-side etch leveraging the very high selectivity of etch rates between silicon and oxide or nitride. An additional alternative is to implant ions such as a combination of helium and hydrogen and then use low temperature (~400° C.) ion-cut for detach. An example for a need of flipping is in a case when the desired landing pads 2006 are in a range of about 200×200 $nm^2$ or about 400×400 $nm^2$ while the designated location for these pads might be desired for operating silicon. In such case a via smaller than 100×100 $nm^2$ through the transferred silicon film (strata)

could be used and the landing pads could be constructed over the carrier wafer, once the layer was transferred onto the carrier wafer.

An additional enhancement could be by adding to through-strata-via that we could also call a through-layer-via 'TLV' such as illustrated in FIG. 20H including top landing pad 2054, a via or chain of vias 2050, and a bottom connection pad 2052. Such connection path might serve as path through without connecting to other elements within the strata it is passing through. It could allow signal paths through such as connecting signals between first memory control stratum 2448, of FIG. 24B, and second memory control stratum 2452 without connecting to any element within the 3D memory stack 2450. Furthermore, a plurality of dummy vias not connecting any pad may be included to improve process uniformity, serve as mechanical support, or in some application when it is desired facilitate heat dissipation, such as thermal pipes and paths to an external surface of the device.

An example for such a feed-through TLV is illustrated in FIG. 24A. A base wafer carrying, for example, processors and other circuits 2410, 2424, could be sourced from conventional 2D fabrication process and facility. It could include connecting pads on its upper surface. Then a wafer carrying multilayer memory strata 2430 with its memory control circuits 2428 could be bonded on top of the sourced wafer forming the connection between the standard flow wafer and the stack memory and control circuits. Then using the feed-through TLV connections could be made with the upper stratum 2436 which could include the I/O circuits to interface the 3D system with external devices. These could also include wired connections such as, for example, pads, balls or pins, or wireless systems such as electromagnetic, optical, etc. This heterogeneous integration supports the use of different device crystalline material, RF, Analog and other forms of heterogeneous integration. Such could include magnetic films using technique such as presented in U.S. Pat. Nos. 9,337,251, 9,357,650, 9,357,651, 9,647,053, 9,679,958, incorporated herein by reference. These ferromagnetic films could be added to construct an on-chip inductor using standard metallization layer(s) with high quality factor for voltage regulators or RF transceiver/receiver to improve the 3D system effectiveness and capability.

A standard wafer fabrication technology or baseline technology could be established for the memory per unit pin out position and function. That standard wafer fabrication technology or baseline technology could also be used for the custom logic design so it could integrate the generic memory wafer presented herein, for example, by bonding. Each standard wafer could include alignment marks for the custom logic top layer to help align the generic memory wafer during the bonding process. The standard wafer could include processing cores compatible with the size of the memory unit such as, for example, about 200 µm by 200 µm, a street width between units such as, for example, about 1 µm. The signals to be connected in-between such as: 40 pins for address, 16 pins for data, 10 pins for control (such as read and write) and 4 pins for pass through paths. Some of these pins could be defined in the industry standard as expansion options or to allow more than one memory type or architecture. With about 100 pins per unit, the area for each pin could be about 20 µm by 20 µm, which allows the use of most wafer bonders available currently in the industry. Additionally, the generic memory and control stack could be designed to be about 50 µm thick so it could be shipped, handled, and bonded by industry standard processes and machines. Such could become also a standard for which the memory stack could include a path-through the interface layer with the proper thickness so the total stack would be about 50 µm thick. For example, for a 16 memory layer stack of 1 µm each and control stratum with I/O stratum of 2 µm, the stack thickness could be about 18 µm, and a path-through layer of about 32 µm could be bonded on top to bring the overall stack thickness to about 50 µm thick, compatible with the current industry capability. The pass through paths could be built using technology such as TSV to pass, for example, the approximately 100 signals from the generic memory to the custom 2D processor device, to the processor device such as based on planar, SOL FinFET, or gate-all-around technology.

FIG. 29A illustrates such 'pass-through add-on structure' 2902 constructed within a silicon wafer substrate, having base substrate 2910, designated cutline 2908 that could be formed by cut-line technique presented herein or just by timing the grinding and etch once bonded as it design to be many microns thick. The 'pass-through add-on structure' could include pre-built isolated TSV 2904 to function as the conductive feed through. An enhancement of such 'pass-through add-on structure' is to have it function also as a thermal isolation between the heat generating processor and the memory stack, for example, as is illustrated in FIG. 29B. The enhanced 'pass-through add-on structure' 2912 could have some of the silicon 2906 be replaced by etch, deposition and planarization with thermal isolating material 2917 such as silicon oxide. With feed-through TSV 2914 and the remainder of the silicon substrate 2916 similar to those illustrated in FIG. 29A. Those 'pass-through' structures could be reserved for the arbitrary purpose that can be determined later by the system designer. The strata containing 'pass-through' structures may be a generic product such as memory, sensor, power or communication chip. Alternatively, use of such feed-throughs could be, from the processor logic in the logic layer 2424, to the I/O layer 2438 to connect to an I/O or analog function being placed on the 2438 layer, or to interconnect memory control layer being placed on top 2432 and under 2428 the memory structure 2430. Such could be used to coordinate use of the redundancy control function between the top control 2432 and under control 2428. An additional use could be to coordinate dual control to support multiport access to the same memory matrix.

The technique of using a precise bonder with staggered pads on word-lines or bit-lines presented in respect to FIG. 21A-21C, could be used to add memory control logic over 3D memory such as 3D NAND or 3D NOR. This could be an alternative to the technique presented here in respect to FIG. 11F-11K and FIG. 12F-12J. An advantage of a staggered pads approach could be the parallel processing of the memory and memory control which then could be integrated into a 3D device by bonding.

The stacking techniques presented in respect to FIG. 20A-FIG. 25G, and FIG. 29A-29B could be extended to 3D memory such as 3D NOR. Such could include stacking multiple strata of 3D NOR each having multiple layers of memory. In such case, the per layer select transistors of FIG. 22D-FIG. 22E could become per memory strata select. This per layer select transistors could be implemented within a control stratum on top or below the multilayer memory strata or alternatively without such control stratum but rather in the memory structure such as by doubling the ridge select transistors to have to serial transistors instead of the one ridge select transistor (such as 1213, 1222, 1332). In such case, one transistor could function as the ridge select while the other could be globally controlled by the per layer select signal SLi, effectively providing strata select to support simple vertical stacking. This could allow use of the same memory control circuits to control multiple strata with relatively simple additional control and z-decoding circuit to control the strata select signals. Such stacking could include periodical stratum of rebuffering and redrive to support the relevant control lines. FIG. 26H illustrates an X-Y 2690 top view of such added transistor for forming Strata-Select SS1 2692, SS2 2694. FIG. 26H is a portion of FIG. 12E with the added transistors 2692, 2694, 2696 to function as global strata select for such stacking of 3D memory structures. In such case the stacking flow presented in respect to FIG. 21A-24B could be adapted for stacking of 3D memory strata such as 3D NOR. The 3D memory strata could be designed with units such as presented in respect to FIG. 22F. These units could be structured similar to the 3D memory units such as presented in respect to FIG. 12D. Each such unit could be designed to have the wordline access both from the top and the bottom and each of those word lines could include stacking pads arranged such as presented in respect to FIG. 21B. The bit-lines could also be structured to be access from the top and bottom and to have landing pad structures similar to FIG. 21B. And similar pad structures could be added to the ridge selects. For the Strata Select, the pad structure could be designed similar to the structure of FIG. 22A.

Additional option is to stack different memory type. Clearly stacking could include many type of stratum, yet the unique aspect of the stacking technique in here is to form vertical connection of the word-lines and the bit-lines while having per strata select line such as SLi of FIG. 22D-22E. These word-lines and the bit-lines could control plurality of memory type including volatile and non-volatile. Sharing these memory control lines could allow efficient form of memory structure and in some cases, could even allow direct data transfer from one memory type to another memory while keeping some of these control line unchanged reducing power for such data transfer and reducing time for such transfer.

An additional step that could be included in the preparation of 3D memory structures for stacking is adding bonder alignment marks. Precise bonders generally need alignment marks to align wafer to wafer These alignment marks could be incorporated in the proper location on the top and/or bottom layers of the 3D memory wafer structure using a proper mask of the 3D memory structure such as in a nonfunctioning zone over the wafer such as in-between memory structures.

The technology for precise wafer bonding is being enhanced, recently demonstrating the improvement of wafer to wafer alignment tolerance from 200 nm three sigma to 100 nm three sigma, and efforts are underway to develop bonding precision to 50 nm. These works have been reported by papers such as by Peng, Lan, et al. "W2 W permanent stacking for 3D system integration." *Electronics Packaging Technology Conference (EPTC), 2014 IEEE 16th. IEEE,* 2014; by Sakuma, Katsuyuki, et al. "Bonding technologies for chip level and wafer level 3D integration." *Electronic Components and Technology Conference (ECTC), 2014 IEEE 64th. IEEE,* 2014; by Sugaya, Isao, et al. "Precision wafer bonding process for future cost-effective 3DICs." *Advanced Semiconductor Manufacturing Conference (ASML),* 2015 *26th Annual SEMI.* IEEE, 2015; and by Kurz, Florian, et al. "High Precision Low Temperature Direct Wafer Bonding Technology for Wafer-Level 3D ICs Manufacturing." *ECS Transactions* 75.9 (2016): 345-353, all of the forgoing are incorporated herein by reference. Herein we presented at least two stacking flows, one using 'Smart-Alignment' techniques as presented in reference to at least FIG. 11F-FIG. 12J, and one utilizing 'Hybrid' and/or 'Fusion' as presented in respect to at least FIG. 20A-FIG. 23B. The fusion bonding techniques enable a simple stacking operation as it could be done without the need to form vias in the transferred layer thereby reducing the need for lithography, metal deposition, and processing per stack layer at the stacking fab. But for such fusion bonding based stacking, the landing pads as illustrated in FIG. 21A are required. In some applications, it might be effective to mix these stacking techniques for the formation of 3D structure such as, for example, the one illustrated in FIG. 24B. An example for such could be to use fusion bonding for the stacking of the memory stratum as related to FIG. 21A-FIG. 23A, and use 'Smart-Alignment' for connecting the memory control strata 2428 (providing the decoding, sense amplifiers and other memory control). Precise bonders could align the wafers being stacked but could not overcome die level misalignment within these wafers. It is relatively easier to control the die level alignment for wafers processed in the same processing fab line using the same stepper, or matched steppers. The memory stratum could be processed in the same line as they are providing the same circuits. The control stratum would be processed in a different process and might be harder to achieve the same die to die misalignment as the memory stratum. By using 'Smart-Alignment' for it, the landing pads could be exchanged to landing strips as illustrated in FIG. 11G and could allow a larger overall misalignment between the control stratum and the memory stratum. Such hybrid stacking could keep a tight space between units of the memory stratum with landing pads, as an example, 200 nm×200 nm, while the connection of the control stratum to the memory stack could use landing strips of 300 nm length (and less than 80 nm width) to accommodate the additional die level misalignment between the control stratum and the memory stratum.

An additional option to accommodate large total stacking misalignment is to build the relatively larger landing pads and pins over the memory unit. This way the space 2311 between the memory units could be kept relatively small while the landing pads could be made large enough to accommodate the total error which could include the bonder alignment error or/and the die placement errors. Such over the array pads construction could add costs associated with the processing of such over the array pads and additional per stacking layer costs in the stacking fabs to build these extra layers of landing pins. FIG. 25H-25J could illustrate such over the array connectivity structures. FIG. 25H is lower portion 2560 is similar to FIG. 25A. The upper portion 2561 illustrates the landing pads 2550 constructed over the memory bit cell array 2556. These landing pads are connected to the respective bit-line or word-line by via 2552, connection wire 2554, and via 2562. These additional metal layers are added on top of the isolation covering the array 2558 and are with the additional isolation material 2557. It might be desired to have two versions of over the array pads: one with landing pads 2550 and one with landing pins 2570 as illustrated in the lower part of FIG. 25I. FIG. 25I illustrates bonding a such wafer with large landing pads 2550 on top of another such wafer with landing pins 2570. FIG. 25J illustrates the structure after removal of the top substrate and SiGe layer and constructing landing pins 2572 or alternatively large landing pads (not drawn) for the following stacking step. Artisans in the art could mix and match this alternative stacking option to the specific 3D system design.

The 3D memory stack herein enables stacking multilayers of memory stratum in which the vertical connectivity is at the word-line and bit-line level. Such 3D stacking enables use of a memory control for multiple memory stratums thus reducing cost in addition to benefits in performance and power reduction. Yet vertical connectivity at the word-line/bit-line level could be a technology challenge as the high pitch of these memory control lines may prevent the use of techniques such as 'smart-alignment' as there might not be enough room to run TLVs through. For such cases the Hybrid/Fusion bonding techniques presented herein, at least in respect to FIG. 21A-FIG. 25J, are an effective technique to provide word-line/bit-line level 3D connectivity.

The 3D memory stacking presented herein could be modified to accommodate technology limitations or cost objectives. Such modification could include connecting only the bitlines at the unit level while connecting the wordlines at a far courser granularity or vice versa (connecting the wordlines at the unit level and the bitline at the bank on multiple unit level). Other modifications could include staggering the layer select transistors position of FIG. 22D or FIG. 22E, to accommodate the high metal pitch of the respected control lines. Another modification could be to position the connecting pads for/on odd control lines in one side of the unit and for/on even control lines on the other side of the unit thereby resembling the structure illustrated in FIG. 12C-12E.

An additional alternative to a form buried cuttable layer is to replace the buried SiGe with oxide, nitride or other layers. This could be done following a step of isotropic etch as been described such as in reference to FIG. 2I. This could use deposition techniques such as ALD or other conformal deposition techniques to refill the etched-out space with a proper dielectric material. This could be done while forming and keeping posts to hold the top silicon layer or in two steps; first portion and then additional etch and replace the remaining portion. Following the replacement an epitaxial process could be used to seal the entrance holes 224. This could be done for the whole wafer or at selective sections for specific applications. This could be done as part of forming a generic substrate or per a specific application. The replacement could be done for specific circuit considerations, for example, such as substrate capacitance, or back bias, or back gate. This could also be done to support any of the 3D integration flows such as presented herein for which the replacement material could be later etched with a much higher selectivity. For example the selectivity of dry etch of nitride vs. silicon could be set to be 2,000:1, which is much higher than the selectivity of SiGe vs. silicon. This could also be done in combination with bonding to another substrate and detaching with a finishing process such as residue etch CMP and epitaxial. This flow could also be done as an alternative process for the formation of SOI substrates, and may have lower cost to manufacture compared to the current methods. This could also be done using a stain etching to convert the SiGe layer to porous layer as previously presented herein.

An additional alternative for a 'cut-layer' is to use a single atom layer of Graphene as presented in a paper by Kim, Jeehwan, et al., "Principle of direct van der Waals epitaxy of single-crystalline films on epitaxial graphene." Nature communications 5 (2014); and Yunjo Kim, et al., "Remote epitaxy through graphene enables two-dimensional material-based layer transfer" published at NATURE|VOL 544|20 Apr. 2017, incorporated herein by reference. It was discovered that a single atom layer of graphene being placed on a single crystal substrate could allow a single crystal epitaxial growth on top having the base crystal orientation and quality. Yet the layer grown on top of the graphene could be pulled off as the graphene layer has "weak van der Waals interactions, and which also allows facile layer release from 2D surfaces". Enabling "the grown single-crystalline films are rapidly released from the graphene-coated substrate and perform as well as conventionally prepared films". Accordingly, such a single atom graphene layer could serve as alternative to the porous layers described herein or combined with such or other forms of 'cut-layer' presented herein. The base substrate could be reused after 'cutting' off the functional layer. A graphene cut could be used in a similar way to the original concept of porous layer for formation of SOI wafer as was named ELTRAN by Cannon.

Many mix and match of these cutting techniques could be utilized for different product formation and related flows. One such mix could be used for die to wafer 3D integrations as discussed in U.S. patent application Ser. Nos. 15/095,187 and 15/173,686 and herein. So, the cut of the 6 microns thick die could use the graphene as the cut layer but then the following a step of thinning the layer after being bonded to the target wafer, and could leverage the SiGe etch selectivity for etch and controlled thinning to below 1 micron to allow a simple process with nano-TSV through (with less than 400 nm via diameter) the thinned die.

Additional technique that could be used for a 2D material such as Graphene as a 'cut layer' is an oxide type post that could be etched out prior to the layer transfer step. As the substrate with a cut layer being built in could go through the full front end of the line processing and some back of the line processing before the layer transfer, it could be desired to add in such posts to keep the stability of the structure for the various processing steps prior to the transfer step. Using a modified STI step, holes could be etched all the way through the graphene into the underlaying substrate, and filled with oxide. These holes could be made in the dice lanes. Then as one of the last step before performing the layer transfer operation these oxide posts could be etched away releasing their hold. Additionally, these in the dice lanes could be extended to a full dice lane etch so that in the layer transfer step each die may be peeled off independently from the other dies.

The release process could include a polymer or other material such as nickel to help form a stress which together with temperature, such as liquid nitrogen or less than 400° C. degree spike heating, could help the detach and release of the re-useable substrate from the 3D structure comprising the target wafer and the bonded transferred layer. An alternative technique could include the use of pulling 5-30 micron thin layers off reusable wafers using a technique called controlled spalling such as presented in papers by Shahrjerdi, Davood, and Stephen W. Bedell. "Extremely flexible nanoscale ultrathin body silicon integrated circuits on plastic." Nano letters 13.1 (2012): 315-320; and by Bedell, Stephen W., et al. "Layer transfer by controlled spalling" Journal of Physics D: Applied Physics 46.15 (2013): 152002; and U.S. Pat. Nos. 9,698,039, 9,704,736 and 9,713,250, incorporated herein by reference. A reusable "cuttable" substrate could be constructed using the following steps; 1) Form the thin layer with desired silicon thickness on top of a SiGe etch stop layer using an epitaxial process over a donor wafer. 2) Form a reusable carrier by growing 3-10 micron thick oxide (or nitride) over a silicon wafer. 3) By using controlled spalling pull out 5-10 micron layer off the silicon over SiGe (top Si/buried SiGe/fractured bulk Si stack) from the donor wafer and bond it on top of the reusable carrier, thus forming the reusable "cuttable" substrate. Optionally, the fractured surface portion of bulk Si may be treated to be planarized for better bonding to the reusable carrier. The reusable "cuttable" substrate could now be processed with building the desired circuits on top of it. Than it could be bonded on top of a target wafer. Then using selective oxide or nitride etch from the side of the wafer, the bulk of the reusable "cuttable" substrate could be detached leaving over the target wafer the circuits and the layers previously being bonded to the 3-10 micron thick oxide. Than using SiGe as an etch stop the 5-10 micron silicon could selectively etched followed by a SiGe etch. In the process the edge of the wafer could include protection of the interconnect layers to protect them from the side oxide detaching etch.

The 'cut-layer' technology presented herein could also be used for applications requiring a very thin device. An example of such application is integrating a semiconductor device in a contact lens or in application requiring a very flexible circuit layer. In these applications the ability to use a standard semiconductor fabrication process following by thinning the device thickness to a few microns or hundreds of nano-meters or even less, could be key enabling technology.

An additional inventive embodiment for a 3D memory constructed of arrays of relatively small memory units, with the memory control circuits on top or under of such memory units relate to the ability to perform per unit refresh and other techniques to extend memory effectiveness. This could be applied for DRAM type memory as presented herein before and also for non-volatile memory such as charge trap, floating gate and ferro-electric based memory. These memory units could have an X direction and/or Y direction size of a few tens of microns, or a few hundreds of microns. For example, some of the general concerns with memory structures relate to disturb and other forms of losing memory fidelity. These could impact the level of memory density utilization. With such a 3D memory system as illustrated in FIG. 19A, the control system could copy the contents of a memory unit to cache storage, erase the unit and re-write the content to restore memory fidelity. These refresh cycles could be performed based on time or activity of that memory unit. These refresh operations could be performed at a time there is no active use of the memory so auto-maintenance could be performed. FIG. 27 illustrates a block diagram for such a refresh operation flow. Such a refresh could extend the effectiveness of the memory by enabling a greater number of bit site locations with the memory cell and a greater number of storage levels within such storage sites.

An alternative to form the 3D NOR fabric illustrated in FIG. 3A-3B and FIG. 4A-FIG. 10D of PCT/US16/52726 is to use the "punch and plug" technique, commonly used in current 3D NAND formation. FIG. 26A illustrates a top XY 2600 view of holes 2608, 2609 formed in a multilayer structure such as is illustrated in FIG. 3A of PCT/US16/52726. The multilayer structure may be the stack of multiple single crystalline N+/P/N+ semiconductors layers. The multilayer structure may further include silicon for N+ layer (designated for the source and drain S/D) and SiGe for P layer (designated for the channels). Alternatively, the SiGe region may serve as S/D while Si may serve as the channel material. The memory transistor may be constructed for single crystalline vertical channels and single crystalline horizontal bit lines as presented in reference to FIG. 4A-FIG. 10D of PCT/US16/52726. Herein, the term "punch" represents a deep etch process to make a hole deep through multiple stack of layers while "plug" denotes a deposition process that either substantially fills the punch hole or partially fills it, such as a layer or layers deposition on the inner sidewall of the punch hole. The holes are usually punched substantially all the way through the multilayer structure. The holes could be formed in horizontal rows 2602, 2604, 2606 which could function similar to the valleys 308 in FIG. 3B of PCT/US16/52726. After the vertical anisotropic etch forming the holes, an isotropic etch could be used to extend the holes to slightly overlap as is illustrated in FIG. 26B. Alternatively the holes could be formed directly as illustrated in FIG. 26B. Then using deposition, such as ALD, the O/N/o layers 2628, 2629 could be deposited in the holes, similar to as is done in 3D NAND, as illustrated in FIG. 26C. The gap opened by the overlaps 2618, 2619 between the neighboring punch holes, could be designed so, the deposition of the O/N/O layers would close it, by having the proper O/N/O thickness, forming rows of isolated holes, 2622, 2624, 2626, with isolated ridge 2623, 2625 which function similar to the ridges 309 in FIG. 3B of PCT/US16/52726. Such auto-shutting of the gaps enables for the subsequent gate formation to be self-aligned, reducing a lithography step for the gate patterning. Then the inside of the holes could be filled with gate material 2630 which could be polysilicon, tungsten or alternative gate material or combination of such. The O/N/O stack thickness is usually more than 10 nm and less than 30 nm, and accordingly the gap between the holes 2619, 2629 could be designed to be less than 20 nm to assure isolation between the gates of adjacent holes. FIG. 26D illustrates having the gates along the same column in Y direction connected by global wordlines 2632, 2634. The holes of even rows 2604 could be phased from the holes on odd rows 2602, 2606, to simplify the wordlines connections, to enable individual selection of each storage facet as an alternative to the connectivity in FIG. 5A or 5B or 5E or 8A of PCT/US16/52726. Most of the variation and enhancement presented in the PCT/US16/52726 could be adapted and implemented with such "punch and plug" process. For example, the indentation presented in respect to FIG. 10B of PCT/US16/52726, could implemented by having 'odd' holes 2608 larger than 'even' holes 2609. Furthermore, the formed ridges 2623, 2625 could be sliced with slits ('valleys') to expose the sidewall of multilayer structure and selectively expose the bitlines—S/D region for silicidation and so forth as explained in reference to FIG. 8 of PCT/US16/52726. An artisan in memory technology would be able to adapt many of the technology alternatives presented in PCT/US16/52726 in respect to a straight lines ridge in valleys to the punch holes formation of ridge and valleys as illustrated in reference to FIG. 26B.

An additional advantage of the punch holes technique illustrated in FIG. 26A-26C is the ability to use the adjacent wordline to steer storage location. So, for example, when writing using WLn the adjacent wordline WLn+1 could be used to pull the charge toward it or to push charge away resembling the concept presented in PCT/US16/52726 in respect to FIG. 10B and FIG. 10E. Accordingly using both WLn−1 and WLn+1 could extend the storage capacity when writing using WLn.

An alternative process could include sealing some holes such as the 'even' holes 2509, then plugging the 'odd' holes 2508 with O/N/O and gates, then remove the sealing and optionally isotropic etching the unplugged 'even' holes 2509. Such selective sealing process is often used for the in-situ sealing process to create a vacuum cavity in MEMS technology by using very low step coverage deposition process or very non-conformal deposition process, causing voids. In order to protect the multilayer structure by some residual sidewall deposition of the sealing material, a dummy mask pattern on the very top of the multilayer structure may be incorporated. In this approach, the holes to be sealed first have a substantially smaller diameter than the holes to be plugged first. Holes sealing could be done by processing such as presented in U.S. patent application Ser. No. 12/979,592, incorporated herein by reference.

FIG. 26E is a top view X-Y illustration to show the use of the single hole punch process to construct the various elements which may be needed for the 3D NOR fabric. The region cut is illustrated by the dash line 2660 and the in picture cut 2662 is to indicate that the structure could include many more memory cells in the X direction. The structure resembles the structure of FIG. 12D. The ledger could be read as follows, the un-punched multilayer structure 2640 forming the in bitlines ridge select transistor 2642 and in-silicon layer transistor 2644 used as part of the per layer programming (PE1-9 of FIG. 28), $1^{st}$ gate pillar 2646, $2^{nd}$ gate pillar 2648, control gate 2650 of the in-silicon transistor for ridge select and PE gate, a vertical pillar for ground 2652 for all layers (2800 of FIG. 28), programmable gate 2654 for the PE transistors, isolation pillars 2656, contact pillars 2658 for per layer contacts (L1-L4, 2812-2818), optional feed-through pillars 2639 which could be used to transfer signals from the upper side of the fabric to the bottom side. The processing of these holes could be done for each function while the other holes are sealed or by other alternative techniques presented herein. Processing these punch holes together saves processing cost because in 3D memory structures the holes punch process through the multi-layers structure is a slow and expensive process. In many cases the holes diameter is about 100 nm or smaller yet the multilayer structure could be of a few microns thick.

An additional advantage of simultaneous holes punching is having these holes self-aligned in the vertical direction enabling dense structures as illustrated in FIG. 26A-26E. FIG. 26F and FIG. 26G are side cut views along X-Z direction 2670 to illustrates the difference between holes etch together/simultaneously (FIG. 26F) vs. holes punch in two independent etch steps (FIG. 26G). The self-aligned holes 2674, 2676, 2678 in a multilayer structure 2672 could be used for different functions as illustrated in FIG. 26E. FIG. 26G illustrates holes etched into a multilayer structure 2682 in which holes 2684, 2688 are etched in one step while holes 2686 in another step. With 'Single Punch' the sidewall vertical scallop pattern of the etched hole is substantially the same as the sidewall vertical scallop pattern of the other holes etched at the same time, being processed at the same process into a uniform structure. The peak and valley pattern of the scallop is continuous along the X-Y direction between these simultaneously etched holes.

A known challenge in 3D memory formation relates to the etch aspect ratio for the holes punching process. At the current state of etch technology it is about 1:60 which imply that for multilayer substrates with 3 microns thickness the smallest consistently attainable hole would be about 50 nm diameter. To keep the holes diameter small for thicker multilayer substrates the following techniques could be applied. A layer transfer technique could be used to punch holes from both sides of the multilayer substrate enabling about double the multilayer thickness. And successive holes punching, followed by epitaxial growth of the substrate, could be applied to construct a thin hole in a thick multilayer structure.

An additional alternative that could be combined with many of the 3D-NOR structures presented herein and in at least PCT/US16/52726 could be to use the ridge split process to replace the SiGe portion with metal to function as the S/D and having the Silicon portion function as the channel. For example, in respect to FIG. 41E of PCT/US16/52726, instead of a partial SiGe etch perform a full SiGe etch and then either use a thin oxide first or just perform conformal deposition of metal to be followed by an etch removing the metal from the side walls and leaving it as replacement of the SiGe regions, thus functioning as S/D. For such alternative, the silicon region should be kept un-doped or P-doped to function as the 3D NOR channel regions. At the edge of the ridge the proper adjustment should be made in forming the staircase access. These adjustments could include replacement of region of the metallic S/D with p type silicon for the formation of the ridge select. Alternatively an epitaxial step of N+ type silicon could be used to form the S/D. An additional step of etching the ridge split again could be used to clean the slit from the epitaxial over growth and reduce the risk of leakage between S/D lines. Additionally the epitaxial step could be engineered to only partially fill the space formed by the SiGe removal, followed by adding metal as described above, combining both techniques to replace the SiGe forming the S/D. An additional aspect that could be integrated in the 3D NOR formation is to use a high work-function metal for the wordlines to reduce punch-through leakage risks. Persons in the memory art could adapt this alternative to the various relevant structures of the 3D NOR memories presented herein.

The 3D integration technique such as presented in respect to FIG. 1 to FIG. 6D herein could be used to support many derivatives of memory products by a mix and match of memory control circuits on top or below the memory array. These could allow multiple control circuits, some that use multi-bits per cell and some that do not, and also the many techniques of multi bit presented herein. The memory array could also be made with a generic size which could then be customized for a specific memory product by properly designing the memory control circuit and sizing the end product by the placement and setting of the dicing lines.

An additional inventive embodiment to enhance 3D memories is to use an alternative per layer access by sidewall strapping through one-time-programmable anti-fuse to the method and structure presented in reference to FIG. 43 of PCT/US2016/052726, or by similar multiple programmable connections such as is used for RRAM and Bridge-RAM. FIG. 28 is a modified structure to support this alternative method. L1, L2, L3, L4, (2812, 2814, 2816, 2818) are the vertical contact pillars to serve as per layer access. Each one of these contact pillars could be programmed to connect to a Bit-Line (BL1-BL4) by breaking a thin oxide (OTP), which could be considered an anti-fuse between it and the Bit-Line (2841, 2842, 2843, 2844). The Bitlines and/or pillars could be engineered to provide a more stable anti-fuse providing an ohmic connection when linked; for example, by include a high concentration of atomically large lattice atoms, such as Arsenic in silicon, which would be incorporated into the link when fused. The pillar may be formed using polysilicon with the same doping polarity of BL to provide an ohmic anti-fuse. The connection region could include the horizontal 'programming-enable-transistors' PE1-PE9 controlled by gate pillar 2803 having a contact 2832 PE, which provides controlled connection to the vertical grounding pillar 2801 with ground contact 2800 GND. The horizontal transistors PE1-PE9 are embedded in the Bitline using a similar technique presented herein for the ridge select transistors. These transistors comprise charge trap so they could be programmed to be disconnected. The programming could be performed by the memory control circuit 2850 using the Vpp Gen to generate programming voltage and 'P Enable' to enable the programming, as follows:
1. Initially, all PEs (PE1-PE9) are erased (to low Vt) to pass ground potential to their respective BLs (BL1-BL9).
2. Vpp is set to a high enough voltage to break the 'anti-fuse' made of the thin oxide (OTP), than P1 is activated presenting the programming voltage on L1. Then 'P Enable' activates the gate PE opening up all the horizontal programming enabling transistors (PE1-PE9), connecting all the Bitlines to ground. One of the anti-fuses would break which would connect L1 to one of the Bitlines (randomly). Let say (for example) BL1 is connected to L1. Then the programming voltage drops as the current through the activated anti-fuse pull the voltage on L1 down enough so no more anti-fuses would break. A soak algorithm could also be initiated to make the anti-fused link more stable.
3. Then Vpp and PE could be set to program PE transistor (to high Vt) connected to the randomly fused BL in step 1 to stop passing ground voltage. In this case, PE1 transistor is programmed to high Vt. Now, only the rest of the PEs excluding PE1 could be passing ground potential when PE is activated.
4. After P1 is disabled, P2 is enabled and the cycle repeated creating connection between L2 and random BL.
5. Repeat step 2 to 4 for rest of BLs.

The selection of which Bitline would be fused first could be guided by changing the vertical pillar ground connection 2801 from metallic pillar to resistive pillar-like poly silicon which could give advantage to the upper Bitline closest to the GND to fuse first. This concept of random (or guided) selective fusing by parallel access to multiple anti-fuses is been implemented for random number generator as is detailed in a paper by Chuang, K-H., et al., "Physically unclonable function using CMOS breakdown position," International Reliability Physics Symposium (IRPS), 2017 IEEE International, IEEE, 2017, incorporated herein by reference. During this programming of per layer connection, all the relevant ridge selects could be disabled to reduce the risk of sneak paths. The per layer connection technique presented in respect to FIG. 28 could be combined with the per layer connection technique presented in respect to FIG. 43 of PCT/US2016/052726 to various alternatives of mix and matched by an artisan in the art.

It will also be appreciated by persons of ordinary skill in the art that the invention is not limited to what has been particularly shown and described hereinabove. For example, the use of SiGe as the designated sacrificial layer or etch stop layer could be replaced by compatible material or combination of other material including additive materials to SiGe like carbon or various doping materials such as boron or other variations. And for example, drawings or illustrations may not show nor p wells for clarity in illustration. Further, any transferred layer or donor substrate or wafer preparation illustrated or discussed herein may include one or more undoped regions or layers of semiconductor material. Further, transferred layer or layers may have regions of STI or other transistor elements within it or on it when transferred. Rather, the scope of the invention includes combinations and sub-combinations of the various features described herein- above as well as modifications and variations which would occur to such skilled persons upon reading the foregoing description. Thus, the invention is to be limited only by appended claims (if any).

We claim:

1. A method to construct a 3D system, the method comprising:
   providing a base wafer; and then
   transferring a first memory wafer on top of said base wafer; and then
   thinning said first memory wafer; and then
   transferring a second memory wafer on top of said first memory wafer; and then
   thinning said second memory wafer; and
   transferring a memory control wafer on top of said second memory wafer; and then
   thinning said memory control wafer.

2. The method according to claim 1,
   wherein said first memory wafer comprises a cut-layer, and
   wherein said thinning of said first memory wafer comprises a final thickness of said first memory wafer of less than 4 microns and greater than 0.1 microns.

3. The method according to claim 1, further comprising:
   forming a logic stratum; and
   forming a thermal isolation layer disposed between said logic stratum and said first memory wafer,
      wherein said thermal isolation layer is designed so during said 3D system operation a first temperature of memory cells of said first memory wafer is at least 20° C. lower than a second temperature of said logic stratum.

4. The method according to claim 1, further comprising:
   thinning at least one of said first memory wafer, or said second memory wafer, or said memory control wafer to a thickness of less than 100 nm and greater than 1 nm.

5. The method according to claim 1,
   wherein memory cells of said first memory wafer or said second memory wafer comprise one of the following:
      i. DRAM, or
      ii. SRAM, or
      iii. Floating Body type memory, or
      iv. STT-RAM, or
      v. R-RAM, or
      vi. M-RAM, or
      vii. F-RAM.

6. The method according to claim 1, further comprising:
   performing a step of memory test,
      wherein said first memory wafer comprises a first memory and said second memory wafer comprises a second memory; and then
   performing a step using a first portion of said first memory as an alternative for a portion of said second memory or a portion of said second memory as an alternative for a second portion of said first memory.

7. The method according to claim 1, further comprising:
   performing a step of dicing said base wafer, said first memory wafer, said second memory wafer, and said memory control wafer,
      wherein said dicing results in at least one die having a planner size greater than 40×40 mm².

8. A method to construct a 3D system, the method comprising:
   providing a base wafer; and then
   transferring a memory control on top of said base wafer; and then
   thinning said memory control wafer;

transferring a first memory wafer on top of said memory control wafer; and then
thinning said first memory wafer; and then
transferring a second memory wafer on top of said first memory wafer; and then
thinning said second memory wafer.

9. The method according to claim 8,
wherein said first memory wafer comprises a cut-layer,
wherein said thinning said first memory wafer comprises a final thickness of said first memory wafer to less than 4 microns and greater than 0.1 microns.

10. The method according to claim 8, further comprising:
forming a logic stratum; and
forming a thermal isolation layer disposed between said logic stratum and said first memory wafer,
  wherein said thermal isolation layer is designed so during said 3D system operation a first temperature of memory cells of said first memory wafer is at least 20° C. lower than a second temperature of said logic stratum.

11. The method according to claim 8, further comprising:
thinning at least one of said first memory wafer, or said second memory wafer, or said memory control to a thickness of less than 100 nm and greater than 1 nm.

12. The method according to claim 8,
wherein memory cells of said first memory wafer or said second memory wafer comprise one of the following:
  i. DRAM, or
  ii. SRAM, or
  iii. Floating Body type memory, or
  iv. STT-RAM, or
  v. R-RAM, or
  vi. M-RAM, or
  vii. F-RAM.

13. The method according to claim 8, further comprising:
performing a step of memory test,
  wherein said first memory wafer comprises a first memory and said second memory wafer comprises a second memory; and then
performing a step using a first portion of said first memory as an alternative for a portion of said second memory or a portion of said second memory as an alternative for a second portion of said first memory.

14. The method according to claim 8, further comprising:
performing a step of dicing said base wafer, said first memory wafer, said second memory wafer, and said memory control wafer,
  wherein said dicing results in at least one die having a planner size greater than 40×40 mm².

15. A 3D device, the device comprising:
a first stratum comprising first bit-cell memory arrays;
a second stratum comprising second bit-cell memory arrays; and
a third stratum,
  wherein said second stratum overlays said first stratum,
  wherein said first stratum overlays said third stratum,
  wherein said third stratum comprises a plurality of word-line decoders to control said first bit-cell memory arrays and said second bit-cell memory arrays;
a logic stratum; and
a thermal isolation layer disposed between said logic stratum and said first stratum,
  wherein said thermal isolation layer is designed so during said 3D device operation a first temperature of said first stratum is at least 20° C. lower than a second temperature of said logic stratum.

16. A 3D device, the device comprising:
a first stratum comprising first bit-cell memory arrays;
a second stratum comprising second bit-cell memory arrays; and
a third stratum,
  wherein said second stratum overlays said first stratum,
  wherein said first stratum overlays said third stratum,
  wherein said third stratum comprises a plurality of word-line decoders to control said first bit-cell memory arrays and said second bit-cell memory arrays,
  wherein said first stratum comprises a first word-line controlling at least one of said first bit-cell memory arrays,
  wherein said second stratum comprises a second word-line, overlaying said first word-line, controlling at least one of said second bit-cell memory arrays, and
  wherein said third stratum comprises a control circuit to enable use of said second word-line as an alternative to said first word-line or use of said first word-line as an alternative to said second word-line.

17. A 3D device, the device comprising:
a first stratum comprising first bit-cell memory arrays;
a second stratum comprising second bit-cell memory arrays; and
a third stratum,
  wherein said second stratum overlays said first stratum,
  wherein said first stratum overlays said third stratum,
  wherein said third stratum comprises a plurality of word-line decoders to control said first bit-cell memory arrays and said second bit-cell memory arrays,
  wherein at least one of said first stratum, said second stratum, and said third stratum comprises one or more transistors interconnected by metal layers,
  wherein a single-crystal region comprises said one or more transistors, and
  wherein said single-crystal region has a planar size greater than 40×40 mm².

* * * * *